United States Patent
Kao et al.

(10) Patent No.: US 12,057,446 B2
(45) Date of Patent: Aug. 6, 2024

(54) STACKED SEMICONDUCTOR DEVICE AND METHOD

(71) Applicant: Taiwan Semiconductor Manufacturing Co., Ltd., Hsinchu (TW)

(72) Inventors: Min-Feng Kao, Chiayi (TW); Dun-Nian Yaung, Taipei (TW); Jen-Cheng Liu, Hsinchu (TW); Hsing-Chih Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/359,578

(22) Filed: Jul. 26, 2023

(65) Prior Publication Data

US 2023/0387106 A1    Nov. 30, 2023

Related U.S. Application Data

(62) Division of application No. 17/371,660, filed on Jul. 9, 2021, now Pat. No. 11,791,332.

(60) Provisional application No. 63/154,039, filed on Feb. 26, 2021.

(51) Int. Cl.
| | |
|---|---|
| *H01L 21/00* | (2006.01) |
| *H01L 21/265* | (2006.01) |
| *H01L 23/00* | (2006.01) |
| *H01L 23/522* | (2006.01) |
| *H01L 27/06* | (2006.01) |
| *H01L 29/66* | (2006.01) |
| *H01L 29/861* | (2006.01) |
| *H01L 49/02* | (2006.01) |

(52) U.S. Cl.
CPC .... *H01L 27/0676* (2013.01); *H01L 21/26513* (2013.01); *H01L 23/5226* (2013.01); *H01L 24/08* (2013.01); *H01L 28/40* (2013.01); *H01L 29/66136* (2013.01); *H01L 29/861* (2013.01); *H01L 2224/08145* (2013.01)

(58) Field of Classification Search
CPC ........... H01L 27/0676; H01L 21/26513; H01L 23/5226
See application file for complete search history.

(56) References Cited

U.S. PATENT DOCUMENTS

| | | | |
|---|---|---|---|
| 5,610,549 A | 3/1997 | Choi | |
| 5,731,941 A * | 3/1998 | Hargrove | ............ H01L 27/0251 361/111 |
| 8,993,380 B2 | 3/2015 | Hou et al. | |

(Continued)

FOREIGN PATENT DOCUMENTS

| | | | | |
|---|---|---|---|---|
| CN | 108122889 A | | 6/2018 | |
| CN | 108122889 A | * | 6/2018 | ....... H01L 21/76898 |

(Continued)

*Primary Examiner* — Laura M Menz
(74) *Attorney, Agent, or Firm* — Slater Matsil, LLP

(57) ABSTRACT

A semiconductor device and a method of forming the same are provided. The semiconductor device includes a first substrate, a capacitor within the first substrate, a diode structure within the first substrate adjacent the capacitor, and a first interconnect structure over the capacitor and the diode structure. A first conductive via of the first interconnect structure electrically couples the capacitor to the diode structure.

20 Claims, 36 Drawing Sheets

(56) References Cited

U.S. PATENT DOCUMENTS

| | | |
|---|---|---|
| 9,159,763 B2 | 10/2015 | Takahashi |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,570,431 B1* | 2/2017 | Lee ............... H01L 21/30604 |
| 9,666,502 B2 | 5/2017 | Chen et al. |
| 9,735,131 B2 | 8/2017 | Su et al. |
| 10,403,659 B2 | 9/2019 | Gambino et al. |
| 10,872,919 B2 | 12/2020 | Takizawa et al. |
| 11,031,236 B2* | 6/2021 | Wu ............... H01L 21/28088 |
| 11,270,975 B2* | 3/2022 | Jeng ............... H01L 23/5223 |
| 11,552,027 B2 | 1/2023 | Chien et al. |
| 11,791,332 B2* | 10/2023 | Kao ............... H01L 24/08 |
| | | 257/532 |
| 2004/0046194 A1 | 3/2004 | Kozuka et al. |
| 2010/0127316 A1 | 5/2010 | Tu et al. |
| 2011/0096447 A1 | 4/2011 | Higuchi et al. |
| 2013/0241078 A1* | 9/2013 | Lee ............... H01L 23/481 |
| | | 257/774 |
| 2016/0240527 A1 | 8/2016 | Ramachandran et al. |
| 2017/0033093 A1* | 2/2017 | Lee ............... H01L 29/36 |
| 2018/0102356 A1 | 4/2018 | Ghorbanzadeh et al. |
| 2020/0035668 A1 | 1/2020 | Savanth et al. |
| 2020/0115223 A1* | 4/2020 | Yeh ............... B81C 1/00246 |
| 2020/0343237 A1 | 10/2020 | Karp |
| 2020/0411636 A1* | 12/2020 | Kao ............... H01L 28/91 |
| 2021/0036097 A1 | 2/2021 | Tsai et al. |
| 2021/0296245 A1* | 9/2021 | Tseng ............... H01L 21/561 |
| 2021/0327866 A1* | 10/2021 | Yu ............... H01L 25/0657 |
| 2021/0366846 A1* | 11/2021 | Hung ............... H01L 23/60 |
| 2022/0028825 A1* | 1/2022 | Jeng ............... H01L 25/50 |
| 2022/0084494 A1 | 3/2022 | Chen et al. |
| 2022/0084940 A1* | 3/2022 | Chen ............... H01L 23/5226 |
| 2022/0102482 A1* | 3/2022 | Tsai ............... H01L 28/60 |
| 2022/0189919 A1* | 6/2022 | Jeng ............... H01L 21/568 |
| 2022/0278095 A1* | 9/2022 | Kao ............... H01L 25/16 |
| 2022/0352086 A1* | 11/2022 | Yu ............... H01L 23/49827 |
| 2022/0359223 A1* | 11/2022 | Lin ............... H01L 24/20 |
| 2022/0359326 A1* | 11/2022 | Yu ............... H01L 23/5226 |
| 2022/0359410 A1* | 11/2022 | Jeng ............... H01L 21/6835 |
| 2022/0359460 A1* | 11/2022 | Wu ............... H01L 23/49827 |
| 2022/0359646 A1* | 11/2022 | Kao ............... H01L 23/481 |
| 2023/0387106 A1* | 11/2023 | Kao ............... H01L 29/861 |

FOREIGN PATENT DOCUMENTS

| | | | | |
|---|---|---|---|---|
| CN | 113363251 A | * | 9/2021 | ............ H01L 23/60 |
| CN | 113363251 A | | 9/2021 | |
| CN | 113471176 A | * | 10/2021 | ......... H01L 21/4853 |
| CN | 113471176 A | | 10/2021 | |
| CN | 114649301 A | | 6/2022 | |
| CN | 114649301 A | * | 6/2022 | ....... H01L 21/26513 |
| DE | 102021118126 A1 | * | 9/2022 | ....... H01L 21/26513 |
| DE | 102021118126 A1 | | 9/2022 | |
| KR | 0157334 B1 | | 10/1998 | |
| KR | 100894803 B1 | | 4/2009 | |
| KR | 20210019921 A | | 2/2021 | |
| TW | 202034477 A | | 9/2020 | |
| TW | 202107662 A | | 2/2021 | |
| TW | 202209625 A | * | 3/2022 | ............ H01L 23/60 |
| TW | 202249223 A | * | 12/2022 | ....... H01L 21/26513 |

* cited by examiner

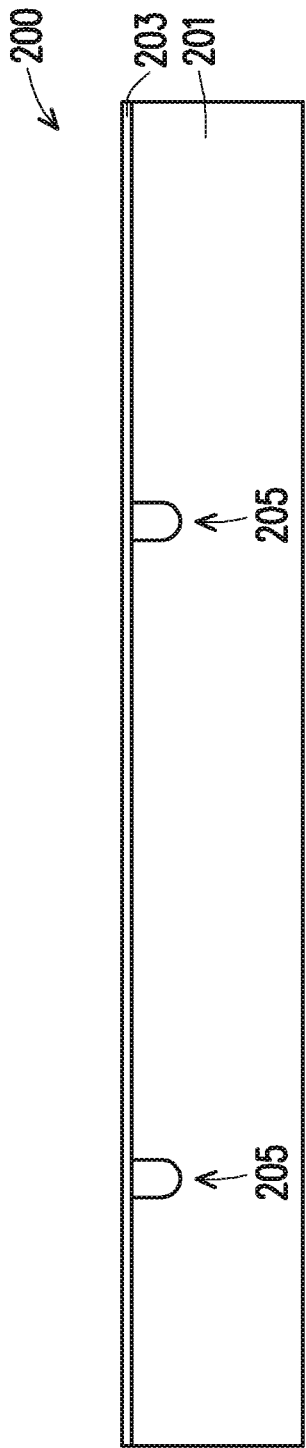
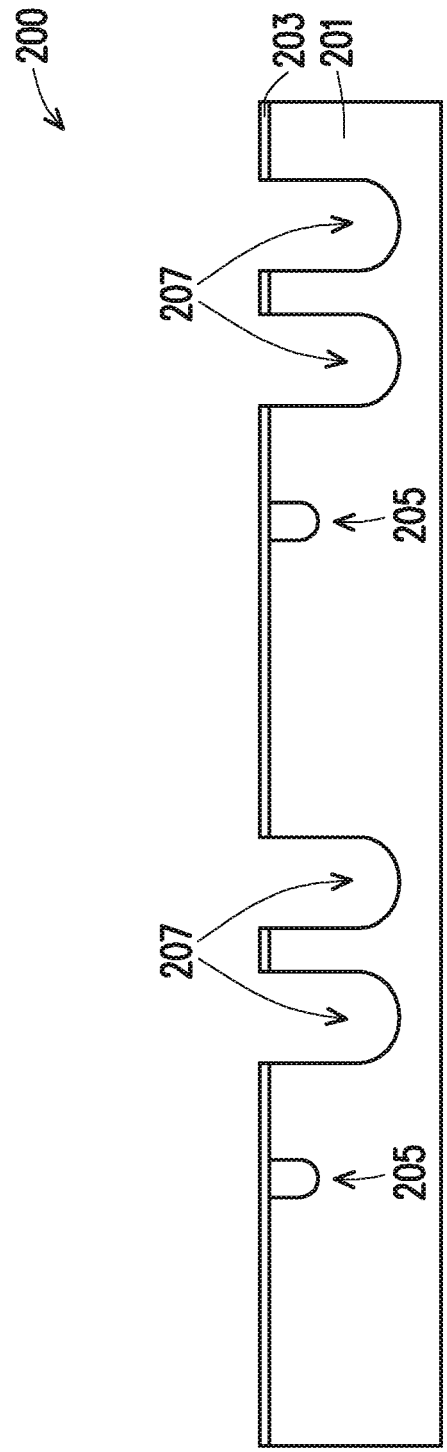

STACKED SEMICONDUCTOR DEVICE AND METHOD

PRIORITY CLAIM AND CROSS-REFERENCE

This application is a divisional of U.S. patent application Ser. No. 17/371,660, filed Jul. 9, 2021, entitled "Stacked Semiconductor Device and Method," which claims the benefit of U.S. Provisional Application No. 63/154,039, filed on Feb. 26, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-6 illustrate cross-sectional views of various intermediate stages of fabrication of a semiconductor device in accordance with some embodiments.

DETAILED DESCRIPTION

Figure 1:
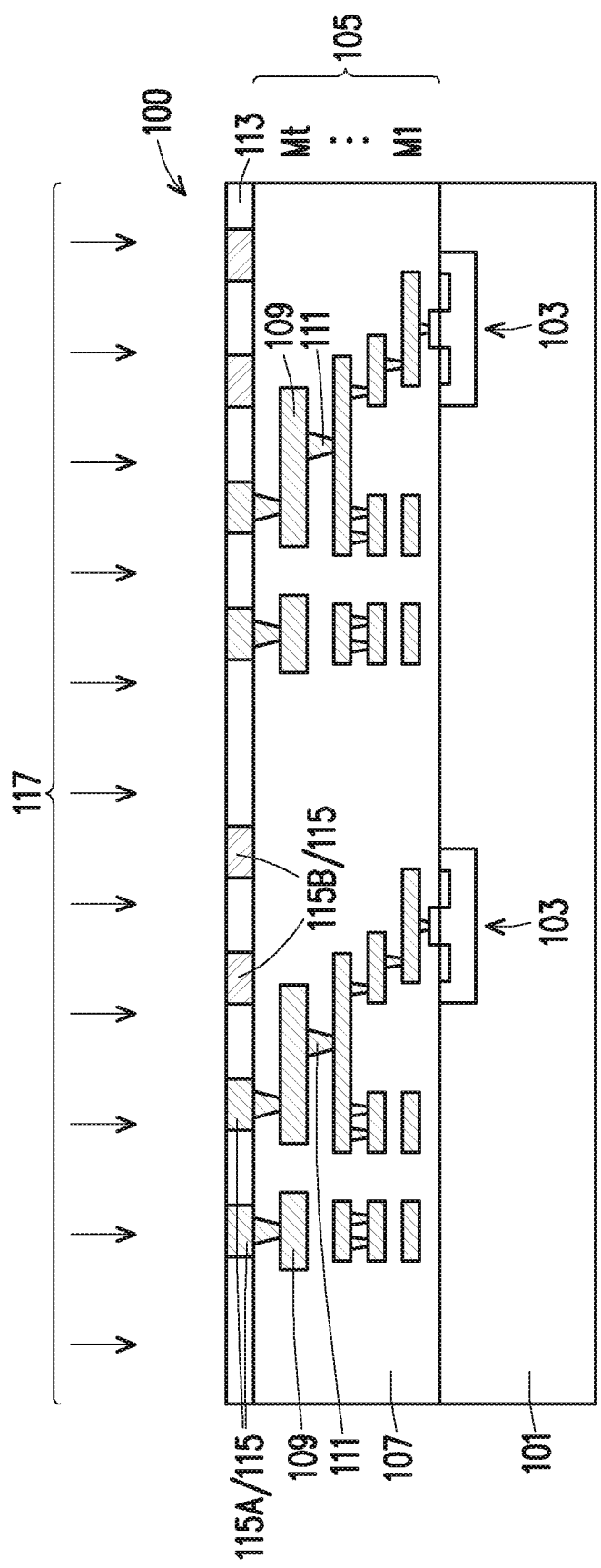
FIG. 1 illustrates a cross-sectional view of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a stacked semiconductor device and a method of forming the same. Various embodiments allow for forming additional discharge paths in a stacked semiconductor device to reduce or avoid burn-out and circuit short of various components (such as, for example, passive and active devices) of the stacked semiconductor device due to electrostatic discharge during plasma processes (such as, for example, a plasma etch process performed during forming through substrate vias or a plasma process performed during a bonding process for forming the stacked semiconductor device) performed while forming the stacked semiconductor device. In some embodiments, additional discharge paths may comprise conductive vias, diode structures, or combinations thereof. Advantages achieved by various embodiments include preventing damage to various components of a stacked semiconductor device, improving performance of components of the stacked semiconductor device, improving performance of the stacked semiconductor device, improving yield rate of the stacked semiconductor device, and allowing easy extension to next generation stacked semiconductor devices.

FIG. 1 illustrates a cross-sectional view a semiconductor device 100 in accordance with some embodiments. In some embodiments, the semiconductor device 100 is a wafer-level structure. In such embodiments, FIG. 1 shows a portion of the semiconductor device 100. In other embodiments, the semiconductor device 100 is a die-level structure. In such embodiments, the semiconductor device 100 may be formed as a wafer-level structure and subsequently singulated into a plurality of die-level structures.

In some embodiments, the semiconductor device 100 includes a substrate 101, such as silicon, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 101 has an active surface (e.g., the surface facing upwards in FIG. 1), sometimes called a front side, and an inactive surface (e.g., the surface facing downwards in FIG. 1), sometimes called a backside.

Devices 103 (represented by transistors) may be formed at the front surface of the substrate 101. The devices 103 may be active devices (e.g., transistors, diodes, etc.), passive devices (capacitors, resistors, inductors, etc.), the like, or combinations thereof. The devices 103 may be formed using any methods suitable for forming devices.

An interconnect structure 105 is formed over the substrate 101 and the devices 103. The interconnect structure 105 interconnects the devices 103 to form an integrated circuit. In some embodiments, the interconnect structure 105 comprises a plurality of dielectric layers 107 (not individually shown) and a plurality of metallization layers M1 to Mt in the dielectric layers 107. The metallization layer M1 may also be referred to as a bottommost metallization layer. The metallization layer Mt may also be referred to as a topmost metallization layer. The dielectric layers 107 may comprise low-k dielectric materials, Phospho-Silicate Glass (PSG), Boro-Silicate Glass (BSG), Boron-Doped Phospho-Silicate Glass (BPSG), undoped Silicate Glass (USG), or the like, and may be formed using spin coating, lamination, atomic layer deposition (ALD), chemical vapor deposition (CVD), or the like. Each of the metallization layers M1 to Mt comprises conductive lines 109 and conductive vias 111, and may be formed through any suitable process (such as deposition, damascene, dual damascene, or the like). The metallization layers M1 to Mt may comprise a conductive material, such as tungsten, cobalt, nickel, copper, silver, gold, aluminum, the like, or combinations thereof.

The semiconductor device 100 further includes pads 115 in an insulating layer 113 formed over the interconnect structure 105. The insulating layer 113 may also be referred to as a passivation layer. In some embodiments, the insulating layer 113 may comprise one or more layers of silicon oxide, silicon nitride, silicon oxynitride, the like, or combinations thereof, and may be formed using ALD, CVD, or the like. In some embodiments, the pads 115 may comprise a conductive material, such as tungsten, cobalt, nickel, copper, silver, gold, aluminum, the like, or combinations thereof.

In some embodiments, the pads 115 and the insulating layer 113 may be formed by forming and patterning a conductive material over the interconnect structure 105 to form the pads 115, forming an insulating material of the insulating layer 113 over the interconnect structure 105 and the pads 115, and planarizing the insulating material to expose the pads 115. In other embodiments, the pads 115 and the insulating layer 113 may be formed by forming an insulating material of the insulating layer 113 over the interconnect structure 105, patterning the insulating material to form openings for the pads 115, depositing a conductive material of the pads 115 in the openings, and planarizing the conductive material to remove portions of the conductive material overfilling the openings. Portions of the conductive material remaining in the openings form the pads 115. In some embodiments, the planarization process for planarizing the insulating material of the insulating layer 113 and the planarization process for planarizing the conductive material of the pads 115 may comprise chemical mechanical polishing (CMP), grinding, etching, a combination thereof, or the like. In some embodiments, a top surface of the insulating layer 113 and top surfaces of the pads 115 are substantially level or substantially coplanar within process variations of the planarization process.

The pads 115 are used to provide electrical and mechanical connections to external electrical components. In the illustrated embodiment, the pads 115 comprise pads 115A and 115B. The pads 115A are electrically coupled to the metallization layers M1 to Mt of the interconnect structure 105, and the pads 115B are electrically isolated from the metallization layers M1 to Mt of the interconnect structure 105. Accordingly, the pads 115A provide both the electrical and mechanical connections to external electrical components, while the pads 115B provide mechanical connections to external electrical components without providing electrical connections.

Referring further to FIG. 1, as described below in greater detail, the semiconductor device 100 is bonded to another semiconductor device. In some embodiments, before the bonding process, exposed surfaces of the insulating layer 113 and the pads 115 are subjected to a plasma process 117 to activate the exposed surfaces of the insulating layer 113 and the pads 115. In some embodiments, the plasma process 117 may be performed using a plasma generated from a process gas comprising $N_2$, $O_2$, $N_2H_2$, Ar, He, a mixture thereof, or the like.

FIGS. 2-6 illustrate cross-sectional views of various intermediate stages of fabrication of a semiconductor device 200 in accordance with some embodiments. In some embodiments, the semiconductor device 200 is a wafer-level structure. In such embodiments, FIGS. 2-6 show a portion of the semiconductor device 200. In other embodiments, the semiconductor device 200 is a die-level structure. In such embodiments, the semiconductor device 200 may be formed as a wafer-level structure and subsequently singulated into a plurality of die-level structures Referring to FIG. 2, a substrate 201 is provided. In some embodiments, the substrate 201 may be formed using similar materials and methods as the substrate 101 described above with reference to FIG. 1, and the description is not repeated herein. The substrate 201 has an active surface (e.g., the surface facing upwards in FIG. 2), sometimes called a front side, and an inactive surface (e.g., the surface facing downwards in FIG. 2), sometimes called a backside.

An insulating layer 203 is formed on the active surface of the substrate 201. In some embodiments, the insulating layer 203 may comprise one or more layers of silicon oxide, silicon nitride, silicon oxynitride, the like, or combinations thereof, and may be formed using ALD, CVD, or the like. In some embodiments, the insulating layer 203 has a thickness between about 10 Å and about 5000 Å. After forming the insulating layer 203, diode structures 205 are formed in the substrate 201 through the insulating layer 203. The diode structures 205 may have structures that may be formed as described below with reference to FIGS. 7-12, and the detailed description is provided at that time. In some embodiments, after forming the diode structures 205, the insulating layer 203 is removed and subsequently re-deposited over the substrate 201 and the diode structures 205.

Referring to FIG. 3, the substrate 201 and the insulating layer 203 are patterned to form opening 207. In some embodiments, the patterning process may comprise suitable photolithography and etch processes. The suitable etch process may comprise one or more dry etch processes, one or more wet etch processes, the like, or combinations thereof. The suitable etch process may be anisotropic. As described below in greater detail, capacitors are formed in the openings 207.

Figure 4:
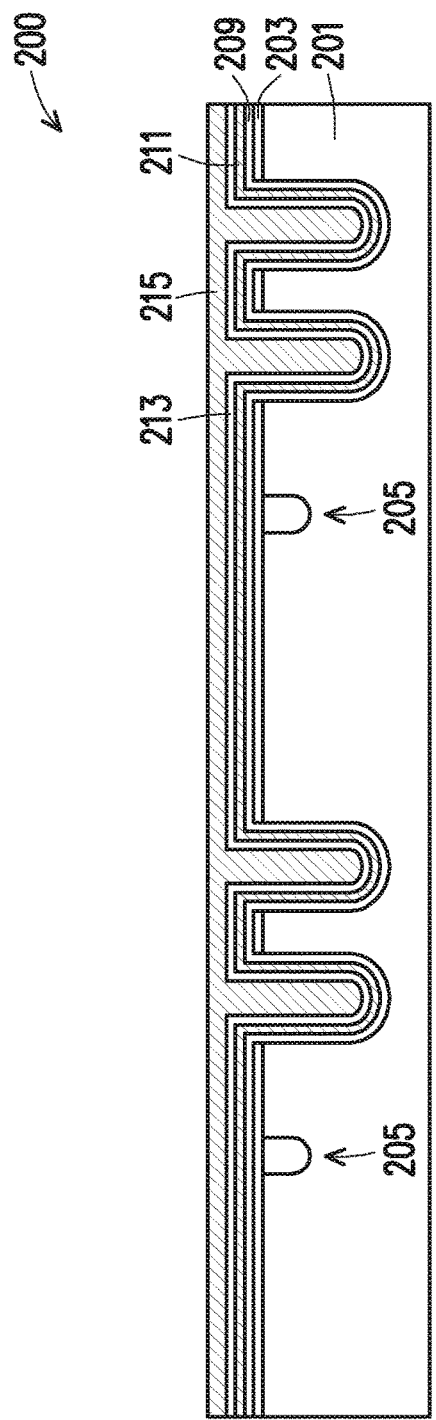

Referring to FIG. 4, an insulating layer 209 is formed over the insulating layer 203 and in the openings 207 (see FIG. 3). The insulating layer 209 may comprise one or more layers of silicon oxide, silicon carbide, silicon nitride, silicon oxynitride, the like, or combinations thereof, and may be formed using ALD, CVD, or the like. In some embodiments, the insulating layer 203 and the insulating layer 209 comprise a same material. In other embodiments, the insulating layer 203 and the insulating layer 209 comprise different materials. In some embodiments, the insulating layer 209 has a thickness between about 20 Å and about 3000 Å.

After forming the insulating layer 209, a conductive layer 211 is formed over the insulating layer 209 and in the openings 207 (see FIG. 3). In some embodiments, the conductive layer 211 may comprise tungsten, cobalt, nickel, copper, silver, gold, aluminum, the like, or combinations thereof, and may be formed using physical vapor deposition (PVD), ALD, CVD, or the like. In some embodiments, the conductive layer 211 has a thickness between about 20 Å and about 3000 Å.

After forming the conductive layer 211, an insulating layer 213 is formed over the conductive layer 211 and in the openings 207 (see FIG. 3). The insulating layer 213 may comprise one or more layers of high-k materials (such as AlO, HfO, TaO, ZrO, the like, or combinations thereof), and may be formed using ALD, CVD, or the like. In some embodiments, the insulating layer 213 has a thickness between about 5 Å and about 500 Å.

After forming the insulating layer 213, a conductive layer 215 is formed over the insulating layer 213 and in the openings 207 (see FIG. 3). In some embodiments, the conductive layer 215 fills the openings 207. In some embodiments, the conductive layer 215 may be formed using similar materials and methods as the conductive layer 211 and the description is not repeated herein. In some embodiments, the conductive layer 211 and the conductive layer 215 comprise a same material. In other embodiments, the conductive layer 211 and the conductive layer 215 comprise different materials. In some embodiments, the conductive layer 215 has a thickness between about 20 Å and about 3000 Å.

Figure 5:
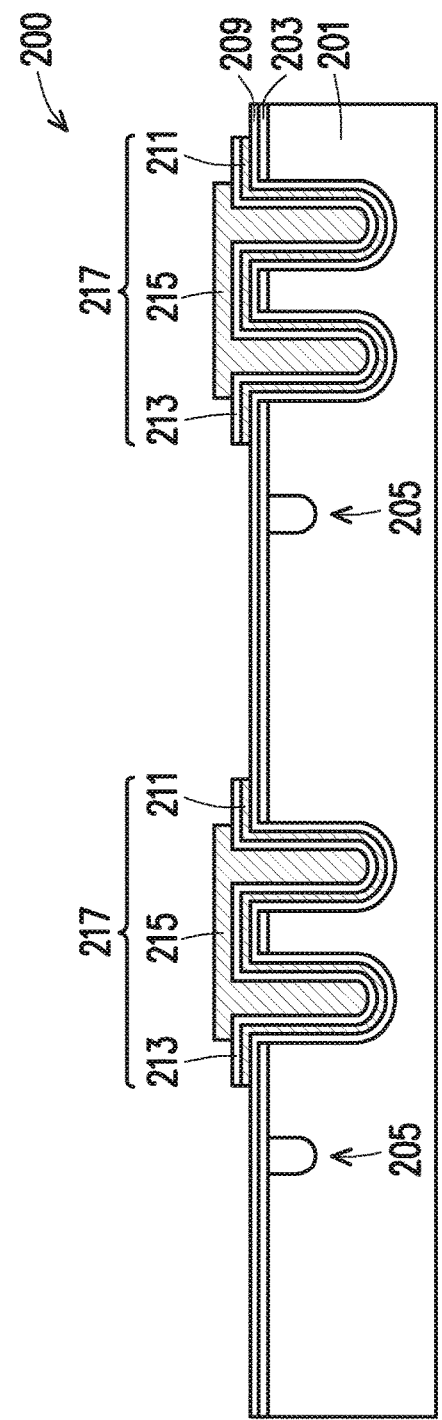

Referring to FIG. 5, after forming the conductive layer 215, a patterning process is performed on the insulating layer 213 and the conductive layers 211 and 215. In some embodiments, the patterning process may comprise suitable photolithography and etch processes. The suitable etch process may comprise one or more dry etch processes, one or more wet etch processes, the like, or combinations thereof. The insulating layer 209 may be used as an etch stop layer during the patterning process. Remaining portions of the insulating layer 213 and the conductive layers 211 and 215 form capacitors 217. The capacitors 217 may also be referred to as deep trench capacitors. Remaining portions the conductive layers 211 may also be referred to as lower electrode layers. Remaining portions the conductive layers 215 may also be referred to as upper electrode layers. In the illustrated embodiment, two openings 207 (see FIG. 3) are formed for each capacitor 217. In other embodiments, one opening 207 or more than two openings 207 may be formed for each capacitor 217 based on design requirements.

Figure 6:
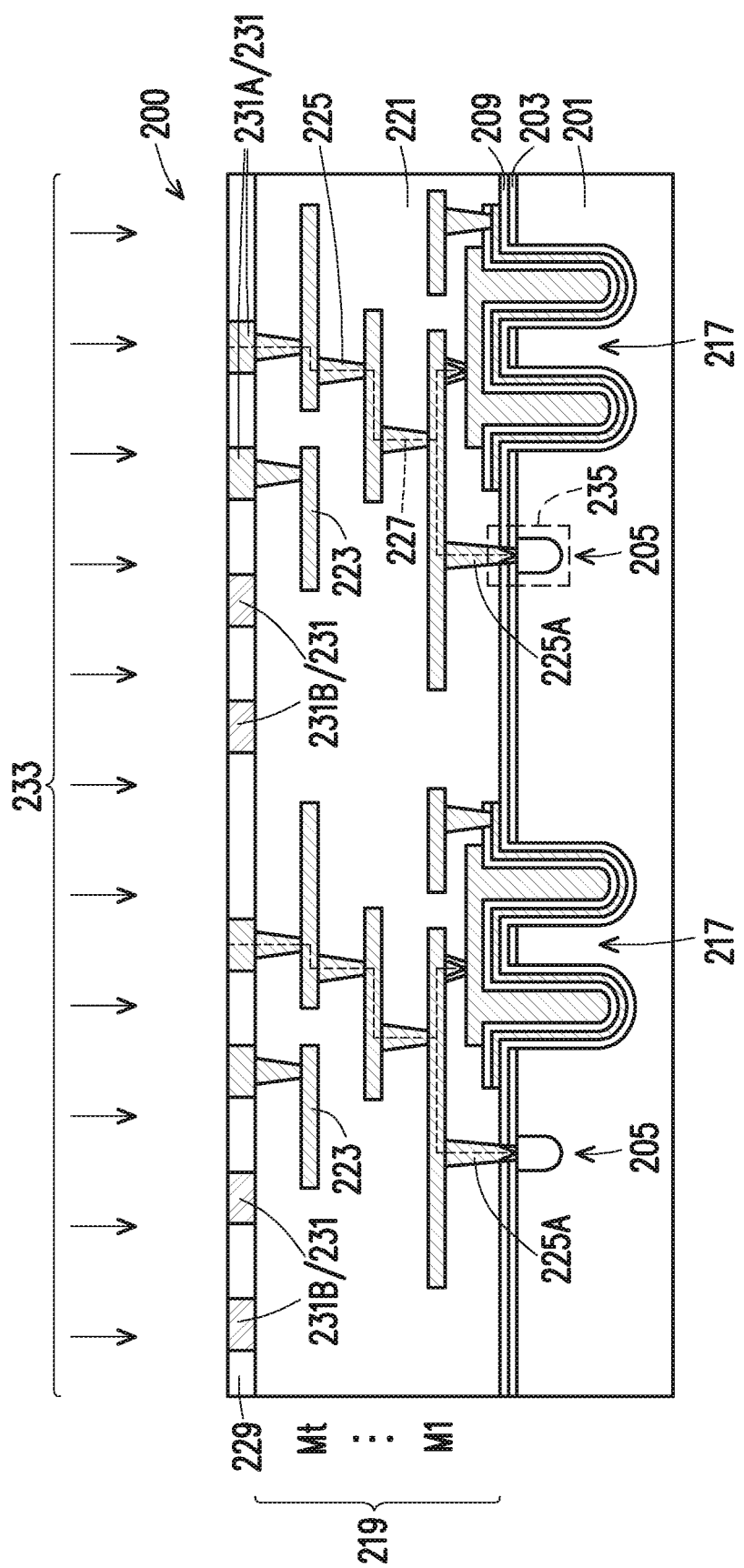

Referring to FIG. 6, an interconnect structure 219 is formed over the substrate 201 and the capacitors 217. In some embodiments, the interconnect structure 219 comprises a plurality of dielectric layers 221 (not individually shown) and a plurality of metallization layers M1 to Mt in the dielectric layers 221. The metallization layer M1 may also be referred to as a bottommost metallization layer. The metallization layer Mt may also be referred to as a topmost metallization layer. In some embodiments, the dielectric layers 221 may comprise similar materials and methods as the dielectric layers 107 described above with reference to FIG. 1, and the description is not repeated herein. Each of the metallization layers M1 to Mt comprise conductive lines 223 and conductive vias 225, and may be formed through any suitable process (such as deposition, damascene, dual damascene, or the like). The metallization layers M1 to Mt of the interconnect structure 219 may be formed using similar materials and methods as the metallization layers M1 to Mt of the interconnect structure 105 described above with reference to FIG. 1, and the description is not repeated herein. In some embodiments, the conductive vias 225A of the metallization layer M1 of the interconnect structure 219 extend through the insulating layers 203 and 209, and are in physical contact with upper surfaces of respective diode structures 205.

In the illustrated embodiment, the lower electrodes 211 and the upper electrodes 215 of the capacitors 217 are electrically coupled to a same metallization layer (such as, for example, the metallization layer M1) of the interconnect structure 219. In other embodiments, the lower electrodes 211 and the upper electrodes 215 of the capacitors 217 are electrically coupled to different metallization layers of the interconnect structure 219.

After forming the interconnect structure 219, an insulating layer 229 and pads 231 are formed over the interconnect structure 219. The insulating layer 229 may also be referred to as a passivation layer. The insulating layer 229 may be formed using similar materials and methods as the insulating layer 113 described above with reference to FIG. 1, and the description is not repeated herein. The pads 231 may be formed using similar materials and methods as the pads 115 described above with reference to FIG. 1, and the description is not repeated herein. In some embodiments, a top surface of the insulating layer 229 and top surfaces of the pads 231 are substantially level or substantially coplanar within process variations.

The pads 231 are used to provide electrical and mechanical connections to external electrical components. In the illustrated embodiment, the pads 231 comprise pads 231A and 231B. The pads 231A are electrically coupled to the metallization layers M1 to Mt of the interconnect structure 219, while the pads 231B are electrically isolated from the metallization layers M1 to Mt of the interconnect structure 219. Accordingly, the pads 231A provide both electrical and mechanical connections to external electrical components, while the pads 231B provide mechanical connections to external electrical components without providing electrical connections.

Referring further to FIG. 6, as described below in greater detail, the semiconductor device 200 is bonded to another semiconductor device (such as, for example, the semiconductor device 100 illustrated in FIG. 1). In some embodiments, before the bonding process, exposed surfaces of the insulating layer 229 and the pads 231 are subjected to a plasma process 233 to activate the exposed surfaces of the insulating layer 229 and the pads 231. In some embodiments, the plasma process 233 may be performed using a plasma generated from a process gas comprising $N_2$, $O_2$, $N_2H_2$, Ar, He, a mixture thereof, or the like.

During the normal operation of the semiconductor device 200, normal-operation voltages are applied across the semiconductor device 200. In some embodiments, the conductive vias 225A are formed to have high resistances, such that negligible or no current is conducted through the conductive vias 225A during the normal operation. In some embodiments, each of the diode structures 205 is configured to operate in reverse bias configurations and to have a reverse breakdown voltage less than normal-operation voltages (or to have the absolute value of the reverse breakdown voltage greater than the absolute values of the normal-operation voltages). Consequently, during the normal operation, negligible current flows though the diode structures 205. Accordingly, the conductive vias 225A and the diode structures 205 do not substantially affect the normal operation of the semiconductor device 200.

In some embodiments, the plasma process 233 causes charge accumulation on an upper side of the semiconductor device 200. Due to the charge accumulation, high voltages greater than the normal-operation voltages are applied across the semiconductor device 200, which may cause an electrical discharge through the semiconductor device 200 and may damage device (such as, for example, capacitors 217) of the semiconductor device 200. Due to the high voltage, significant discharge currents may flow into the diode structures 205 through the conductive vias 225A. In some embodiments, each of the diode structures 205 is configured to have the reverse breakdown voltage greater than the high voltages (or to have the absolute value of the reverse breakdown voltage less than the absolute values of the high voltages). Consequently, the high voltages cause break down or shorting of the diode structures 205 and large discharge currents flow into the substrate 201 though the diode structures 205. Dashed lines 227 illustrate discharge current paths through the semiconductor device 200 during the plasma process 233. By coupling the capacitors 217 to the substrate 201 through the metallization layer M1 of the interconnect structure 219, the conductive vias 225A, and respective diode structures 205, the discharge current is diverted from the capacitors 217 to the substrate 201. Accordingly, damage and shorting of the capacitors 217 is reduced or avoided.

Figure 7:
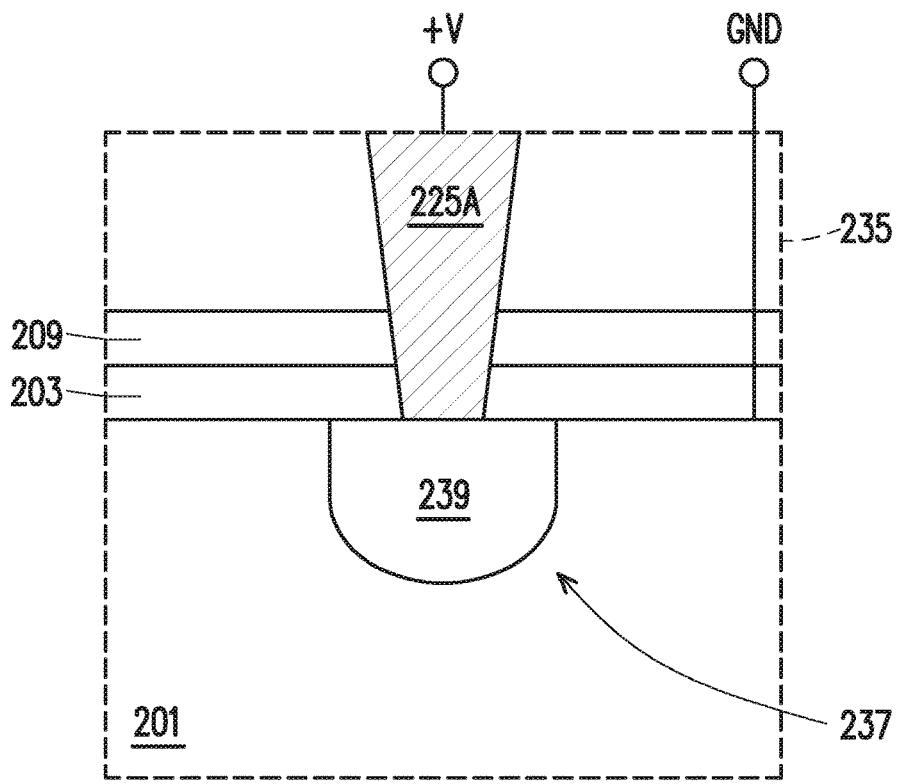
FIG. 7 illustrates a cross-sectional view of a diode structure in accordance with some embodiments.

FIG. 7 illustrates a magnified cross-sectional view of a region 235 of the semiconductor device 200 (see FIG. 6) in accordance with some embodiments, where the diode structures 205 of the semiconductor device 200 are implemented using a diode structure 237. In the illustrated embodiment, the substrate 201 is a p-type substrate and the diode structure 237 comprises an n-type well 239 embedded in the p-type substrate 201. Accordingly, the diode structure 237 comprises a pn-junction diode. In some embodiments, the n-type well 239 is formed by implanting n-type impurities in the substrate 201. The n-type impurities may be phosphorus, arsenic, antimony, a combination thereof, or the like. In some embodiments, a potential (for example, a positive potential) applied to the n-type well 239 is greater than a potential (for example, a ground (GND) potential) applied to the p-type substrate 201. Accordingly, the diode structure 237 is configured to operate in a reverse bias configuration.

Figure 8:
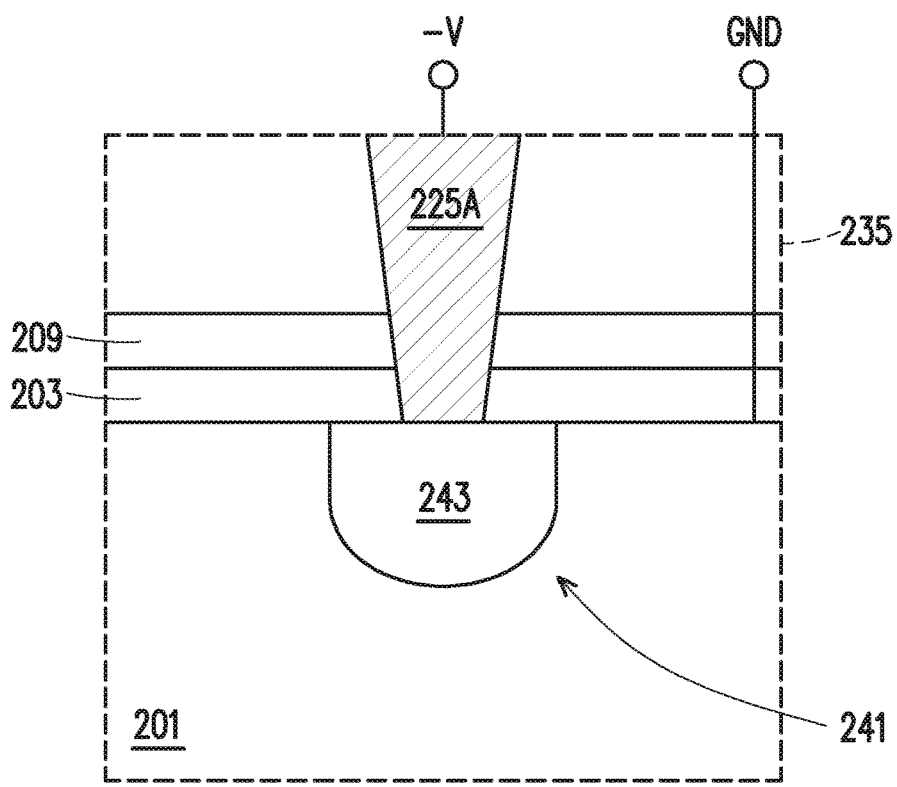
FIG. 8 illustrates a cross-sectional view of a diode structure in accordance with some embodiments.

FIG. 8 illustrates a magnified cross-sectional view of the region 235 of the semiconductor device 200 (see FIG. 6) in accordance with some embodiments, where the diode structures 205 of the semiconductor device 200 are implemented using a diode structure 241. In the illustrated embodiment, the substrate 201 is an n-type substrate and the diode structure 241 comprises a p-type well 243 embedded in the n-type substrate 201. Accordingly, the diode structure 241 comprises a pn-junction diode. In some embodiments, the p-type well 243 is formed by implanting p-type impurities in the substrate 201. The p-type impurities may be boron, indium, a combination thereof, or the like. In some embodiments, a potential (for example, a negative potential) applied to the p-type well 243 is less than a potential (for example, a ground (GND) potential) applied to the n-type substrate 201. Accordingly, the diode structure 241 is configured to operate in a reverse bias configuration.

Figure 9:
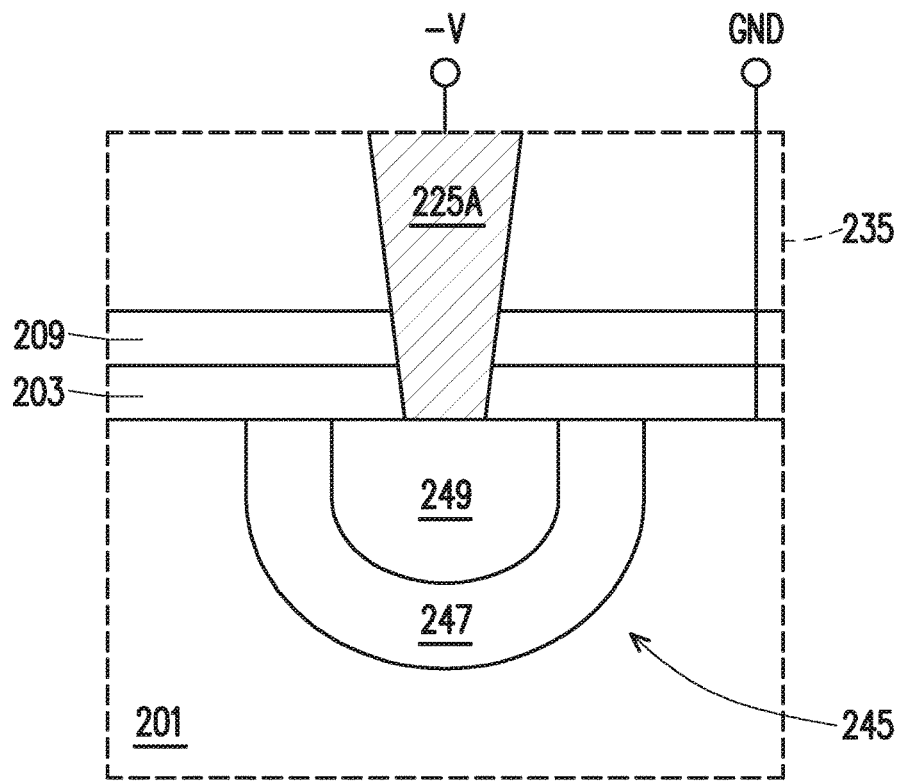
FIG. 9 illustrates a cross-sectional view of a diode structure in accordance with some embodiments.

FIG. 9 illustrates a magnified cross-sectional view of the region 235 of the semiconductor device 200 (see FIG. 6) in accordance with some embodiments, where the diode structures 205 of the semiconductor device 200 are implemented using a diode structure 245. In the illustrated embodiment, the substrate 201 is a p-type substrate and the diode structure 245 comprises an n-type well 247 embedded in the p-type substrate 201 and a p-type well 249 embedded in the n-type well 247. Accordingly, the diode structure 245 comprises two pn-junction diodes. In some embodiments, the n-type well 247 is formed by implanting n-type impurities in the substrate 201. In some embodiments, the p-type well 249 is formed by implanting p-type impurities in the n-type well 247. The n-type impurities may be phosphorus, arsenic, antimony, a combination thereof, or the like. The p-type impurities may be boron, indium, a combination thereof, or the like. In some embodiments, a potential (for example, a negative potential) applied to the p-type well 249 is less than a potential (for example, a ground (GND) potential) applied to the p-type substrate 201. Accordingly, the diode structure 245 is configured to operate in a reverse bias configuration.

Figure 10:
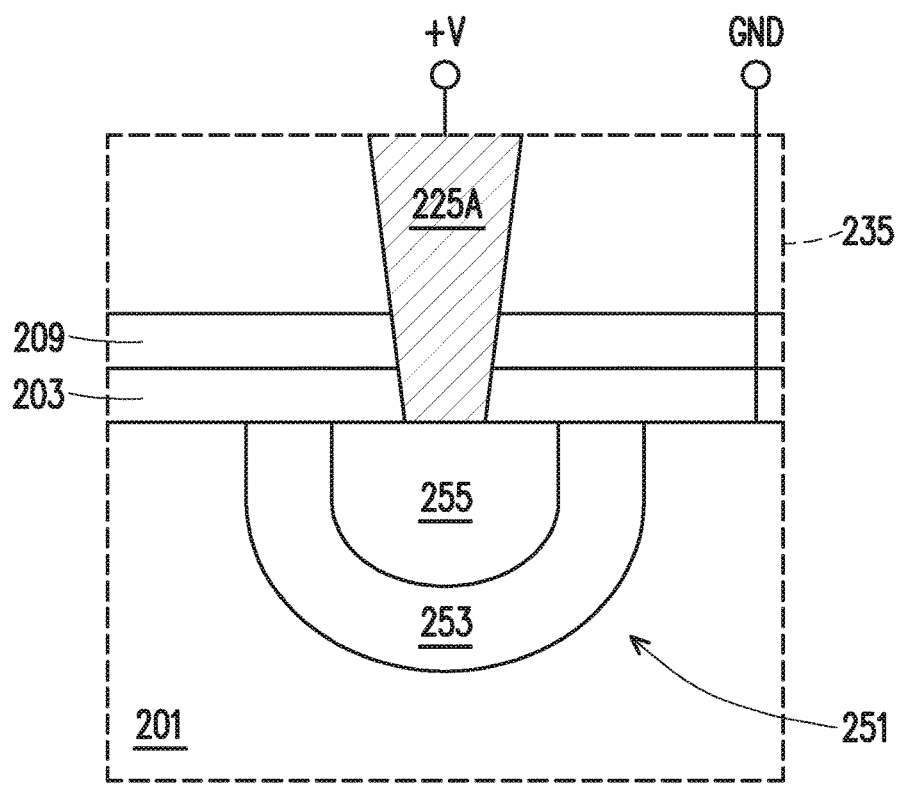
FIG. 10 illustrates a cross-sectional view of a diode structure in accordance with some embodiments.

FIG. 10 illustrates a magnified cross-sectional view of the region 235 of the semiconductor device 200 (see FIG. 6) in accordance with some embodiments, where the diode structures 205 of the semiconductor device 200 are implemented using a diode structure 251. In the illustrated embodiment, the substrate 201 is an n-type substrate and the diode structure 251 comprises a p-type well 253 embedded in the n-type substrate 201 and an n-type well 255 embedded in the p-type well 253. Accordingly, the diode structure 251 comprises two pn-junction diodes. In some embodiments, the p-type well 253 is formed by implanting p-type impurities in the substrate 201. In some embodiments, the n-type well 255 is formed by implanting n-type impurities in the p-type well 253. The n-type impurities may be phosphorus, arsenic, antimony, a combination thereof, or the like. The p-type impurities may be boron, indium, a combination thereof, or the like. In some embodiments, a potential (for example, a positive potential) applied to the n-type well 255 is greater than a potential (for example, a ground (GND) potential) applied to the n-type substrate 201. Accordingly, the diode structure 251 is configured to operate in a reverse bias configuration.

Figure 11:
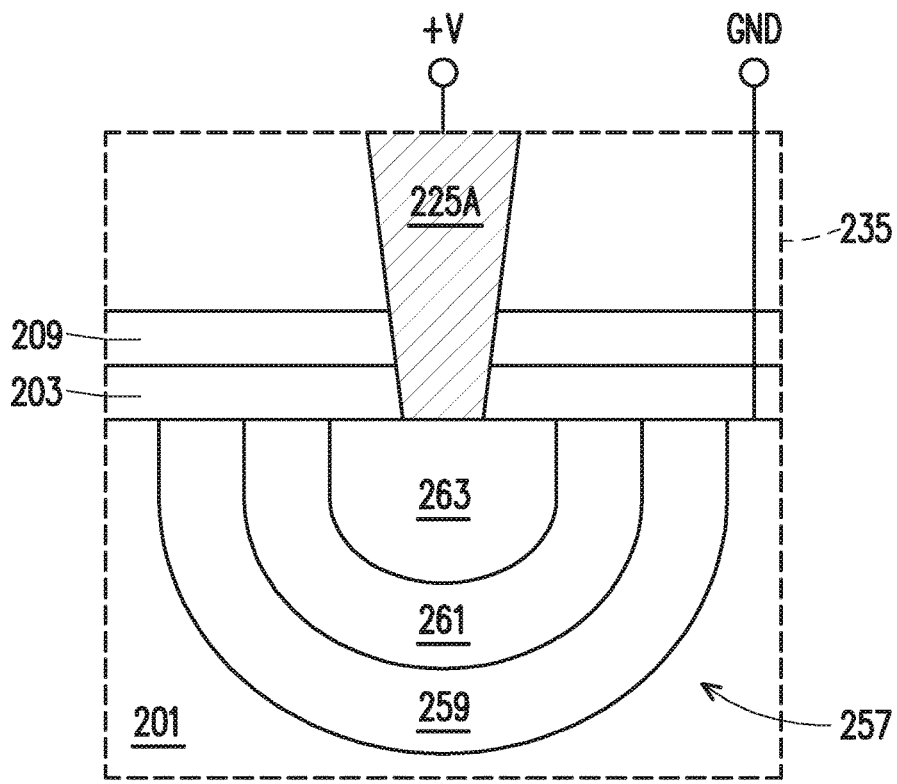
FIG. 11 illustrates a cross-sectional view of a diode structure in accordance with some embodiments.

FIG. 11 illustrates a magnified cross-sectional view of the region 235 of the semiconductor device 200 (see FIG. 6) in accordance with some embodiments, where the diode structures 205 of the semiconductor device 200 are implemented using a diode structure 257. In the illustrated embodiment, the substrate 201 is a p-type substrate and the diode structure 257 comprises an n-type well 259 embedded in the p-type substrate 201, a p-type well 261 embedded in the n-type well 259, and an n-type well 263 embedded in the p-type well 261. Accordingly, the diode structure 257 comprises three pn-junction diodes. In some embodiments, the n-type well 259 is formed by implanting n-type impurities in the substrate 201. In some embodiments, the p-type well 261 is formed by implanting p-type impurities in the n-type well 259. In some embodiments, the n-type well 263 is formed by implanting n-type impurities in the p-type well 261. The n-type impurities may be phosphorus, arsenic, antimony, a combination thereof, or the like. The p-type impurities may be boron, indium, a combination thereof, or the like. In some embodiments, a potential (for example, a positive potential) applied to the n-type well 263 is greater than a potential (for example, a ground (GND) potential) applied to the p-type substrate 201. Accordingly, the diode structure 257 is configured to operate in a reverse bias configuration.

Figure 12:
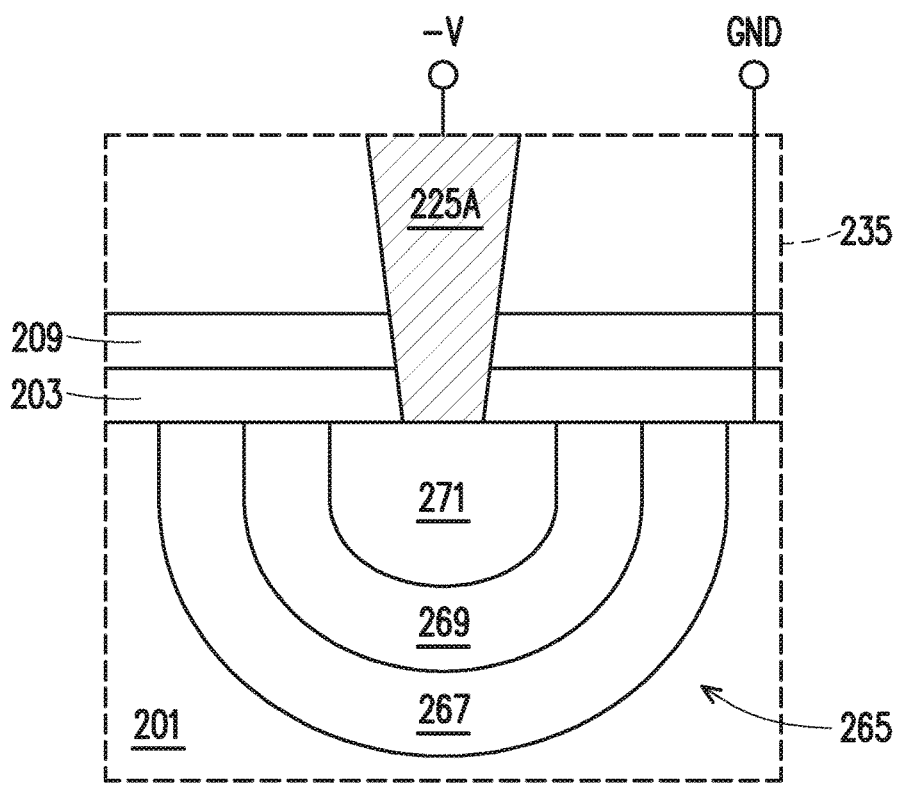
FIG. 12 illustrates a cross-sectional view of a diode structure in accordance with some embodiments.

FIG. 12 illustrates a magnified cross-sectional view of the region 235 of the semiconductor device 200 (see FIG. 6) in accordance with some embodiments, where the diode structures 205 of the semiconductor device 200 are implemented using a diode structure 265. In the illustrated embodiment, the substrate 201 is an n-type substrate and the diode structure 265 comprises a p-type well 267 embedded in the n-type substrate 201, an n-type well 269 embedded in the p-type well 267, and a p-type well 271 embedded in the n-type well 269. Accordingly, the diode structure 265 comprises three pn-junction diodes. In some embodiments, the p-type well 267 is formed by implanting p-type impurities in the substrate 201. In some embodiments, the n-type well 269 is formed by implanting n-type impurities in the p-type well 267. In some embodiments, the p-type well 271 is formed by implanting p-type impurities in the n-type well 269. The n-type impurities may be phosphorus, arsenic, antimony, a combination thereof, or the like. The p-type impurities may be boron, indium, a combination thereof, or the like. In some embodiments, a potential (for example, a negative potential) applied to the p-type well 271 is less than a potential (for example, a ground (GND) potential) applied to the n-type substrate 201. Accordingly, the diode structure 265 is configured to operate in a reverse bias configuration.

Figure 13:
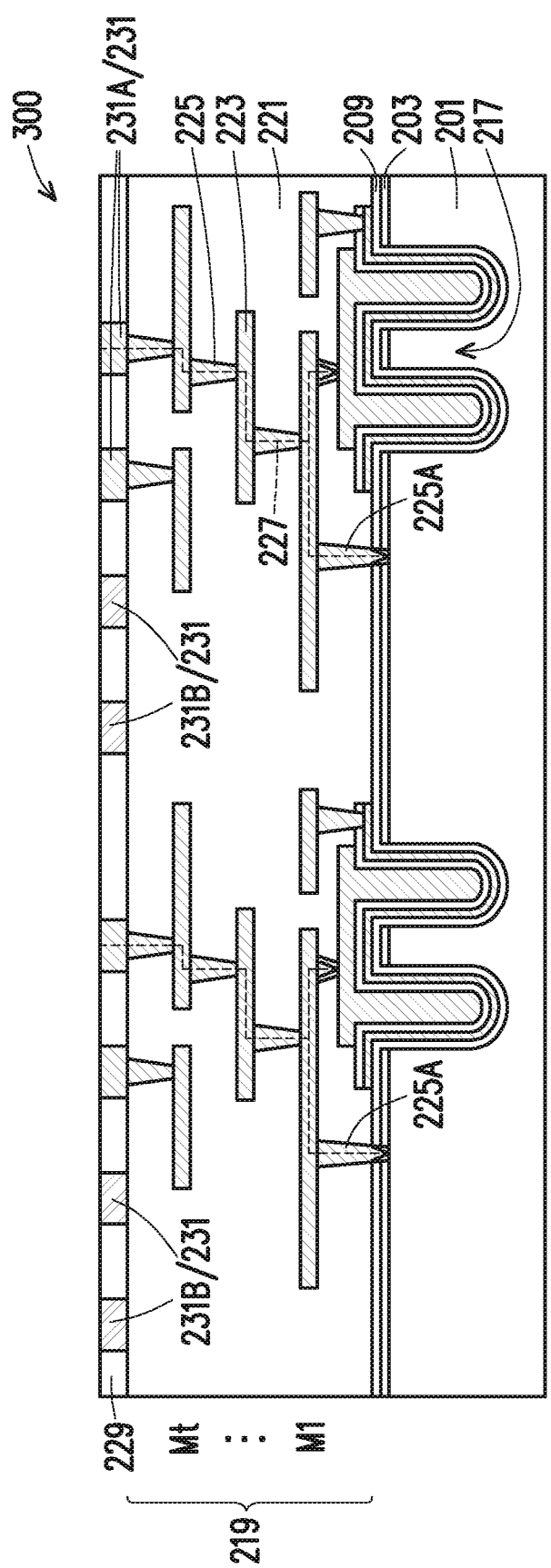
FIG. 13 illustrates a cross-sectional view of a semiconductor device in accordance with some embodiments.

FIG. 13 illustrates a cross-sectional view a semiconductor device 300 in accordance with some embodiments. In some embodiments, the semiconductor device 300 is similar to the semiconductor device 200 (see FIG. 6), with similar features being labeled by similar numerical references, and descriptions of the similar features are not repeated herein. In some embodiments, the semiconductor device 300 may be formed using process steps similar to the process steps described above with reference to FIGS. 2-6, and the description is not repeated herein. In the illustrated embodiment, the formation of the diode structures 205 as described above with reference to FIG. 2 is omitted. Accordingly, the discharge current paths 227 during a plasma process (such as, for example, the plasma process 233 described above with reference to FIG. 6) performed on the semiconductor device 300 comprise the conductive vias 225A and do not comprise the diode structures 205. By coupling the capacitors 217 to the substrate 201 through the metallization layer M1 of the interconnect structure 219 and the conductive vias 225A, the discharge current is diverted from the capacitors 217 to the substrate 201. Accordingly, damage and shorting of the capacitors 217 is reduced or avoided.

FIGS. 14-18 illustrate cross-sectional views of various intermediate stages of fabrication of a semiconductor device 400 in accordance with some embodiments. In some embodiments, the semiconductor device 400 is a wafer-level structure. In such embodiments, FIGS. 14-18 show a portion of the semiconductor device 400. In other embodiments, the semiconductor device 400 is a die-level structure. In such embodiments, the semiconductor device 400 may be formed as a wafer-level structure and subsequently singulated into a plurality of die-level structures.

Figure 14:
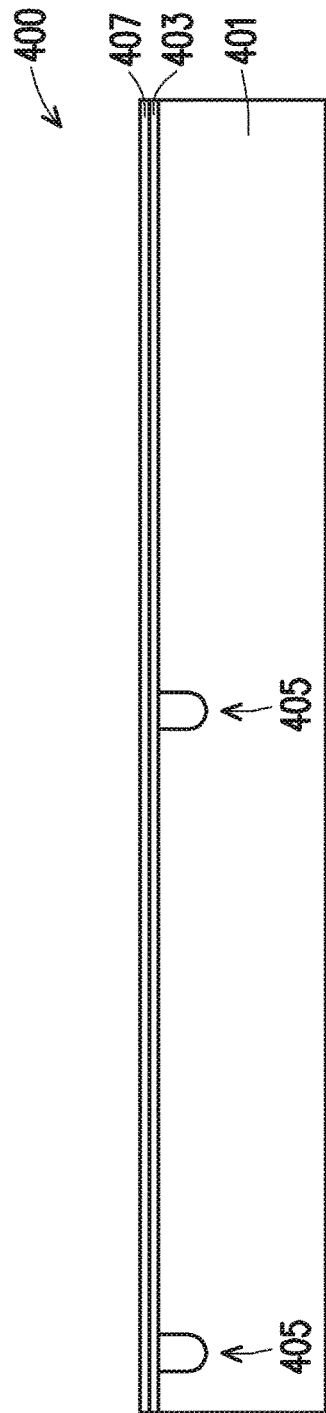
FIGS. 14-18 illustrate cross-sectional views of various intermediate stages of fabrication of a semiconductor device in accordance with some embodiments.

Referring to FIG. 14, a substrate 401 is provided. In some embodiments, the substrate 401 may be formed using similar materials and methods as the substrate 101 described above with reference to FIG. 1, and the description is not repeated herein. The substrate 401 has an active surface (e.g., the surface facing upwards in FIG. 14), sometimes called a front side, and an inactive surface (e.g., the surface facing downwards in FIG. 14), sometimes called a backside.

An insulating layer 403 is formed on the active surface of the substrate 401. In some embodiments, the insulating layer 403 may comprise one or more layers of silicon oxide, silicon nitride, silicon oxynitride, the like, or combinations thereof, and may be formed using ALD, CVD, or the like. In some embodiments, the insulating layer 403 has a thickness between about 10 Å and about 5000 Å. After forming the insulating layer 403, diode structures 405 are formed in the substrate 401 through the insulating layer 403. In some embodiment, the diode structures 405 may be implemented using the diode structures 237, 241, 245, 251, 257, and 265 illustrated in FIGS. 7-12, respectively. In some embodiments, after forming the diode structures 405, the insulating layer 403 is removed and subsequently re-deposited over the substrate 401 and the diode structures 405.

After forming the insulating layer 403, an insulating layer 407 is formed over the insulating layer 403. The insulating layer 407 may also be referred to as an etch stop layer. In some embodiments, the insulating layer 407 may comprise one or more layers of silicon oxide, silicon carbide, silicon nitride, silicon oxynitride, the like, or combinations thereof, and may be formed using ALD, CVD, or the like. In some embodiments, the insulating layer 407 has a thickness between about 50 Å and about 8000 Å. In some embodiments, the insulating layer 403 and the insulating layer 407 comprise different materials.

Figure 15:
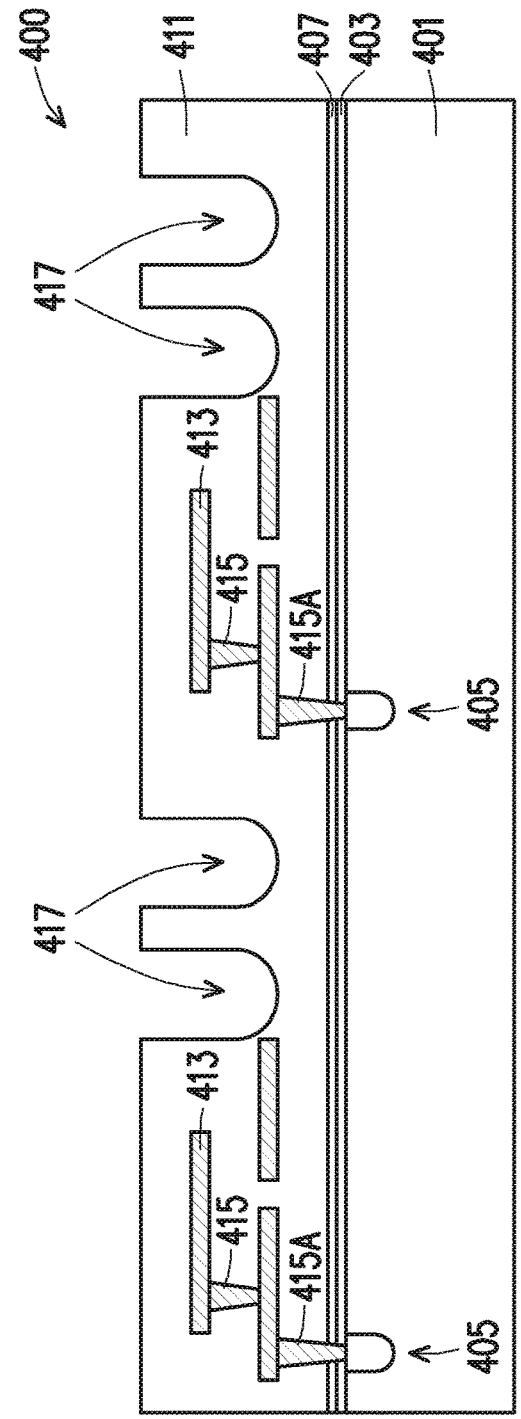

Referring to FIG. 15, a first portion of an interconnect structure 409 is formed over the insulating layer 407. In some embodiments, the first portion of the interconnect structure 409 comprises a first portion of a plurality of dielectric layers 411 (not individually shown) and a plurality of metallization layers M1 to Mk in the first portion of a plurality of dielectric layers 411. The metallization layer M1 may also be referred to as the bottommost metallization layer. In some embodiments, the dielectric layers 411 may comprise similar materials and methods as the dielectric layers 107 described above with reference to FIG. 1, and the description is not repeated herein. Each of the metallization layers M1 to Mk comprises conductive lines 413 and conductive vias 415, and may be formed through any suitable process (such as deposition, damascene, dual damascene, or the like). The metallization layers M1 to Mk of the interconnect structure 409 may be formed using similar materials and methods as the metallization layers M1 to Mt of the interconnect structure 105 described above with reference to FIG. 1, and the description is not repeated herein. In some embodiments, the conductive vias 415A of the metallization layer M1 of the interconnect structure extend through the insulating layers 403 and 407 and are in physical contact with upper surfaces of respective diode structures 405.

After forming the first portion of the interconnect structure 409, a patterning process is performed on the first portion of the dielectric layers 411 to form openings 417. In some embodiments, the patterning process may comprise suitable photolithography and etch processes. The suitable etch process may comprise one or more dry etch processes, one or more wet etch processes, the like, or combinations thereof. The suitable etch process may be anisotropic. As described below in greater detail, capacitors are formed in the openings 417.

Figure 16:
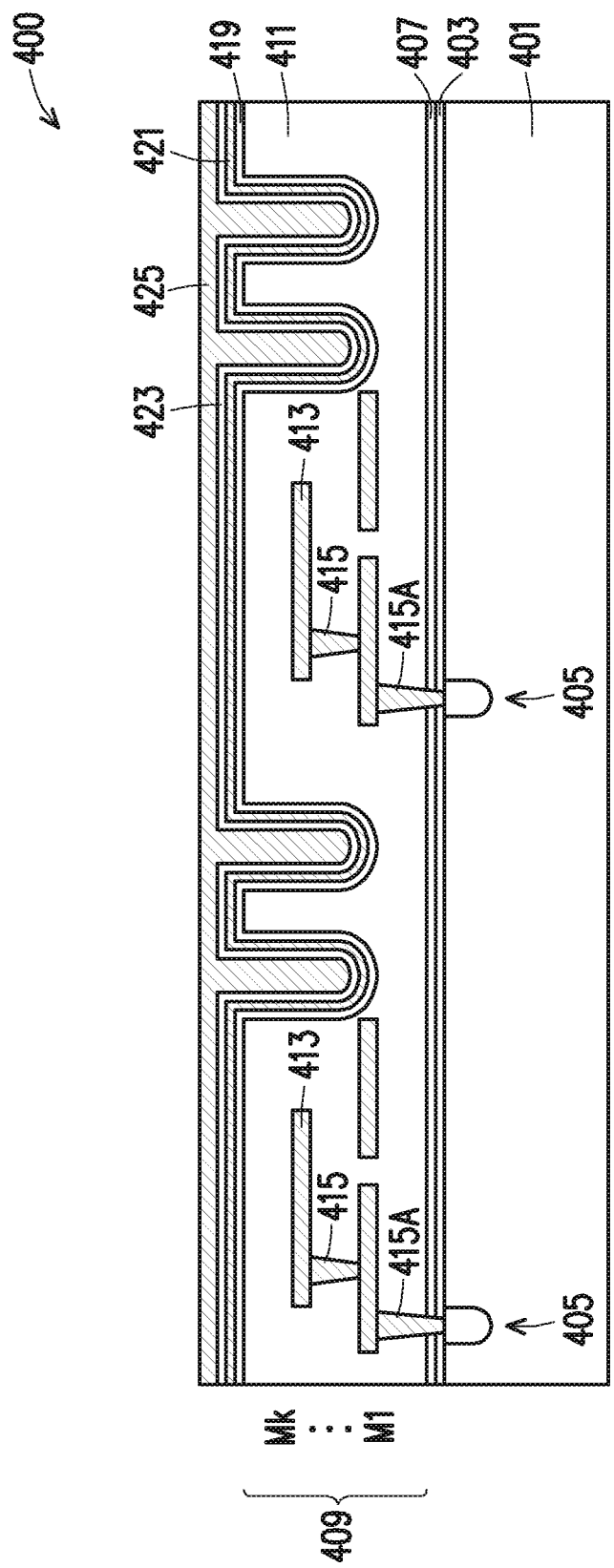

Referring to FIG. 16, an insulating layer 419 is formed over the first portion of the dielectric layers 411 and in the openings 417 (see FIG. 15). The insulating layer 419 may comprise one or more layers of silicon oxide, silicon nitride, silicon oxynitride, silicon carbide, the like, or combinations thereof, and may be formed using ALD, CVD, or the like. In some embodiments, the insulating layer 419 has a thickness between about 20 Å and about 8000 Å.

After forming the insulating layer 419, a conductive layer 421 is formed over the insulating layer 419 and in the openings 417 (see FIG. 15). In some embodiments, the conductive layer 421 may comprise tungsten, cobalt, nickel, copper, silver, gold, aluminum, the like, or combinations thereof, and may be formed using PVD, ALD, CVD, or the like. In some embodiments, the conductive layer 421 has a thickness between about 10 Å and about 3000 Å.

After forming the conductive layer 421, an insulating layer 423 is formed over the conductive layer 421 and in the openings 417 (see FIG. 15). The insulating layer 423 may comprise one or more layers of high-k materials (such as AlO, HfO, TaO, ZrO, the like, or combinations thereof), and may be formed using ALD, CVD, or the like. In some embodiments, the insulating layer 423 has a thickness between about 5 Å and about 500 Å.

After forming the insulating layer 423, a conductive layer 425 is formed over the insulating layer 423 and in the openings 417 (see FIG. 15). In some embodiments, the conductive layer 425 fills the openings 417. In some embodiments, the conductive layer 425 may be formed using similar materials and methods as the conductive layer 421 and the description is not repeated herein. In some embodiments, the conductive layer 421 and the conductive layer 425 comprise a same material. In other embodiments, the conductive layer 421 and the conductive layer 425 comprise different materials. In some embodiments, the conductive layer 425 has a thickness between about 10 Å and about 3000 Å.

Figure 17:
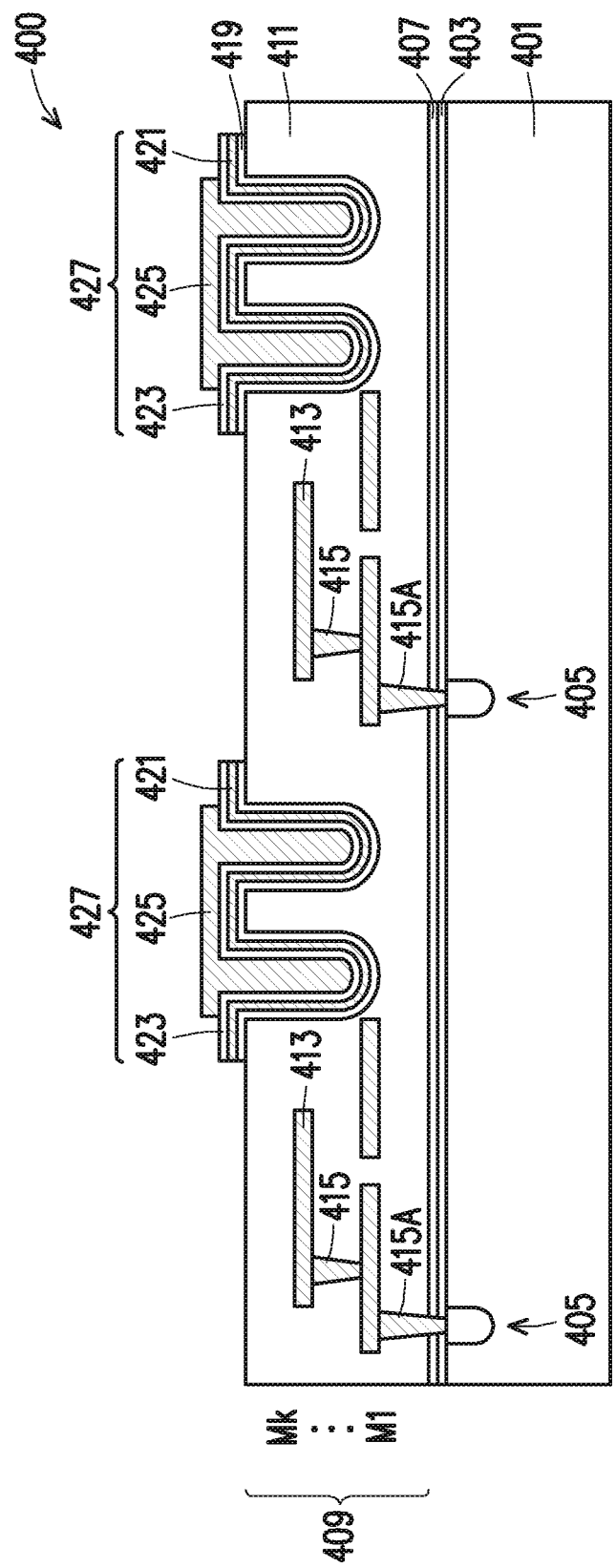

Referring to FIG. 17, after forming the conductive layer 425, a patterning process is performed on the insulating layers 419 and 423, and the conductive layers 421 and 425. In some embodiments, the patterning process may comprise suitable photolithography and etch processes. The suitable etch process may comprise one or more dry etch processes, one or more wet etch processes, the like, or combinations thereof. Remaining portions of the insulating layer 423 and the conductive layers 421 and 425 form capacitors 427. The capacitors 427 may also be referred to as deep trench capacitors. Remaining portions the conductive layers 421 may also be referred to as lower electrode layers. Remaining portions the conductive layers 425 may also be referred to as upper electrode layers. In the illustrated embodiment, two openings 417 (see FIG. 15) are formed for each capacitor 427. In other embodiments, one opening 417 or more than two openings 417 may be formed for each capacitor 427 based on design requirements.

Figure 18:
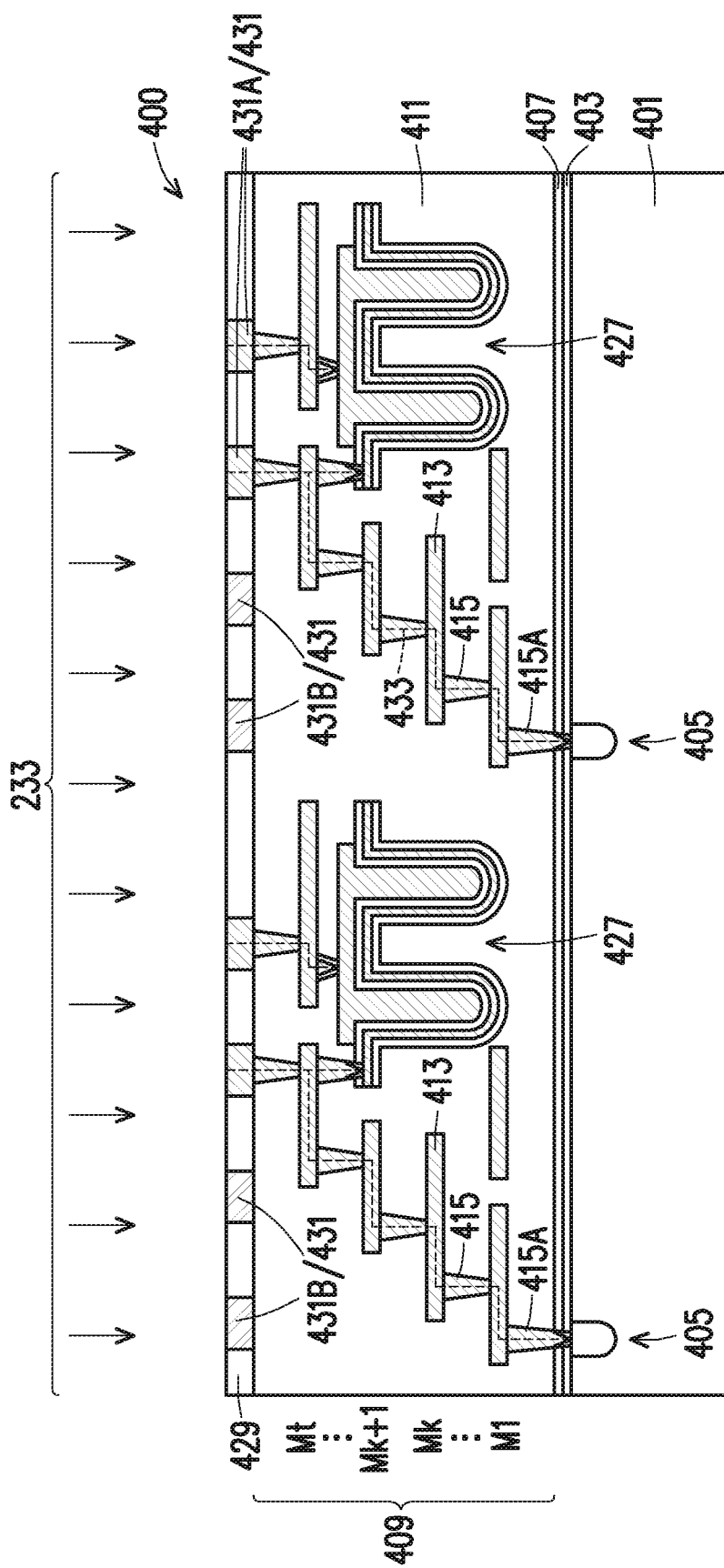

Referring to FIG. 18, after forming the capacitors 427, a second portion of the interconnect structure 409 is formed over the capacitors 427 and the first portion of the interconnect structure 409. The second portion of the interconnect structure 409 comprises a second portion of the dielectric layers 411 and a plurality of metallization layers Mk+1 to Mt in the second portion of the dielectric layers 411. The plurality of metallization layers Mk+1 to Mt may be formed using similar materials and methods as the plurality of metallization layers M1 to Mk described above with reference to FIG. 15, and the description is not repeated herein. The metallization layer Mt may also be referred to as a topmost metallization layer.

In the illustrated embodiment, the lower electrodes 421 and the upper electrodes 425 of the capacitors 427 are electrically coupled to a same metallization layer (such as, for example, the metallization layer Mt) of the interconnect structure 409. In other embodiments, the lower electrodes 421 and the upper electrodes 425 of the capacitors 427 are electrically coupled to different metallization layers of the interconnect structure 409.

After forming the interconnect structure 409, an insulating layer 429 and pads 431 are formed over the interconnect structure 409. The insulating layer 429 may also be referred to as a passivation layer. The insulating layer 429 may be formed using similar materials and methods as the insulating layer 113 described above with reference to FIG. 1, and the description is not repeated herein. The pads 431 may be formed using similar materials and methods as the pads 115 described above with reference to FIG. 1, and the description is not repeated herein. In some embodiments, a top surface of the insulating layer 429 and top surfaces of the pads 431 are substantially level or substantially coplanar within process variations.

The pads 431 are used to provide electrical and mechanical connections to external electrical components. In the illustrated embodiment, the pads 431 comprise pads 431A and 431B. The pads 431A are electrically coupled to the metallization layers M1 to Mt of the interconnect structure 409, while the pads 431B are electrically isolated from the metallization layers M1 to Mt of the interconnect structure 409. Accordingly, the pads 431A provide both electrical and mechanical connections to external electrical components, while the pads 431B provide mechanical connections to external electrical components without providing electrical connections.

Referring further to FIG. 18, as described below in greater detail, the semiconductor device 400 is bonded to another semiconductor device (such as, for example, the semiconductor device 100 illustrated in FIG. 1). In some embodiments, before the bonding process, exposed surfaces of the insulating layer 429 and the pads 431 are subjected to a plasma process 233 to activate the exposed surfaces of the insulating layer 429 and the pads 431. The plasma process 233 may be performed as described above with reference to FIG. 6 and the description is not repeated herein.

During the normal operation of the semiconductor device 400, normal-operation voltages are applied across the semiconductor device 400. In some embodiments, the conductive vias 415A are formed to have high resistances, such that negligible or no current is conducted through the conductive vias 415A during the normal operation. In some embodiments, the diode structures 405 are configured to operate in reverse bias configurations and to have a reverse breakdown voltage less than normal-operation voltages (or to have the absolute value of the reverse breakdown voltage greater than the absolute values of the normal-operation voltages). Consequently, during the normal operation, negligible current flows though the diode structures 405. Accordingly, the conductive vias 415A and the diode structures 405 do not substantially affect the normal operation of the semiconductor device 400.

In some embodiments, the plasma process 233 causes charge accumulation on an upper side of the semiconductor device 400. Due to the charge accumulation, high voltages greater than the normal-operation voltages are applied across the semiconductor device 400, which may cause an electrical discharge through the semiconductor device 400 and may damage device (such as, for example, capacitors 427) of the semiconductor device 400. Due to the high voltage, significant discharge currents may flow into the diode structures 405 through the conductive vias 415A. In some embodiments, the diode structures 405 are configured to have the reverse breakdown voltage greater than the high voltages (or to have the absolute value of the reverse breakdown voltage less than the absolute values of the high voltages). Consequently, the high voltages cause break down or shorting of the diode structures 405 and large discharge currents flow into the substrate 401 though the diode structures 405. Dashed lines 433 illustrate discharge current paths through the semiconductor device 400 during the plasma process 233. By coupling the capacitors 427 to the substrate 401 through the metallization layers M1 to Mt of the interconnect structure 409, the conductive vias 415A, and respective diode structures 405, the discharge current is diverted from the capacitors 427 to the substrate 401. Accordingly, damage and shorting of the capacitors 427 is reduced or avoided.

Figure 19:
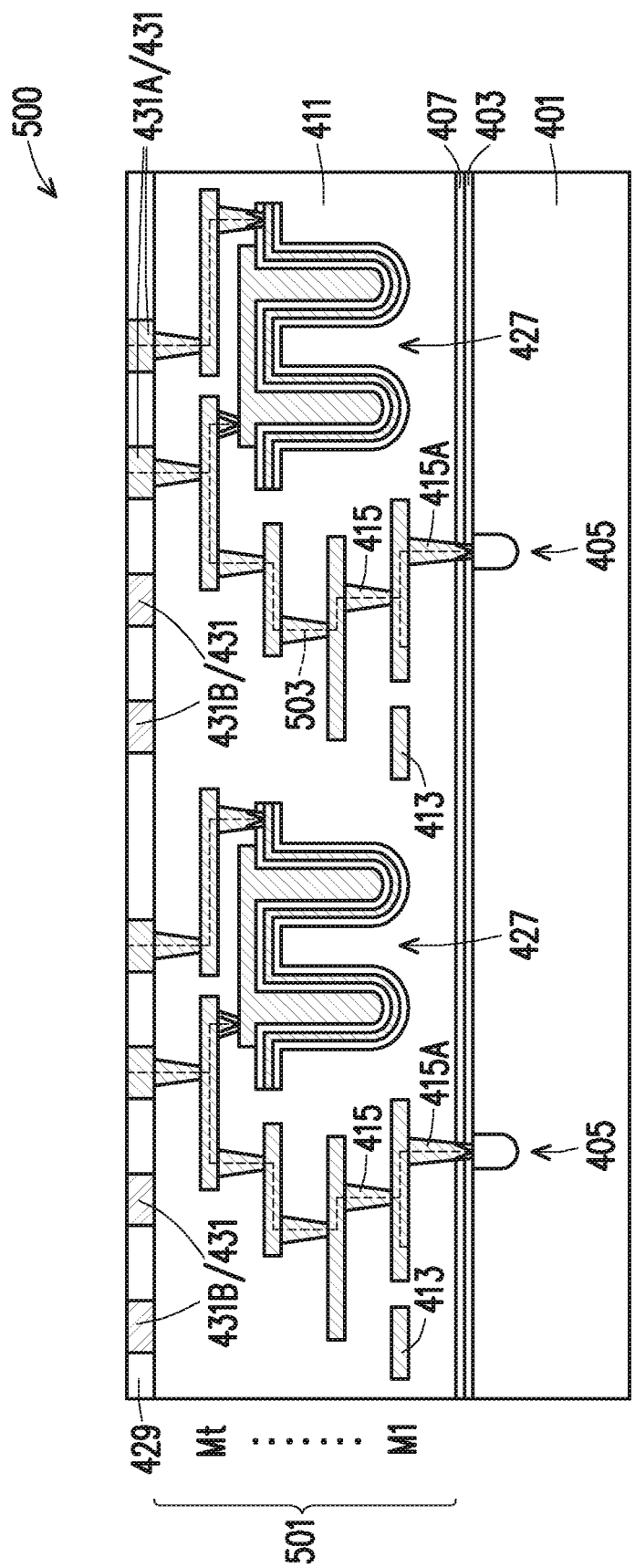
FIG. 19 illustrates a cross-sectional view of a semiconductor device in accordance with some embodiments.

FIG. 19 illustrates a cross-sectional view a semiconductor device 500 in accordance with some embodiments. The semiconductor device 500 is similar to the semiconductor device 400 (see FIG. 18), with similar features being labeled by similar numerical references, and descriptions of the similar features are not repeated herein. The semiconductor device 500 may be formed using process steps similar to the process steps described above with reference to FIGS. 14-18, and the description is not repeated herein. The interconnect structure 501 of the semiconductor device 500 differs from the interconnect structure 409 of the semiconductor device 400 (see FIG. 18) by a layout of the metallization layers M1 to Mt and how the metallization layers M1 to Mt are coupled to the capacitors 427. In the semiconductor device 400 (see FIG. 18), the lower electrodes 421 of the capacitors 427 are electrically coupled to the substrate 401 trough respective conductive vias 415A and diode structures 405. In the semiconductor device 500, the upper electrodes 425 of the capacitors 427 are electrically coupled to the substrate 401 trough respective conductive vias 415A and diode structures 405. Dashed lines 503 illustrate discharge current paths through the semiconductor device 500 during a plasma process (such as, for example, the plasma process 233 described above with reference to FIG. 6) performed on the semiconductor device 500. By coupling the capacitors 427 to the substrate 401 through the metallization layers M1 to Mt of the interconnect structure 501, the conductive vias 415A, and respective diode structures 405, the discharge current is diverted from the capacitors 427 to the substrate 401. Accordingly, damage and shorting of the capacitors 427 is reduced or avoided.

Figure 20:
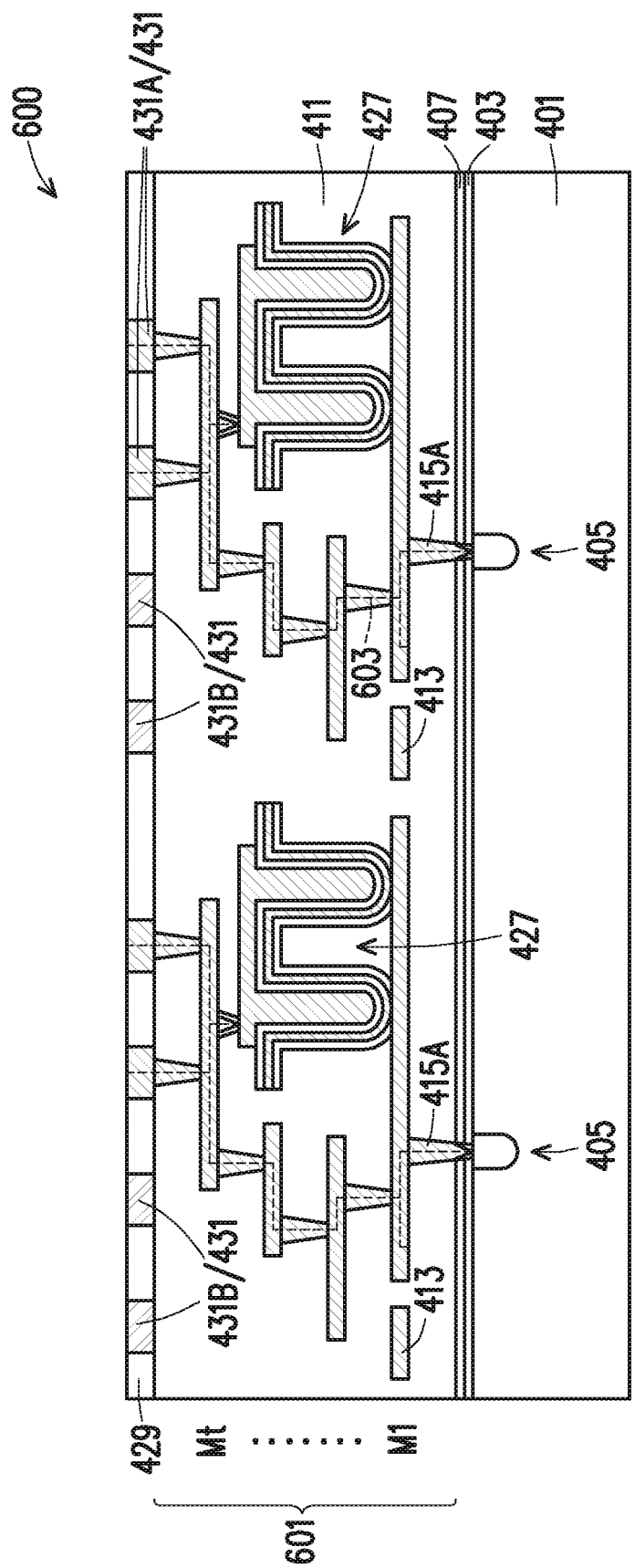
FIG. 20 illustrates a cross-sectional view of a semiconductor device in accordance with some embodiments.

FIG. 20 illustrates a cross-sectional view a semiconductor device 600 in accordance with some embodiments. The semiconductor device 600 is similar to the semiconductor device 400 (see FIG. 18), with similar features being labeled by similar numerical references, and descriptions of the similar features are not repeated herein. The semiconductor device 600 may be formed using process steps similar to the process steps described above with reference to FIGS. 14-18, and the description is not repeated herein. The interconnect structure 601 of the semiconductor device 600 differs from the interconnect structure 409 of the semiconductor device 400 (see FIG. 18) by a layout of the metallization layers M1 to Mt and how the metallization layers M1 to Mt are coupled to the capacitors 427. In the semiconductor device 400 (see FIG. 18), the lower electrodes 421 and the upper electrodes 425 of the capacitors 427 are electrically coupled to a same metallization layer (such as the metallization layer Mt) of the interconnect structure 409. In the semiconductor device 600, the lower electrodes 421 of the capacitors 427 are electrically coupled to the metallization layer M1 of the interconnect structure 601 and the upper electrodes 425 of the capacitors 427 are electrically coupled to the metallization layer Mt of the interconnect structure 601. Dashed lines 603 illustrate discharge current paths through the semiconductor device 600 during a plasma process (such as, for example, the plasma process 233 described above with reference to FIG. 6) performed on the semiconductor device 600. By coupling the capacitors 427 to the substrate 401 through the metallization layers M1 to Mt of the interconnect structure 601, the conductive vias 415A, and respective diode structures 405, the discharge current is diverted from the capacitors 427 to the substrate 401. Accordingly, damage and shorting of the capacitors 427 is reduced or avoided.

Figure 21:
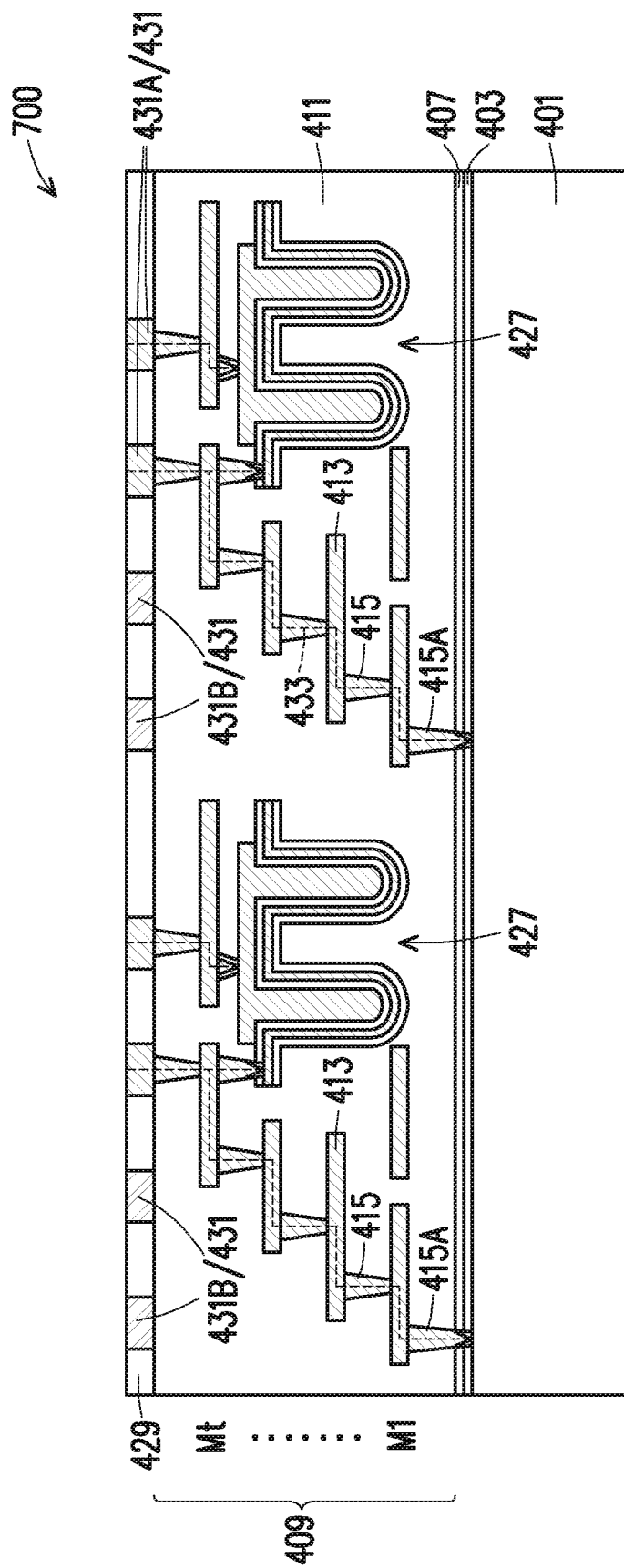
FIG. 21 illustrates a cross-sectional view of a semiconductor device in accordance with some embodiments.

FIG. 21 illustrates a cross-sectional view a semiconductor device 700 in accordance with some embodiments. The semiconductor device 700 is similar to the semiconductor device 400 (see FIG. 18), with similar features being labeled by similar numerical references, and descriptions of the similar features are not repeated herein. The semiconductor device 700 may be formed using process steps similar to the process steps described above with reference to FIGS. 14-18, and the description is not repeated herein. In the illustrated embodiment, the formation of the diode structures 405 (see FIG. 18) is omitted. Accordingly, the discharge current paths 433 during a plasma process (such as, for example, the plasma process 233 described above with reference to FIG. 6) performed on the semiconductor device 700 comprise the conductive vias 415A and do not comprise the diode structures 405. By coupling the capacitors 427 to the substrate 401 though the metallization layers M1 to Mt of the interconnect structure 409 and the conductive vias 415A, the discharge current is diverted from the capacitors 427 to the substrate 401. Accordingly, damage and shorting of the capacitors 427 is reduced or avoided.

Figure 22:
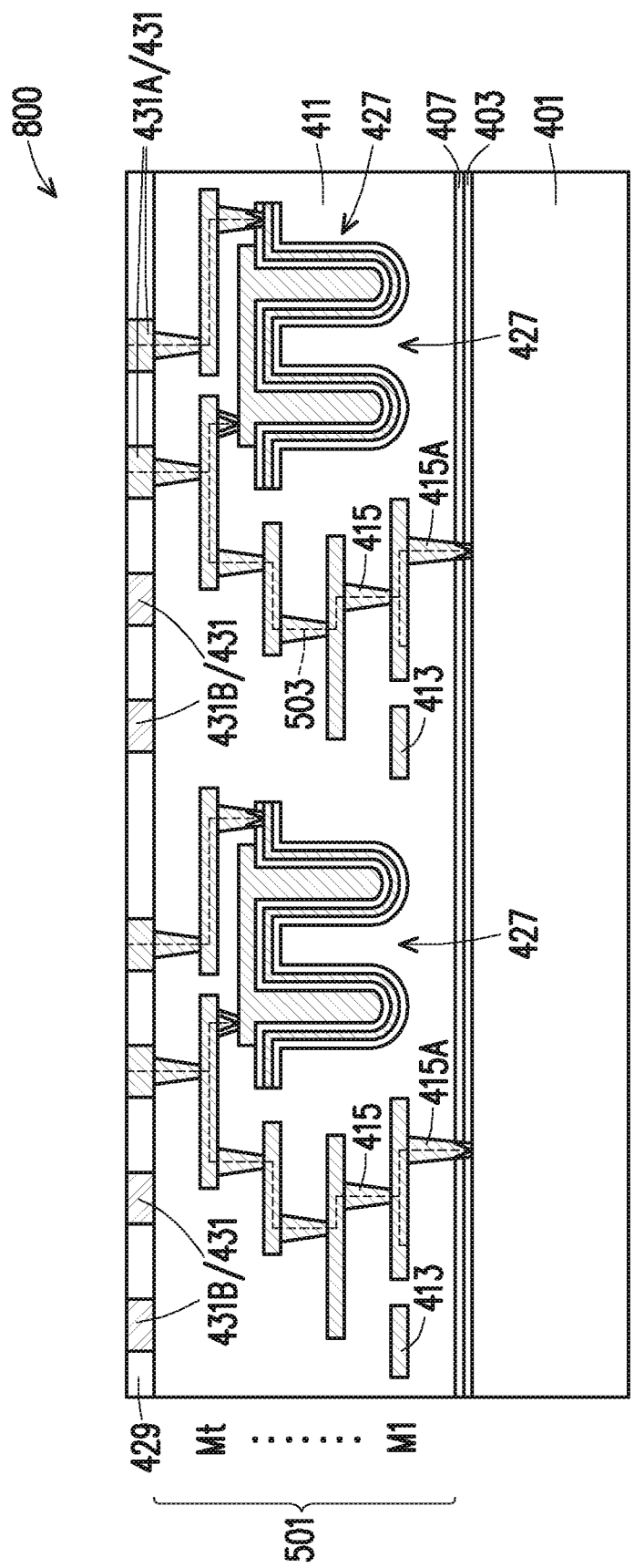
FIG. 22 illustrates a cross-sectional view of a semiconductor device in accordance with some embodiments.

FIG. 22 illustrates a cross-sectional view a semiconductor device 800 in accordance with some embodiments. The semiconductor device 800 is similar to the semiconductor device 500 (see FIG. 19), with similar features being labeled by similar numerical references, and descriptions of the similar features are not repeated herein. The semiconductor device 800 may be formed using process steps similar to the process steps described above with reference to FIGS. 14-18, and the description is not repeated herein. In the illustrated embodiment, the formation of the diode structures 405 (see FIG. 19) is omitted. Accordingly, the discharge current paths 503 during a plasma process (such as, for example, the plasma process 233 described above with reference to FIG. 6) performed on the semiconductor device 800 comprise the conductive vias 415A and do not comprise the diode structures 405. By coupling the capacitors 427 to the substrate 401 though the metallization layers M1 to Mt of the interconnect structure 501 and the conductive vias 415A, the discharge current is diverted from the capacitors 427 to the substrate 401. Accordingly, damage and shorting of the capacitors 427 is reduced or avoided.

Figure 23:
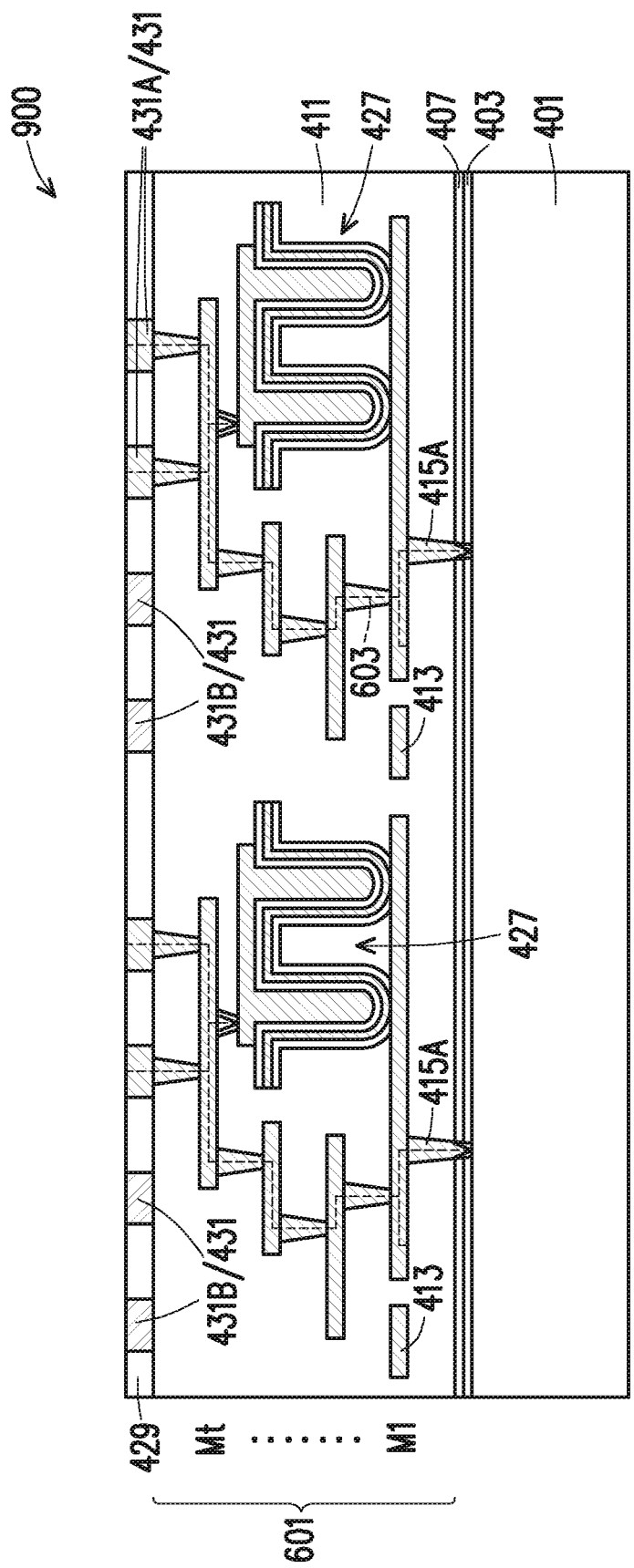
FIG. 23 illustrates a cross-sectional view of a semiconductor device in accordance with some embodiments.

FIG. 23 illustrates a cross-sectional view a semiconductor device 900 in accordance with some embodiments. The semiconductor device 900 is similar to the semiconductor device 600 (see FIG. 20), with similar features being labeled by similar numerical references, and descriptions of the similar features are not repeated herein. The semiconductor device 900 may be formed using process steps similar to the process steps described above with reference to FIGS. 14-18, and the description is not repeated herein. In the illustrated embodiment, the formation of the diode structures 405 (see FIG. 20) is omitted. Accordingly, the discharge current paths 603 during a plasma process (such as, for example, the plasma process 233 described above with reference to FIG. 6) performed on the semiconductor device 900 comprise the conductive vias 415A and do not comprise the diode structures 405. By coupling the capacitors 427 to the substrate 401 though the metallization layers M1 to Mt of the interconnect structure 601 and the conductive vias 415A, the discharge current is diverted from the capacitors 427 to the substrate 401. Accordingly, damage and shorting of the capacitors 427 is reduced or avoided.

Figure 24:
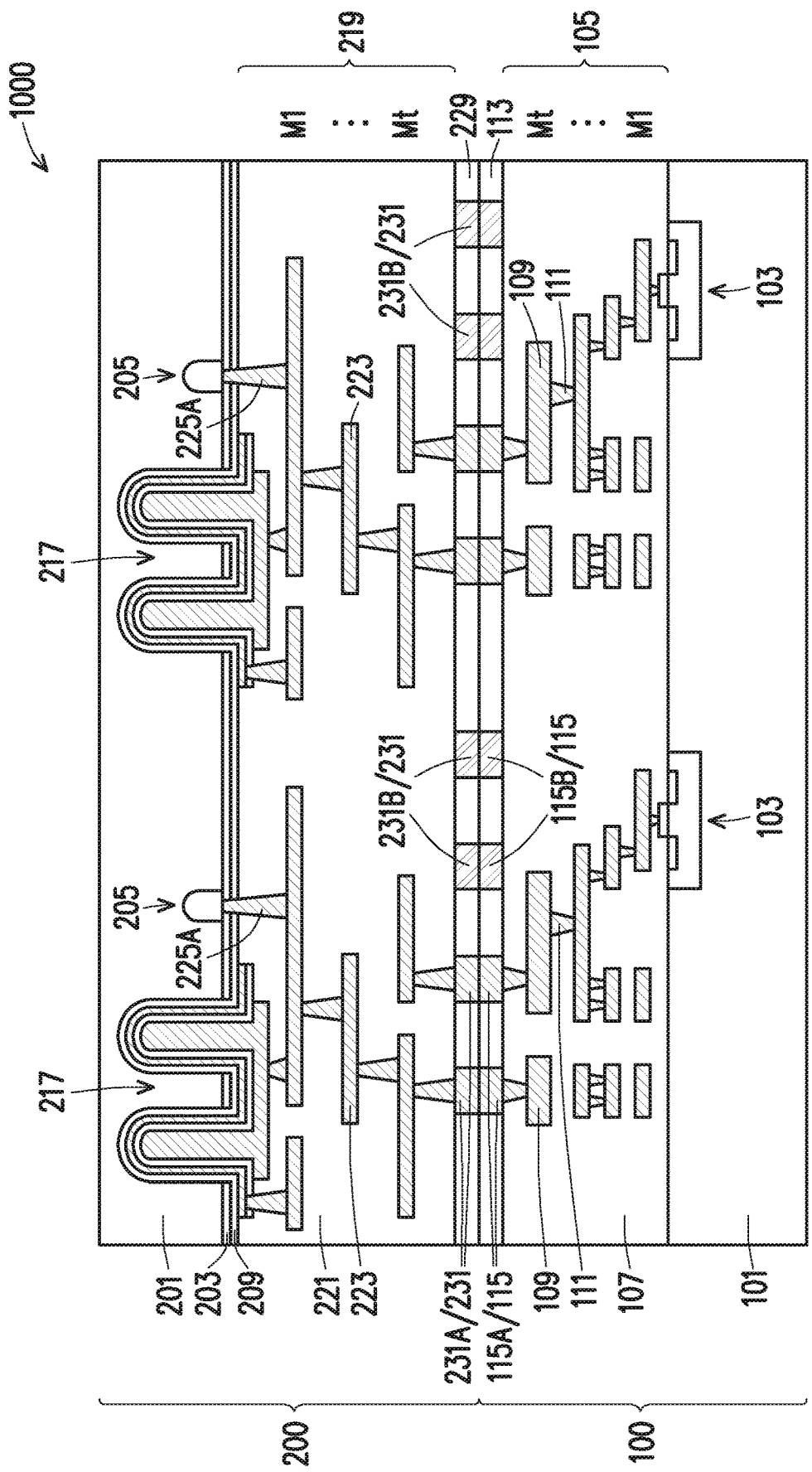
FIGS. 24-27 illustrate cross-sectional views of various intermediate stages of fabrication of a stacked semiconductor device in accordance with some embodiments.

FIGS. 24-27 illustrate cross-sectional views of various intermediate stages of fabrication of a stacked semiconductor device 1000 in accordance with some embodiments. Referring to FIG. 24, the semiconductor device 100 is bonded to the semiconductor device 200. In some embodiments, a first plasma process (such as the plasma process 117 described above with reference to FIG. 1) is performed on the semiconductor device 100 and a second plasma process (such as the plasma process 233 described above with reference to FIG. 6) is performed on the semiconductor device 200 before the bonding. In some embodiments, the semiconductor device 100 is bonded to the semiconductor device 200 using a hybrid bonding method. The hybrid bonding method includes direct bonding the pads 115 of the semiconductor device 100 to the respective pads 231 of the semiconductor device 200, and direct boding the insulating layer 113 of the semiconductor device 100 to the insulating layer 229 of the semiconductor device 200. In some embodiments, after the bonding process, a thinning process may be performed on the backside of the substrate 201 of the semiconductor device 200. The thinning process may comprise CMP, grinding, etching, a combination thereof, or the like.

Figure 25:
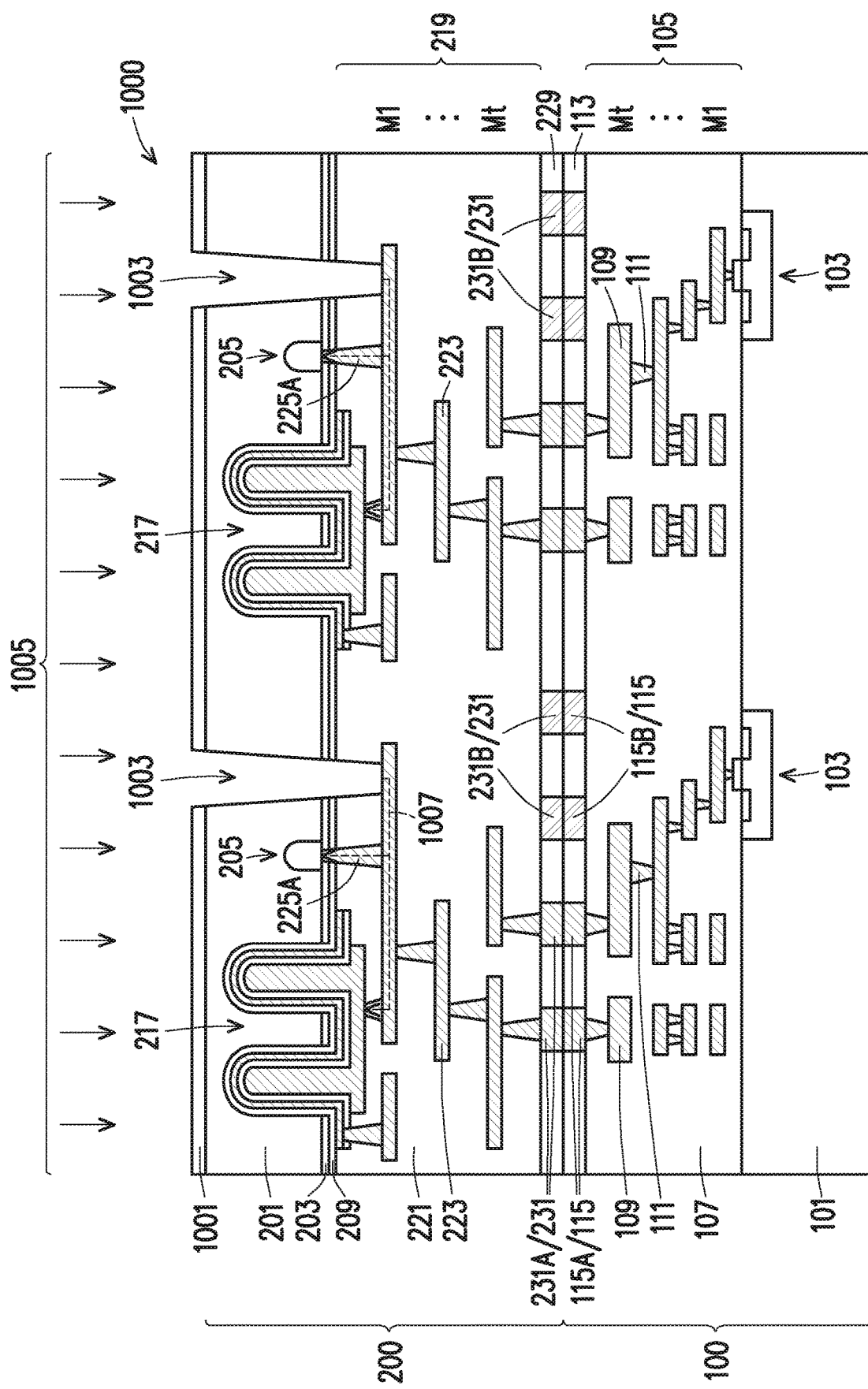

Referring to FIG. 25, an insulating layer 1001 is formed on the backside of the substrate 201 of the semiconductor device 200. In some embodiments, the insulating layer 1001 comprises an oxide (such as silicon oxide, or the like), a nitride (such as silicon nitride, or the like), a high-k material (such as AlO, HfO, TaO, ZrO, or the like), combinations thereof, multilayers thereof, or the like, and may be formed using ALD, CVD, a combination thereof, or the like. In some embodiments, the insulating layer 1001 has a thickness between about 10 Å and about 2000 Å.

After forming the insulating layer 1001, a patterning process in performed on the insulating layer 1001, the substrate 201, the insulating layers 203 and 209, and the dielectric layers 221 to form openings 1003. The openings 1003 expose portions of the metallization layer M1 of the interconnect structure 219 of the semiconductor device 200. The pattering process may comprise suitable photolithography and etch processes. The suitable etch process may comprise one or more dry etch processes, one or more wet etch processes, the like, or combinations thereof. The suitable etch process may be anisotropic. In some embodiments, the suitable etch process is a dry etch process, such as a plasma etch process 1005. The plasma etch process 1005 may be performed using a plasma generated from a process gas comprising $N_2$, $O_2$, $N_2H_2$, Ar, He, a mixture thereof, or the like.

During the normal operation of the stacked semiconductor device 1000, normal-operation voltages are applied across the stacked semiconductor device 1000. In some embodiments, the conductive vias 225A are formed to have high resistances, such that negligible or no current is conducted through the conductive vias 225A during the normal operation. In some embodiments, the diode structures 205 are configured to operate in reverse bias configurations and to have a reverse breakdown voltage less than normal-operation voltages (or to have the absolute value of the reverse breakdown voltage greater than the absolute values of the normal-operation voltages). Consequently, during the normal operation, negligible current flows though the diode structures 205. Accordingly, the conductive vias 225A and the diode structures 205 do not substantially affect the normal operation of the stacked semiconductor device 1000.

In some embodiments, the plasma etch process 1005 causes charge accumulation on an upper side of the stacked semiconductor device 1000. Due to the charge accumulation, high voltages greater than the normal-operation voltages are applied across the stacked semiconductor device 1000, which may cause an electrical discharge through the stacked semiconductor device 1000 and may damage devices (such as, for example, capacitors 217 or devices 103) of the stacked semiconductor device 1000. Due to the high voltage, significant discharge currents may flow into the diode structures 205 through the conductive vias 225A. In some embodiments, the diode structures 205 are configured to have the reverse breakdown voltage greater than the high voltages (or to have the absolute value of the reverse breakdown voltage less than the absolute values of the high voltages). Consequently, the high voltages cause break down or shorting of the diode structures 205 and large discharge currents flow into the substrate 201 though the diode structures 205. Dashed lines 1007 illustrate discharge current paths through the semiconductor device 200 during the plasma etch process 1005. By coupling the capacitors 217 to the substrate 201 through the metallization layer M1 of the interconnect structure 219, the conductive vias 225A, and respective diode structures 205, the discharge current is diverted from the capacitors 217 to the substrate 201. Accordingly, damage and shorting of the capacitors 217 is reduced or avoided.

Figure 26:
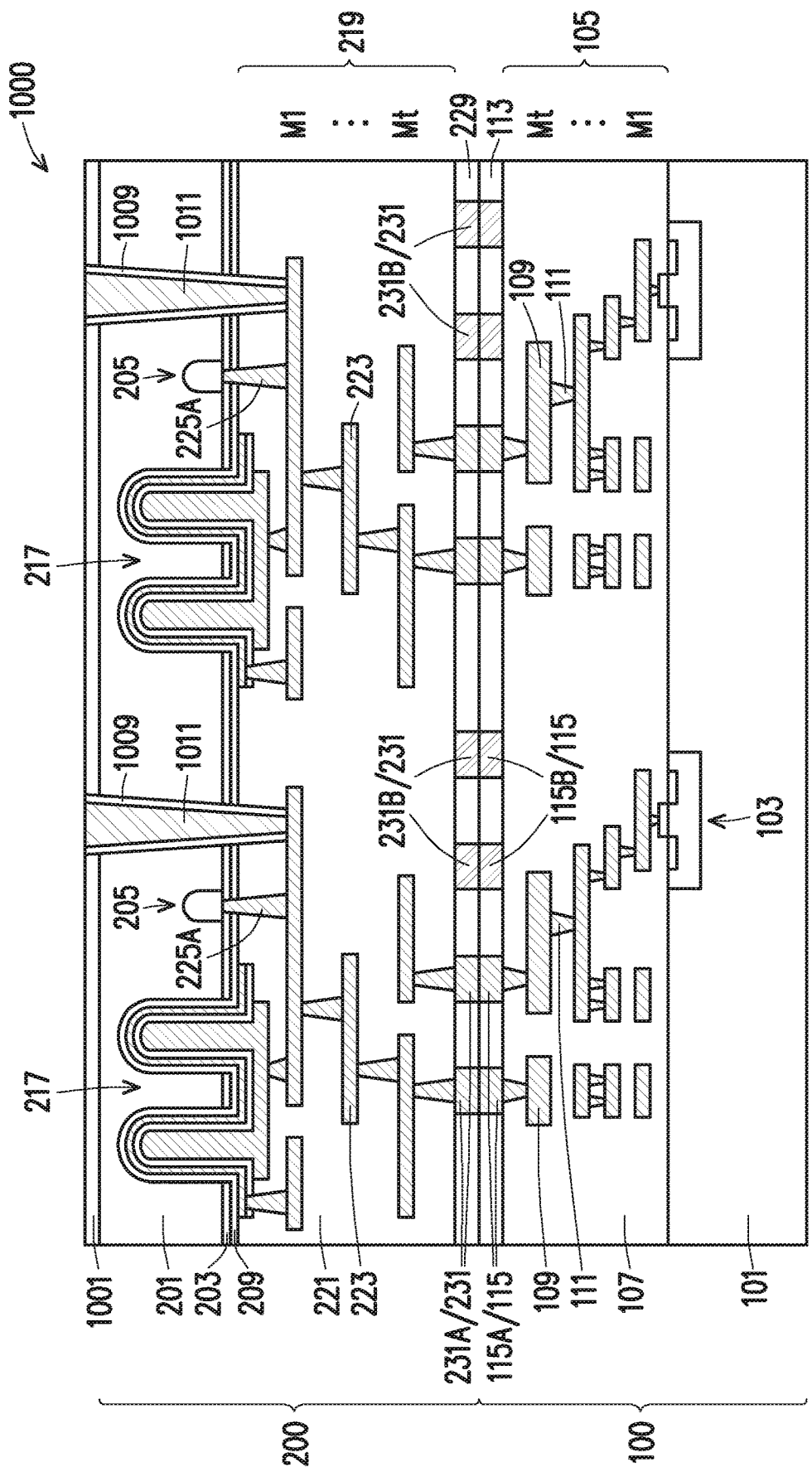

Referring to FIG. 26, a liner layer 1009 and a conductive via 1011 are formed in each of the openings 1003 (see FIG. 25). The conductive vias 1011 may also be referred to as through substrate vias (TSVs). In some embodiments, the liner layers 1009 are formed by blanket depositing an insulating material over the insulating layer 1001 and in the openings 1003 (see FIG. 25) and patterning the insulating material to remove horizontal portions of the insulating material. The insulating material may comprise silicon oxide, silicon nitride, silicon oxynitride, silicon carbide, the like, or combinations thereof, and may be formed using ALD, CVD, the like, or a combination thereof. In some embodiments, the liner layers 1009 have a thickness between about 30 Å and about 3000 Å.

After forming the liner layers 1009 in the openings 1003 (see FIG. 25), the conductive vias 1011 are formed in the openings 1003. In some embodiments, the conductive vias 1011 are formed by filling the openings 1003 with a conductive material and planarizing the conductive material to remove excess conductive material overfilling the openings 1003. In some embodiments, the conductive material of the conductive vias 1011 comprises tungsten, cobalt, nickel, copper, silver, gold, aluminum, the like, or combinations thereof. The planarization process may comprise CMP, grinding, etching, a combination thereof, or the like. In some embodiments, a top surface of the insulating layer 1001 and top surfaces of the conductive vias 1011 are substantially level or substantially coplanar within process variations of the planarization process.

Figure 27:
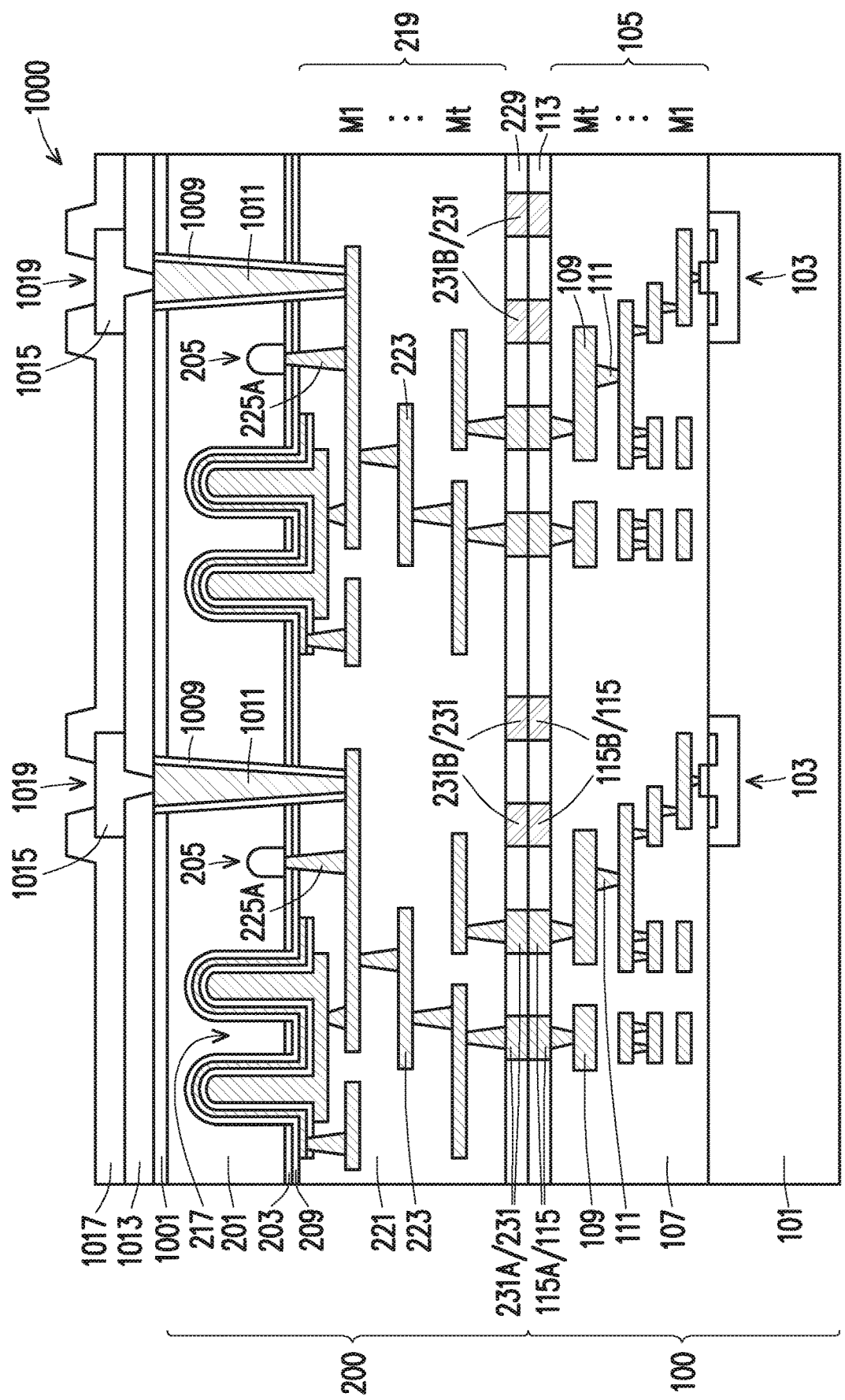

Referring to FIG. 27, insulating layers 1013 and 1017, and pads 1015 are formed over the insulating layer 1001 and the conductive vias 1011. The insulating layers 1013 and 1017 may also be referred to as passivation layers. In some embodiments, the insulating layers 1013 and 1017 may be formed using similar materials and method as the insulating layer 113 described above with reference to FIG. 1, and the description is not repeated herein. In some embodiments, the insulating layer 1013 and the insulating layer 1017 comprise a same material. In other embodiments, the insulating layer 1013 and the insulating layer 1017 comprise different materials. In some embodiments, the pads 1015 may be formed using similar materials and methods as the pads 115 described above with reference to FIG. 1, and the description is not repeated herein.

In some embodiments, process steps for forming the insulating layers 1013 and 1017, and the pads 1015 include forming the insulating layer 1013 over the insulating layer 1001 and the conductive vias 1011, forming openings in the insulating layer 1013 to expose respective conductive vias 1011, depositing a conductive material of the pads 1015 in the openings and over the insulating layer 1013, pattering the conductive material to form the pads 1015, and forming the insulating layer 1017 over the insulating layer 1013 and the pads 1015. In some embodiments, the insulating layer 1017 is patterned to form openings 2019 in the insulating layer 1017. The openings 2019 expose respective pads 1015. The patterning process for forming the openings 2019 may comprise suitable photolithography and etch processes. The suitable etch process may comprise one or more dry etch processes, one or more wet etch processes, the like, or combinations thereof. The suitable etch process may be anisotropic. In some embodiments when the stacked semiconductor device 1000 is a wafer-level stacked structure, the stacked semiconductor device 1000 is singulated into a plurality of die-level stacked structures.

Figure 28:
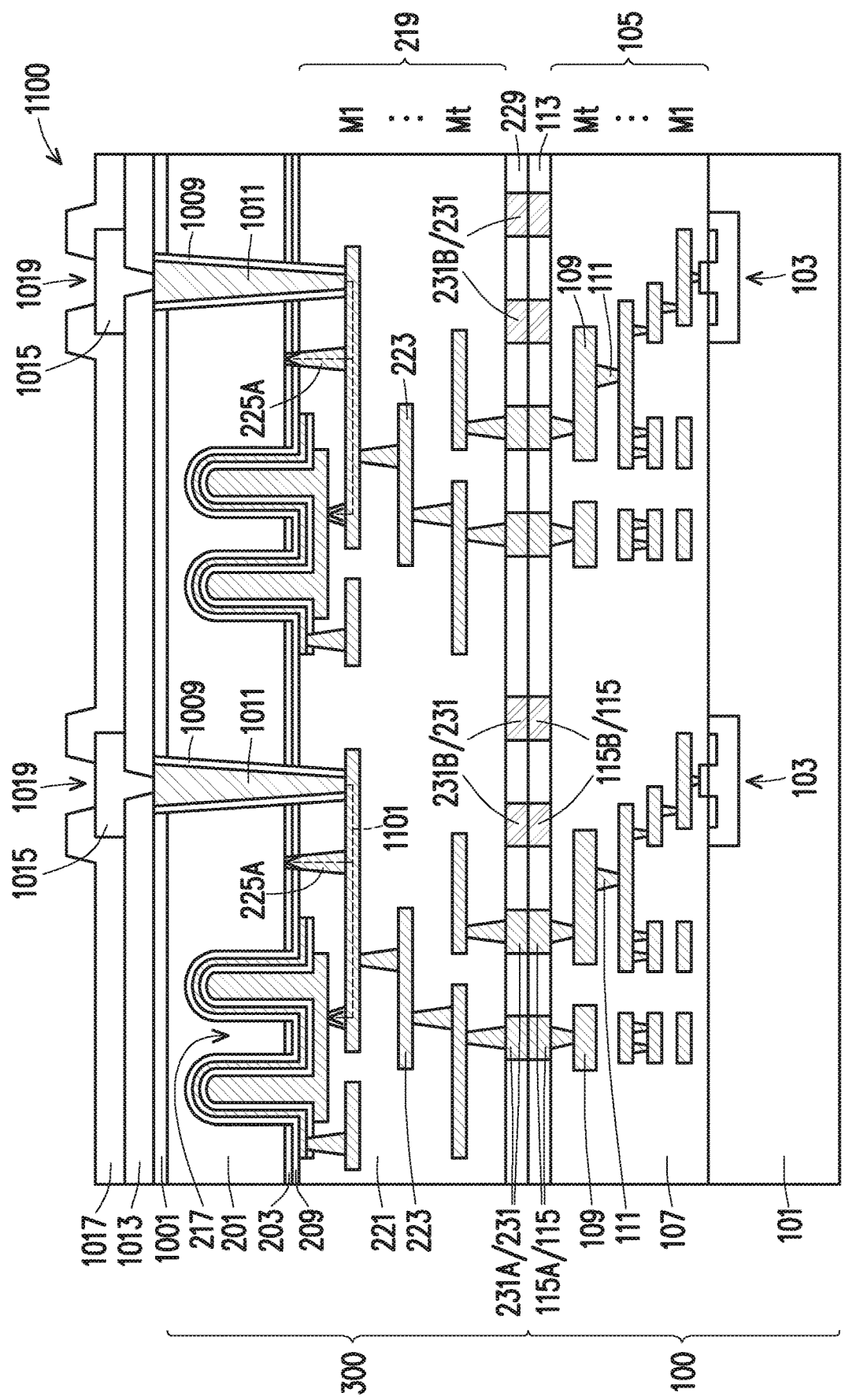
FIG. 28 illustrates a cross-sectional view of a stacked semiconductor device in accordance with some embodiments.

FIG. 28 illustrates a cross-sectional view a stacked semiconductor device 1100 in accordance with some embodiments. In some embodiments, the stacked semiconductor device 1100 is formed by bonding the semiconductor device 100 to the semiconductor device 300. In some embodiments, a first plasma process (such as the plasma process 117 described above with reference to FIG. 1) is performed on the semiconductor device 100 and a second plasma process (such as the plasma process 233 described above with reference to FIG. 6) is performed on the semiconductor device 300 before the bonding. In some embodiments, the semiconductor device 100 is bonded to the semiconductor device 300 using a hybrid bonding method. The hybrid bonding method includes direct bonding the pads 115 of the semiconductor device 100 to the respective pads 231 of the semiconductor device 300, and direct boding the insulating layer 113 of the semiconductor device 100 to the insulating layer 229 of the semiconductor device 300. In some embodiments, after the bonding process, a thinning process may be performed on the backside of the substrate 201 of the semiconductor device 300. The thinning process may comprise CMP, grinding, etching, a combination thereof, or the like.

After the bonding process is completed, an insulating layer 1001, the liner layers 1009, and the conductive vias 1011 are formed on the backside of the substrate 201 as described above with reference to FIGS. 25 and 26, and the description is not repeated herein. In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1100. Due to the charge accumulation, high voltages greater than the normal-operation voltages are applied across the stacked semiconductor device 1100, which may cause an electrical discharge through the stacked semiconductor device 1100 and may damage devices (such as, for example, capacitors 217 or devices 103) of the semiconductor device 1100. Dashed lines 1101 illustrate discharge current paths through the stacked semiconductor device 1100 during the plasma etch process. By coupling the capacitors 217 to the substrate 201 through the metallization layer M1 of the interconnect structure 219 and the conductive vias 225A, the discharge current is diverted from the capacitors 217 to the substrate 201. Accordingly, damage and shorting of the capacitors 217 is reduced or avoided.

Subsequently, insulating layers 1013 and 1017, and pads 1015 are formed over the insulating layer 1001 and the conductive vias 1011 as described above with reference to FIG. 27, and the description is not repeated herein. In some embodiments when the stacked semiconductor device 1100 is a wafer-level stacked structure, the stacked semiconductor device 1100 is singulated into a plurality of die-level stacked structures.

Figure 29:
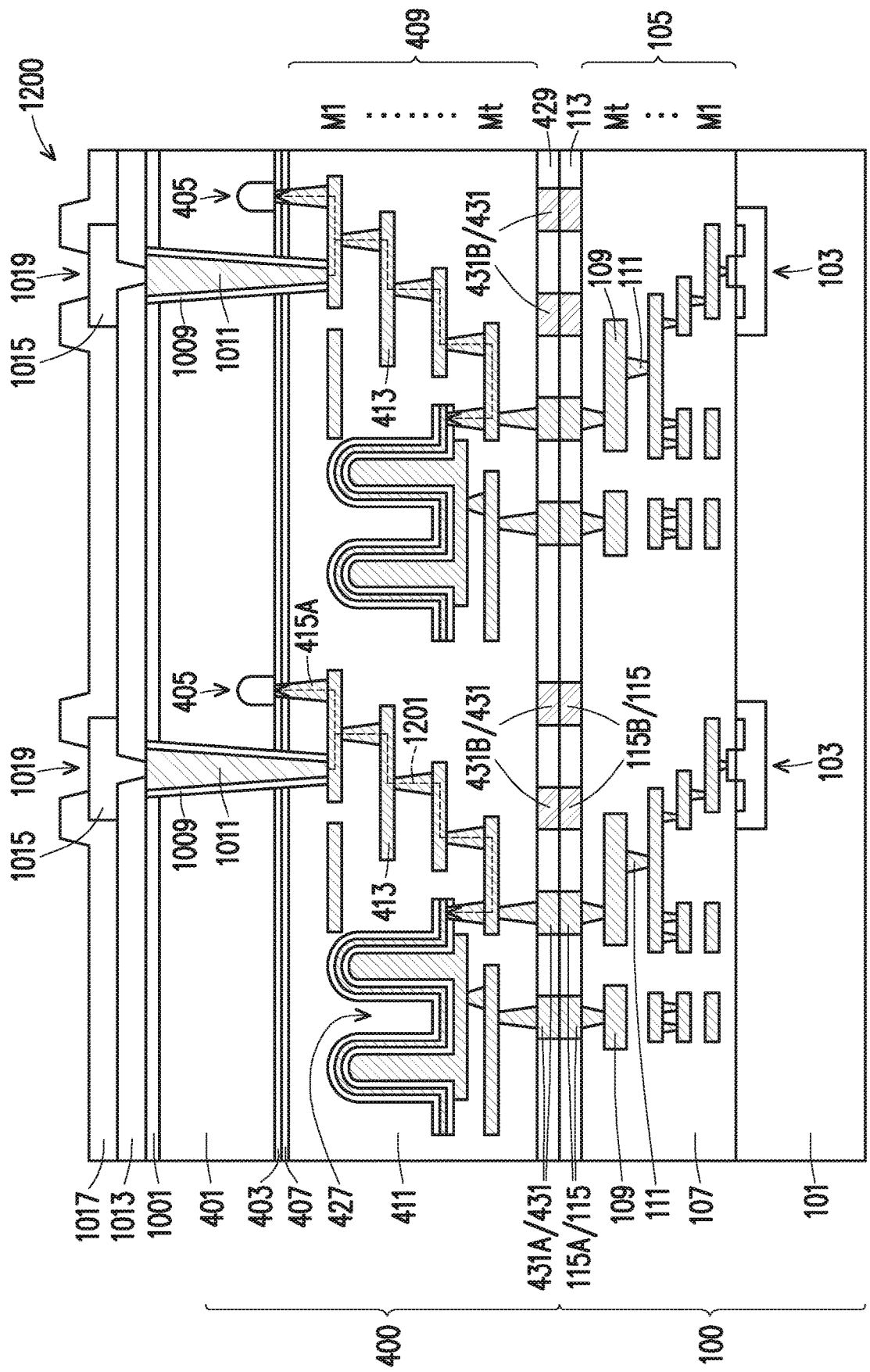
FIG. 29 illustrates a cross-sectional view of a stacked semiconductor device in accordance with some embodiments.

FIG. 29 illustrates a cross-sectional view a stacked semiconductor device 1200 in accordance with some embodiments. In some embodiments, the stacked semiconductor device 1200 is formed by bonding the semiconductor device 100 to the semiconductor device 400. In some embodiments, a first plasma process (such as the plasma process 117 described above with reference to FIG. 1) is performed on the semiconductor device 100 and a second plasma process (such as the plasma process 233 described above with reference to FIG. 18) is performed on the semiconductor device 400 before the bonding. In some embodiments, the semiconductor device 100 is bonded to the semiconductor device 400 using a hybrid bonding method. The hybrid bonding method includes direct bonding the pads 115 of the semiconductor device 100 to the respective pads 431 of the semiconductor device 400, and direct boding the insulating layer 113 of the semiconductor device 100 to the insulating layer 429 of the semiconductor device 400. In some embodiments, after the bonding process, a thinning process may be performed on the backside of the substrate 401 of the semiconductor device 400. The thinning process may comprise CMP, grinding, etching, a combination thereof, or the like.

After the bonding process is completed, an insulating layer 1001, the liner layers 1009, and the conductive vias 1011 are formed on the backside of the substrate 401 as described above with reference to FIGS. 25 and 26, and the description is not repeated herein. In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1200. Due to the charge accumulation, high voltages greater than the normal-operation voltages are applied across the stacked semiconductor device 1200, which may cause an electrical discharge through the stacked semiconductor device 1200 and may damage devices (such as, for example, capacitors 427 or device 103) of the stacked semiconductor device 1200. Dashed lines 1201 illustrate discharge current paths through the stacked semiconductor device 1200 during the plasma etch process. By coupling the capacitors 427 to the substrate 401 through the metallization layers M1 to Mt of the interconnect structure 409, the conductive vias 415A, and the respective diode structures 405, the discharge current is diverted from the capacitors 427 to the substrate 401. Accordingly, damage and shorting of the capacitors 427 is reduced or avoided.

Subsequently, insulating layers 1013 and 1017, and pads 1015 are formed over the insulating layer 1001 and the conductive vias 1011 as described above with reference to FIG. 27, and the description is not repeated herein. In some embodiments when the stacked semiconductor device 1200 is a wafer-level stacked structure, the stacked semiconductor device 1200 is singulated into a plurality of die-level stacked structures.

Figure 30:
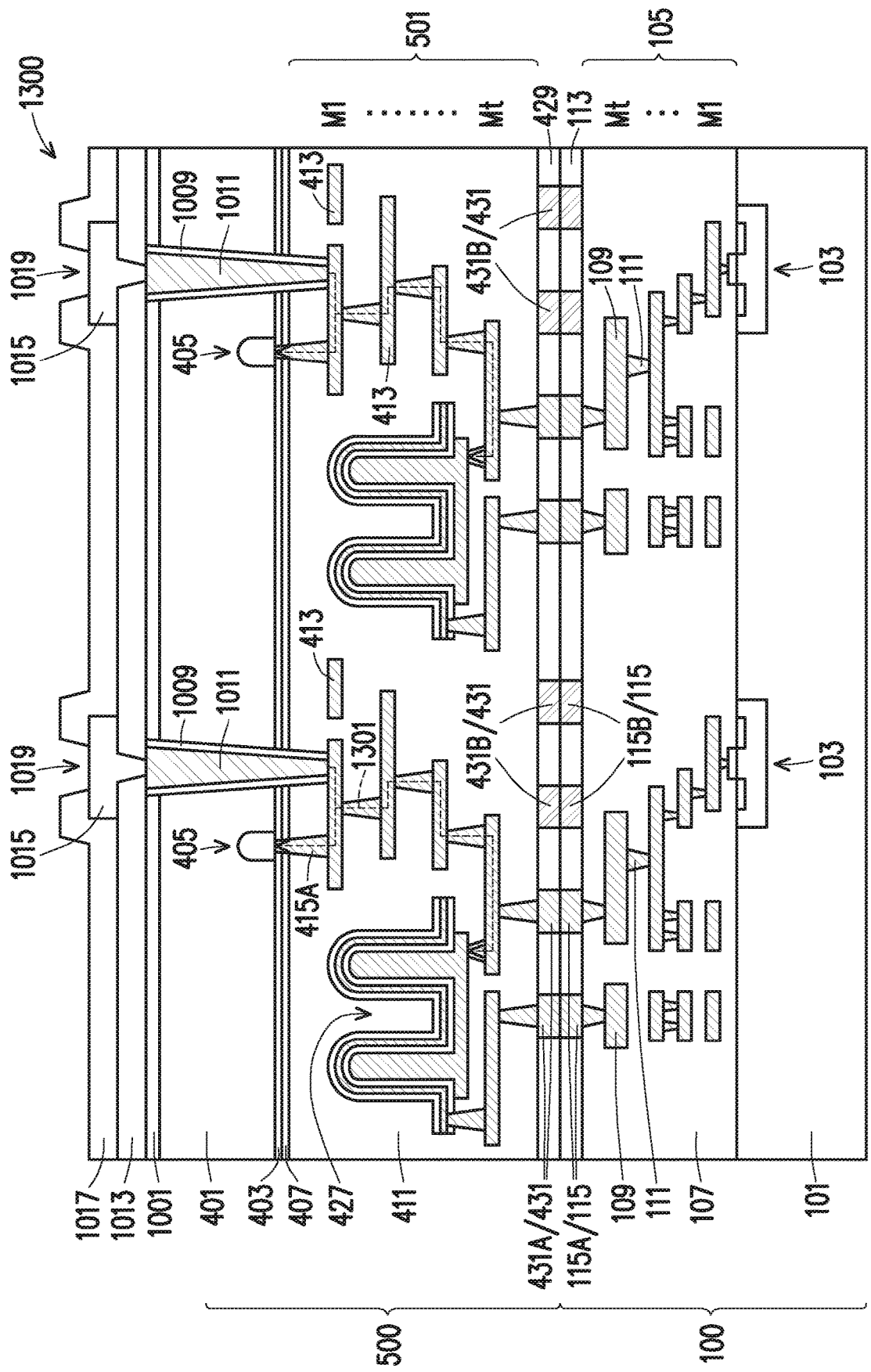
FIG. 30 illustrates a cross-sectional view of a stacked semiconductor device in accordance with some embodiments.

FIG. 30 illustrates a cross-sectional view a stacked semiconductor device 1300 in accordance with some embodiments. In some embodiments, the stacked semiconductor device 1300 is formed by bonding the semiconductor device 100 to the semiconductor device 500. In some embodiments, a first plasma process (such as the plasma process 117 described above with reference to FIG. 1) is performed on the semiconductor device 100 and a second plasma process (such as the plasma process 233 described above with reference to FIG. 18) is performed on the semiconductor device 500 before the bonding. In some embodiments, the semiconductor device 100 is bonded to the semiconductor device 500 using a hybrid bonding method. The hybrid bonding method includes direct bonding the pads 115 of the semiconductor device 100 to the respective pads 431 of the semiconductor device 500, and direct boding the insulating layer 113 of the semiconductor device 100 to the insulating layer 429 of the semiconductor device 500. In some embodiments, after the bonding process, a thinning process may be performed on the backside of the substrate 401 of the semiconductor device 500. The thinning process may comprise CMP, grinding, etching, a combination thereof, or the like.

After the bonding process is completed, an insulating layer 1001, the liner layers 1009, and the conductive vias 1011 are formed on the backside of the substrate 401 as described above with reference to FIGS. 25 and 26, and the description is not repeated herein. In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1300. Due to the charge accumulation, high voltages greater than the normal-operation voltages are applied across the stacked semiconductor device 1300, which may cause an electrical discharge through the stacked semiconductor device 1300 and may damage devices (such as, for example, capacitors 427 or devices 103) of the stacked semiconductor device 1300. Dashed lines 1301 illustrate discharge current paths through the stacked semiconductor device 1300 during the plasma etch process. By coupling the capacitors 427 to the substrate 401 through the metallization layers M1 to Mt of the interconnect structure 501, the conductive vias 415A, and the respective diode structures 405, the discharge current is diverted from the capacitors 427 to the substrate 401. Accordingly, damage and shorting of the capacitors 427 is reduced or avoided.

Subsequently, insulating layers 1013 and 1017, and pads 1015 are formed over the insulating layer 1001 and the conductive vias 1011 as described above with reference to FIG. 27, and the description is not repeated herein. In some embodiments when the stacked semiconductor device 1300 is a wafer-level stacked structure, the stacked semiconductor device 1300 is singulated into a plurality of die-level stacked structures.

Figure 31:
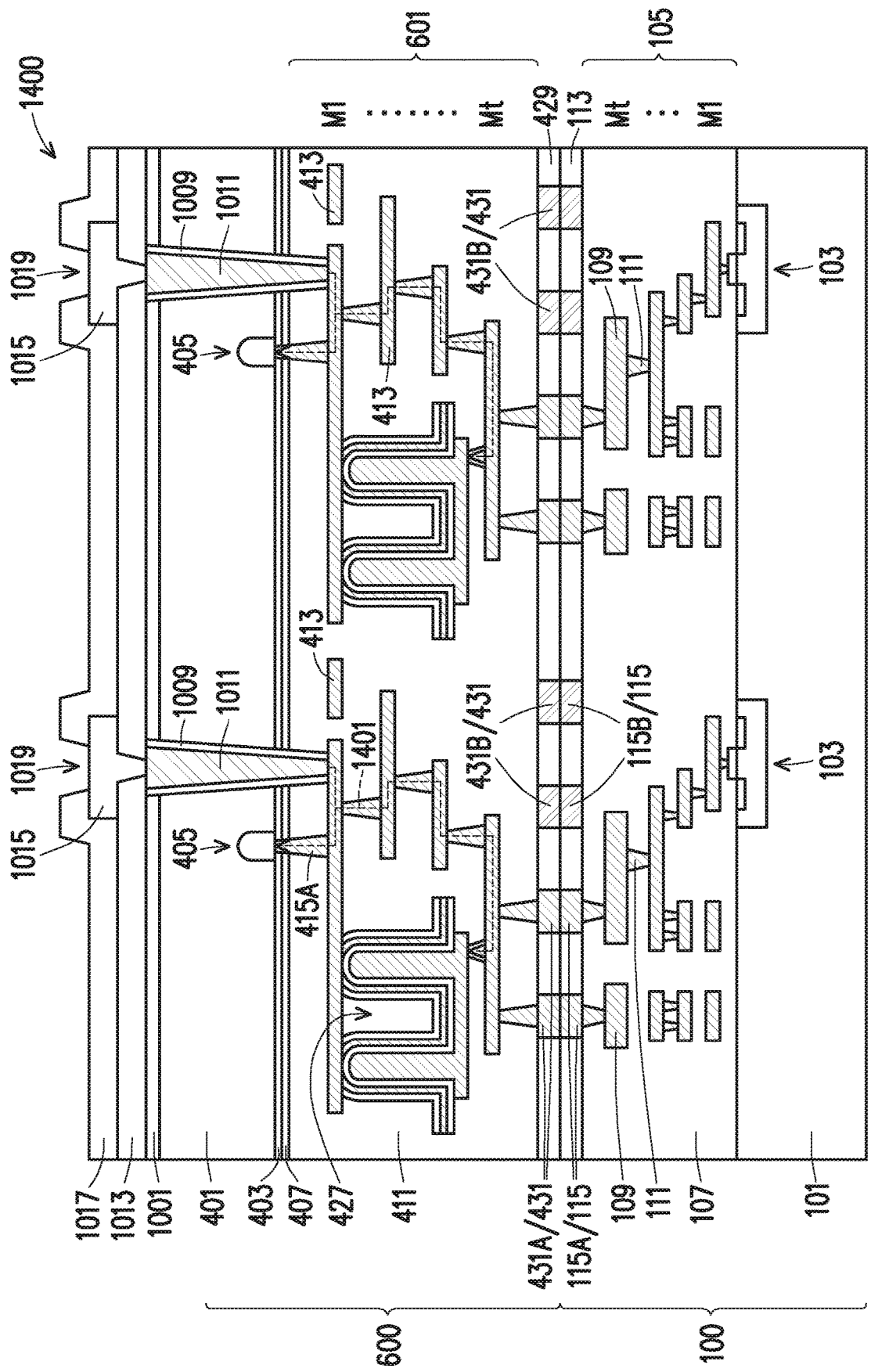
FIG. 31 illustrates a cross-sectional view of a stacked semiconductor device in accordance with some embodiments.

FIG. 31 illustrates a cross-sectional view a stacked semiconductor device 1400 in accordance with some embodiments. In some embodiments, the stacked semiconductor device 1400 is formed by bonding the semiconductor device 100 to the semiconductor device 600. In some embodiments, a first plasma process (such as the plasma process 117 described above with reference to FIG. 1) is performed on the semiconductor device 100 and a second plasma process (such as the plasma process 233 described above with reference to FIG. 18) is performed on the semiconductor device 600 before the bonding. In some embodiments, the semiconductor device 100 is bonded to the semiconductor device 600 using a hybrid bonding method. The hybrid bonding method includes direct bonding the pads 115 of the semiconductor device 100 to the respective pads 431 of the semiconductor device 600, and direct boding the insulating layer 113 of the semiconductor device 100 to the insulating layer 429 of the semiconductor device 600. In some embodiments, after the bonding process, a thinning process may be performed on the backside of the substrate 401 of the semiconductor device 600. The thinning process may comprise CMP, grinding, etching, a combination thereof, or the like.

After the bonding process is completed, an insulating layer 1001, the liner layers 1009, and the conductive vias 1011 are formed on the backside of the substrate 401 as described above with reference to FIGS. 25 and 26, and the description is not repeated herein. In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1400. Due to the charge accumulation, high voltages greater than the normal-operation voltages are applied across the stacked semiconductor device 1400, which may cause an electrical discharge through the stacked semiconductor device 1400 and may damage devices (such as, for example, capacitors 427 or devices 103) of the stacked semiconductor device 1400. Dashed lines 1401 illustrate discharge current paths through the stacked semiconductor device 1400 during the plasma etch process. By coupling the capacitors 427 to the substrate 401 through the metallization layers M1 to Mt of the interconnect structure 601, the conductive vias 415A, and the respective diode structures 405, the discharge current is diverted from the capacitors 427 to the substrate 401. Accordingly, damage and shorting of the capacitors 427 is reduced or avoided.

Subsequently, insulating layers 1013 and 1017, and pads 1015 are formed over the insulating layer 1001 and the conductive vias 1011 as described above with reference to FIG. 27, and the description is not repeated herein. In some embodiments when the stacked semiconductor device 1400 is a wafer-level stacked structure, the stacked semiconductor device 1400 is singulated into a plurality of die-level stacked structures.

Figure 32:
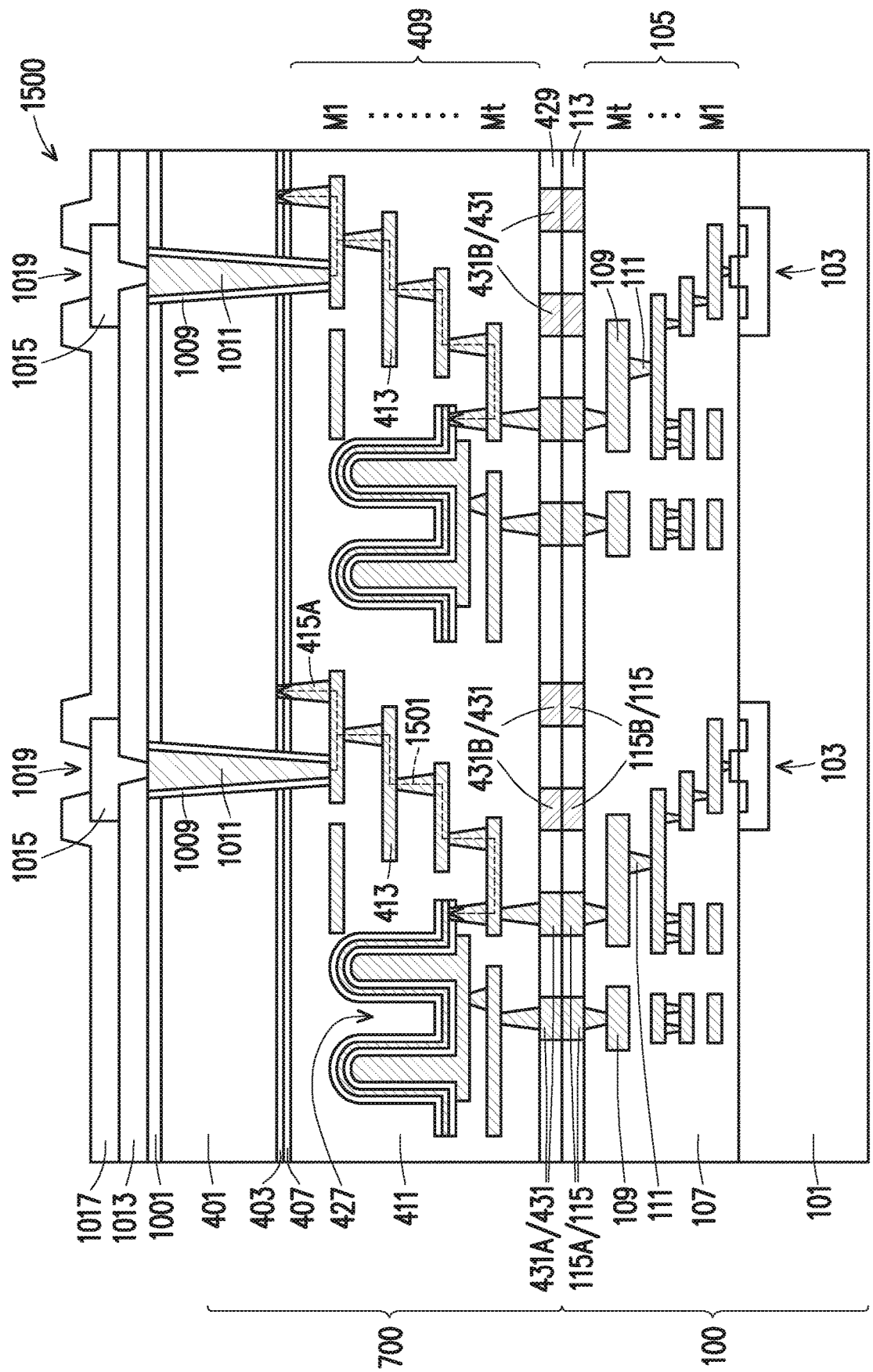
FIG. 32 illustrates a cross-sectional view of a stacked semiconductor device in accordance with some embodiments.

FIG. 32 illustrates a cross-sectional view a stacked semiconductor device 1500 in accordance with some embodiments. In some embodiments, the stacked semiconductor device 1500 is formed by bonding the semiconductor device 100 to the semiconductor device 700. In some embodiments, a first plasma process (such as the plasma process 117 described above with reference to FIG. 1) is performed on the semiconductor device 100 and a second plasma process (such as the plasma process 233 described above with reference to FIG. 18) is performed on the semiconductor device 700 before the bonding. In some embodiments, the semiconductor device 100 is bonded to the semiconductor device 700 using a hybrid bonding method. The hybrid bonding method includes direct bonding the pads 115 of the semiconductor device 100 to the respective pads 431 of the semiconductor device 700, and direct boding the insulating layer 113 of the semiconductor device 100 to the insulating layer 429 of the semiconductor device 700. In some embodiments, after the bonding process, a thinning process may be performed on the backside of the substrate 401 of the semiconductor device 700. The thinning process may comprise CMP, grinding, etching, a combination thereof, or the like.

After the bonding process is completed, an insulating layer 1001, the liner layers 1009, and the conductive vias 1011 are formed on the backside of the substrate 401 as described above with reference to FIGS. 25 and 26, and the description is not repeated herein. In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1500. Due to the charge accumulation, high voltages greater than the normal-operation voltages are applied across the stacked semiconductor device 1500, which may cause an electrical discharge through the stacked semiconductor device 1500 and may damage devices (such as, for example, capacitors 427 or devices 103) of the stacked semiconductor device 1500. Dashed lines 1501 illustrate discharge current paths through the stacked semiconductor device 1500 during the plasma etch process. By coupling the capacitors 427 to the substrate 401 through the metallization layers M1 to Mt of the interconnect structure 409 and the conductive vias 415A, the discharge current is diverted from the capacitors 427 to the substrate 401. Accordingly, damage and shorting of the capacitors 427 is reduced or avoided.

Subsequently, insulating layers 1013 and 1017, and pads 1015 are formed over the insulating layer 1001 and the conductive vias 1011 as described above with reference to FIG. 27, and the description is not repeated herein. In some embodiments when the stacked semiconductor device 1500 is a wafer-level stacked structure, the stacked semiconductor device 1500 is singulated into a plurality of die-level stacked structures.

Figure 33:
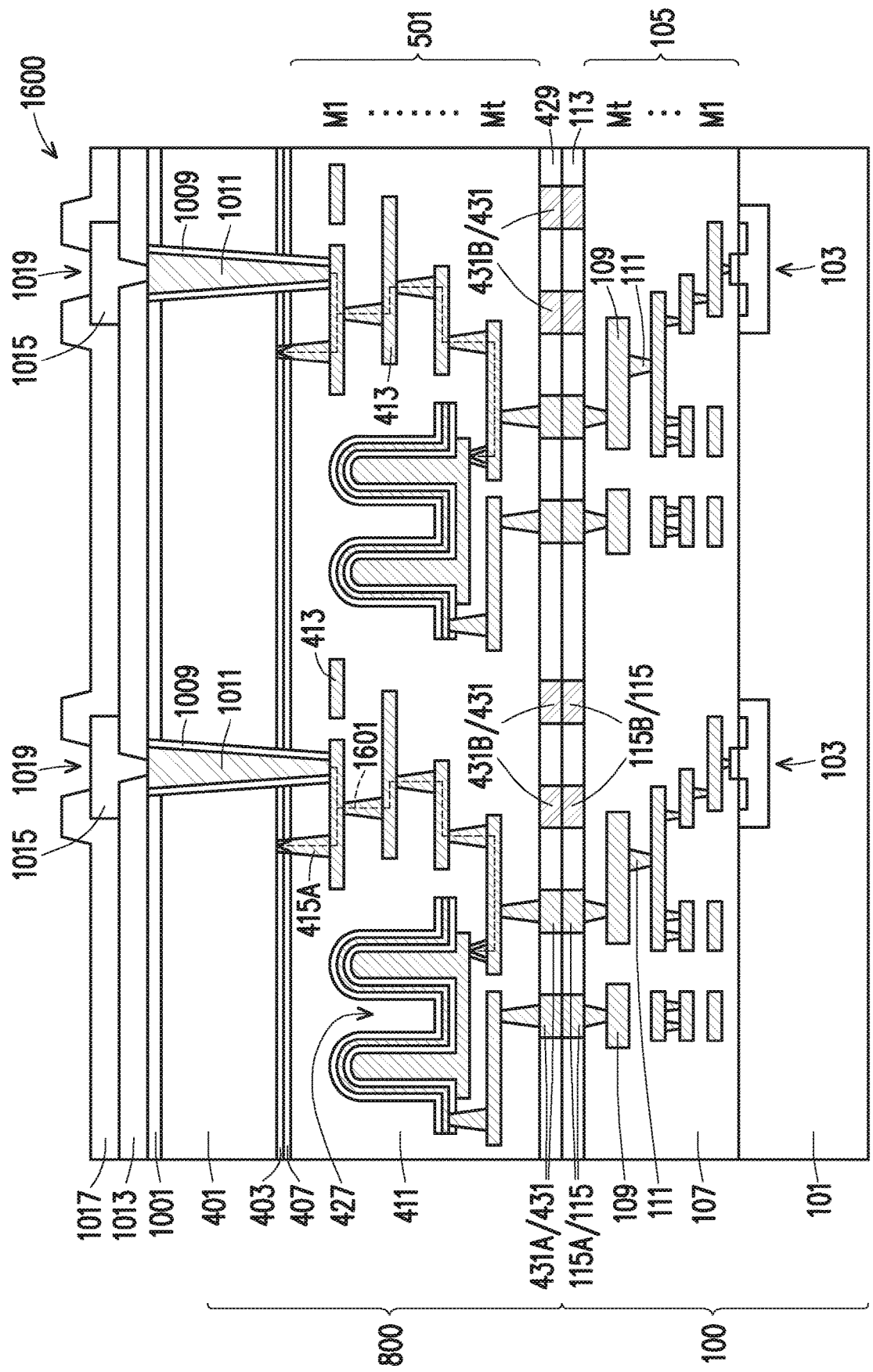
FIG. 33 illustrates a cross-sectional view of a stacked semiconductor device in accordance with some embodiments.

FIG. 33 illustrates a cross-sectional view a stacked semiconductor device 1600 in accordance with some embodiments. In some embodiments, the stacked semiconductor device 1600 is formed by bonding the semiconductor device 100 to the semiconductor device 800. In some embodiments, a first plasma process (such as the plasma process 117 described above with reference to FIG. 1) is performed on the semiconductor device 100 and a second plasma process (such as the plasma process 233 described above with reference to FIG. 18) is performed on the semiconductor device 800 before the bonding. In some embodiments, the semiconductor device 100 is bonded to the semiconductor device 800 using a hybrid bonding method. The hybrid bonding method includes direct bonding the pads 115 of the semiconductor device 100 to the respective pads 431 of the semiconductor device 800, and direct boding the insulating layer 113 of the semiconductor device 100 to the insulating layer 429 of the semiconductor device 800. In some embodiments, after the bonding process, a thinning process may be performed on the backside of the substrate 401 of the semiconductor device 800. The thinning process may comprise CMP, grinding, etching, a combination thereof, or the like.

After the bonding process is completed, an insulating layer 1001, the liner layers 1009, and the conductive vias 1011 are formed on the backside of the substrate 401 as described above with reference to FIGS. 25 and 26, and the description is not repeated herein. In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1600. Due to the charge accumulation, high voltages greater than the normal-operation voltages are applied across the stacked semiconductor device 1600, which may cause an electrical discharge through the stacked semiconductor device 1600 and may damage devices (such as, for example, capacitors 427 or device 103) of the stacked semiconductor device 1600. Dashed lines 1601 illustrate discharge current paths through the stacked semiconductor device 1600 during the plasma etch process. By coupling the capacitors 427 to the substrate 401 through the metallization layers M1 to Mt of the interconnect structure 501 and the conductive vias 415A, the discharge current is diverted from the capacitors 427 to the substrate 401. Accordingly, damage and shorting of the capacitors 427 is reduced or avoided.

Subsequently, insulating layers 1013 and 1017, and pads 1015 are formed over the insulating layer 1001 and the conductive vias 1011 as described above with reference to FIG. 27, and the description is not repeated herein. In some embodiments when the stacked semiconductor device 1600 is a wafer-level stacked structure, the stacked semiconductor device 1600 is singulated into a plurality of die-level stacked structures.

Figure 34:
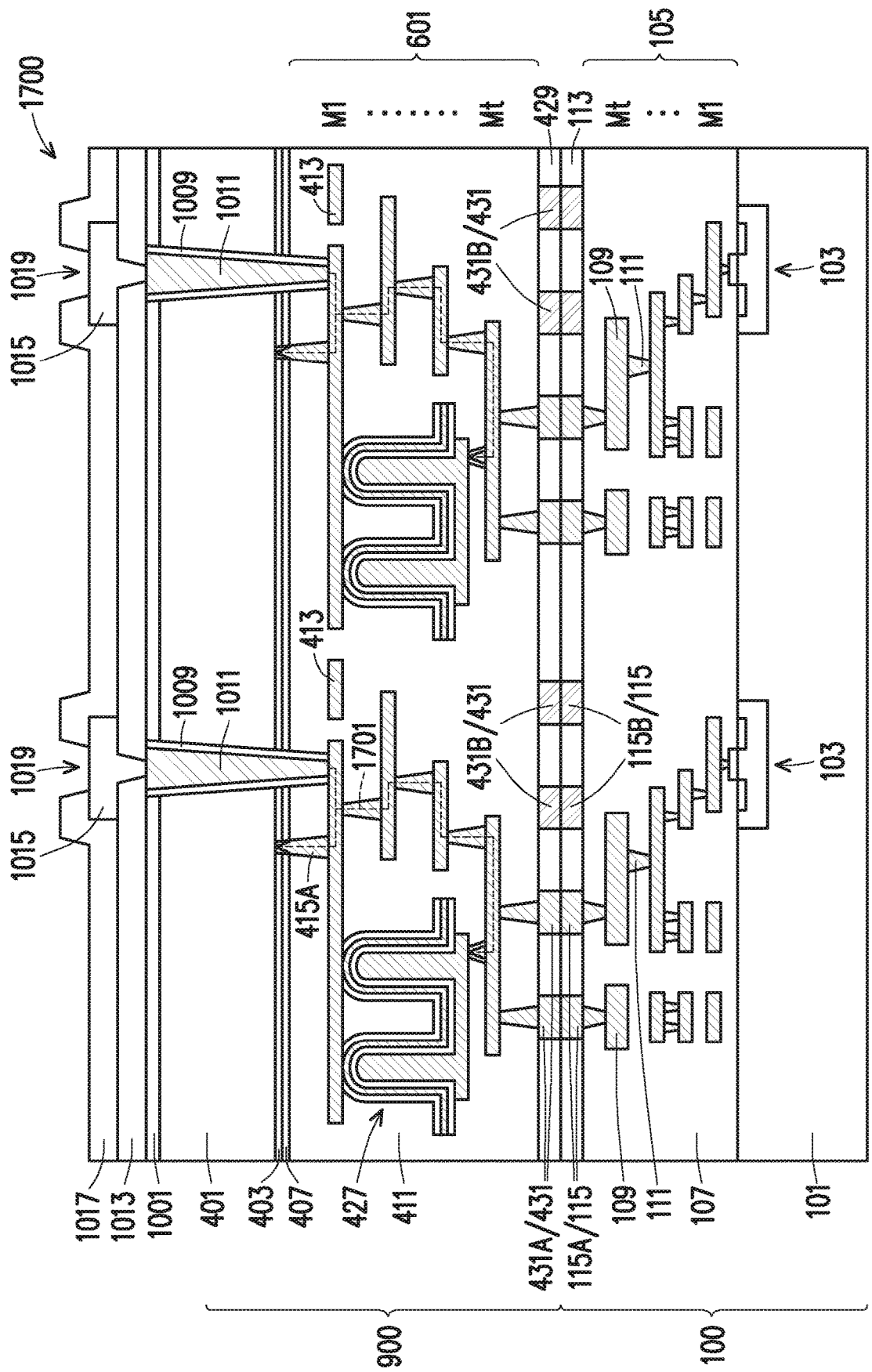
FIG. 34 illustrates a cross-sectional view of a stacked semiconductor device in accordance with some embodiments.

FIG. 34 illustrates a cross-sectional view a stacked semiconductor device 1700 in accordance with some embodiments. In some embodiments, the stacked semiconductor device 1700 is formed by bonding the semiconductor device 100 to the semiconductor device 900. In some embodiments, a first plasma process (such as the plasma process 117 described above with reference to FIG. 1) is performed on the semiconductor device 100 and a second plasma process (such as the plasma process 233 described above with reference to FIG. 18) is performed on the semiconductor device 900 before the bonding. In some embodiments, the semiconductor device 100 is bonded to the semiconductor device 900 using a hybrid bonding method. The hybrid bonding method includes direct bonding the pads 115 of the semiconductor device 100 to the respective pads 431 of the semiconductor device 900, and direct boding the insulating layer 113 of the semiconductor device 100 to the insulating layer 429 of the semiconductor device 900. In some embodiments, after the bonding process, a thinning process may be performed on the backside of the substrate 401 of the semiconductor device 900. The thinning process may comprise CMP, grinding, etching, a combination thereof, or the like.

After the bonding process is completed, an insulating layer 1001, the liner layers 1009, and the conductive vias 1011 are formed on the backside of the substrate 401 as described above with reference to FIGS. 25 and 26, and the description is not repeated herein. In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1700. Due to the charge accumulation, high voltages greater than the normal-operation voltages are applied across the stacked semiconductor device 1700, which may cause an electrical discharge through the stacked semiconductor device 1700 and may damage devices (such as, for example, capacitors 427 or devices 103) of the stacked semiconductor device 1700. Dashed lines 1701 illustrate discharge current paths through the stacked semiconductor device 1700 during the plasma etch process. By coupling the capacitors 427 to the substrate 401 through the metallization layers M1 to Mt of the interconnect structure 601 and the conductive vias 415A, the discharge current is diverted from the capacitors 427 to the substrate 401. Accordingly, damage and shorting of the capacitors 427 is reduced or avoided.

Subsequently, insulating layers 1013 and 1017, and pads 1015 are formed over the insulating layer 1001 and the conductive vias 1011 as described above with reference to FIG. 27, and the description is not repeated herein. In some embodiments when the stacked semiconductor device 1700 is a wafer-level stacked structure, the stacked semiconductor device 1700 is singulated into a plurality of die-level stacked structures.

Figure 35:
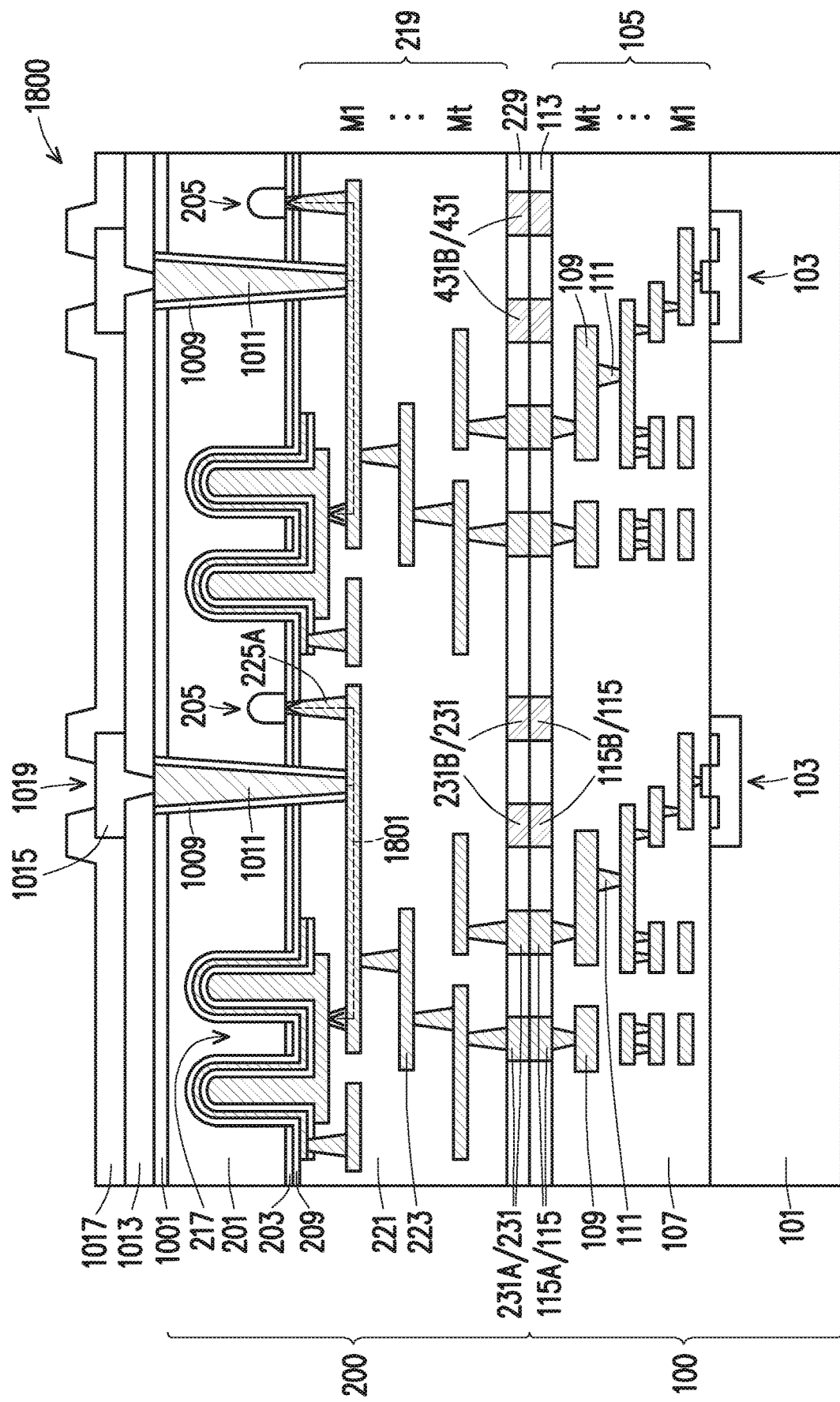
FIG. 35 illustrates a cross-sectional view of a stacked semiconductor device in accordance with some embodiments.

FIG. 35 illustrates a cross-sectional view a stacked semiconductor device 1800 in accordance with some embodiments. In some embodiments, the stacked semiconductor device 1800 is similar to the stacked semiconductor device 1000 (see FIG. 27), with similar features being labeled by similar numerical references, and descriptions of the similar features are not repeated herein. In some embodiments, the semiconductor device 1800 may be formed using process steps similar to the process steps described above with reference to FIGS. 24-27, and the description is not repeated herein. The stacked semiconductor device 1800 differs from the stacked semiconductor device 1000 by relative locations of the conductive vias 1011 with respect to the conductive vias 225A and the capacitors 217. In the stacked semiconductor device 1800, each of the conductive via 1011 is laterally interposed between a respective conductive via 225A and a respective capacitor 217.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1800. Due to the charge accumulation, high voltages greater than the normal-operation voltages are applied across the stacked semiconductor device 1800, which may cause an electrical discharge through the stacked semiconductor device 1800 and may damage devices (such as, for example, capacitors 217 or devices 103) of the stacked semiconductor device 1800. Dashed lines 1801 illustrate discharge current paths through the stacked semiconductor device 1800 during the plasma etch process. By coupling the capacitors 217 to the substrate 201 through the metallization layer M1 of the interconnect structure 219, the conductive vias 225A, and the respective diode structures 205, the discharge current is diverted from the capacitors 217 to the substrate 201. Accordingly, damage and shorting of the capacitors 217 is reduced or avoided.

Figure 36:
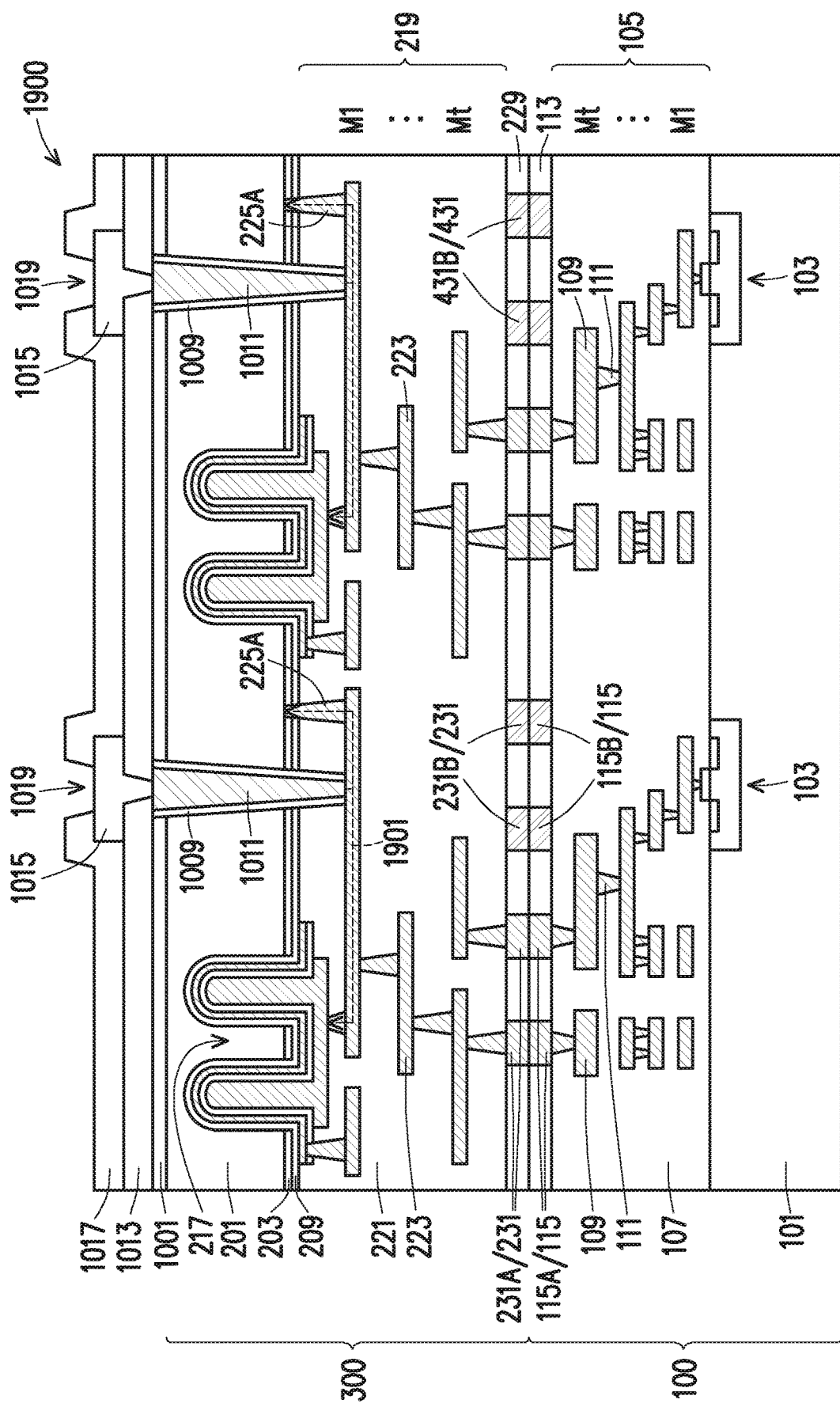
FIG. 36 illustrates a cross-sectional view of a stacked semiconductor device in accordance with some embodiments.

FIG. 36 illustrates a cross-sectional view a stacked semiconductor device 1900 in accordance with some embodiments. In some embodiments, the stacked semiconductor device 1900 is similar to the stacked semiconductor device 1100 (see FIG. 28), with similar features being labeled by similar numerical references, and descriptions of the similar features are not repeated herein. In some embodiments, the semiconductor device 1900 may be formed using process steps similar to the process steps described above with reference to FIG. 28, and the description is not repeated herein. The stacked semiconductor device 1900 differs from the stacked semiconductor device 1100 by relative locations of the conductive vias 1011 with respect to the conductive vias 225A and the capacitors 217. In the stacked semiconductor device 1900, each of the conductive via 1011 is laterally interposed between a respective conductive via 225A and a respective capacitor 217.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 1900. Due to the charge accumulation, high voltages greater than the normal-operation voltages are applied across the stacked semiconductor device 1900, which may cause an electrical discharge through the stacked semiconductor device 1900 and may damage devices (such as, for example, capacitors 217 or devices 103) of the stacked semiconductor device 1900. Dashed lines 1901 illustrate discharge current paths through the stacked semiconductor device 1900 during the plasma etch process. By coupling the capacitors 217 to the substrate 201 through the metallization layer M1 of the interconnect structure 219 and the conductive vias 225A, the discharge current is diverted from the capacitors 217 to the substrate 201. Accordingly, damage and shorting of the capacitors 217 is reduced or avoided.

Figure 37:
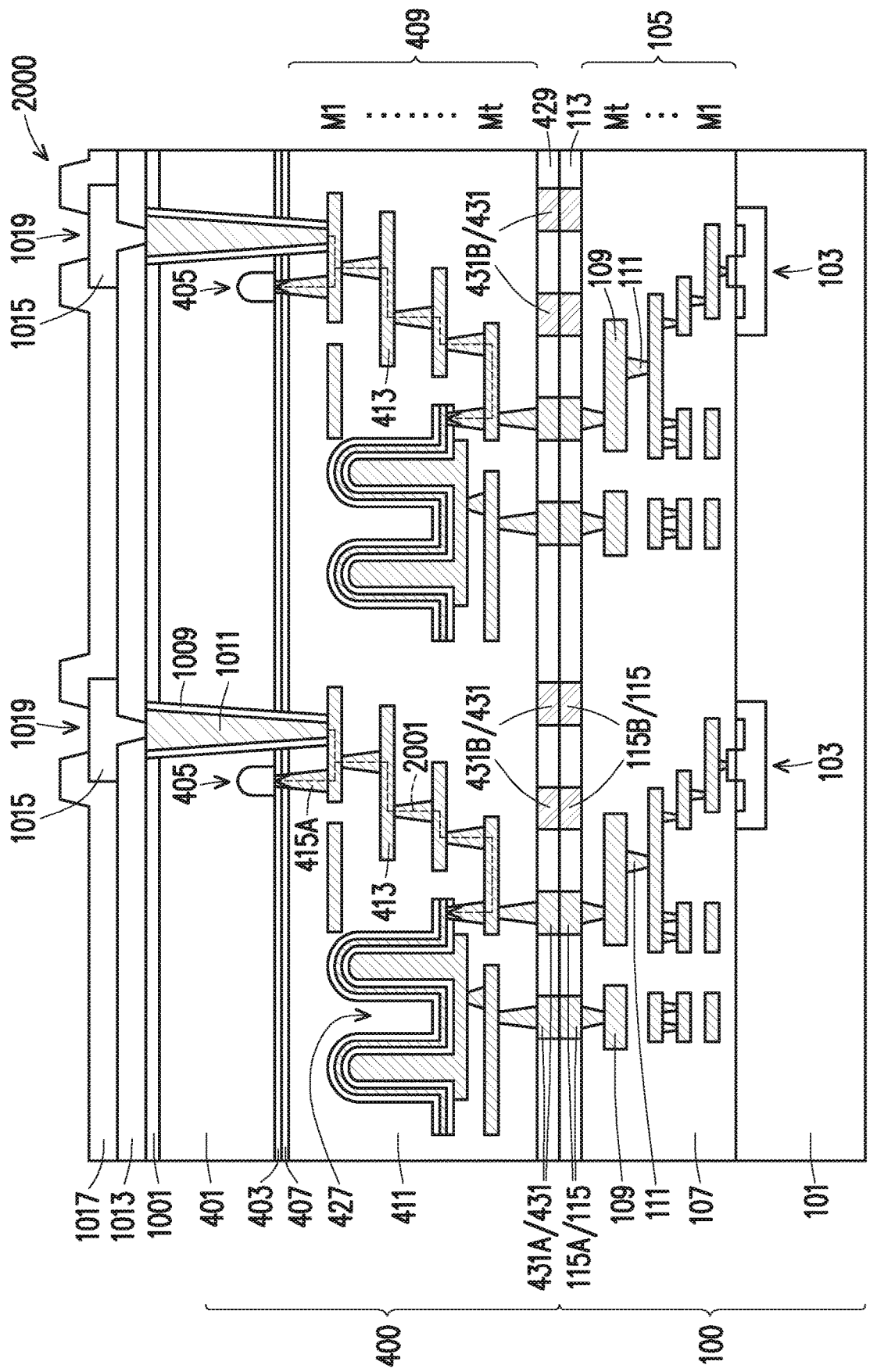
FIG. 37 illustrates a cross-sectional view of a stacked semiconductor device in accordance with some embodiments.

FIG. 37 illustrates a cross-sectional view a stacked semiconductor device 2000 in accordance with some embodiments. In some embodiments, the stacked semiconductor device 2000 is similar to the stacked semiconductor device 1200 (see FIG. 29), with similar features being labeled by similar numerical references, and descriptions of the similar features are not repeated herein. In some embodiments, the semiconductor device 2000 may be formed using process steps similar to the process steps described above with reference to FIG. 29, and the description is not repeated herein. The stacked semiconductor device 2000 differs from the stacked semiconductor device 1200 by relative locations of the conductive vias 1011 with respect to the conductive vias 415A and the capacitors 427. In the stacked semiconductor device 2000, each of the conductive vias 415A is laterally interposed between a respective conductive via 1011 and a respective capacitor 427.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 2000. Due to the charge accumulation, high voltages greater than the normal-operation voltages are applied across the stacked semiconductor device 2000, which may cause an electrical discharge through the stacked semiconductor device 2000 and may damage devices (such as, for example, capacitors 427 or devices 103) of the stacked semiconductor device 2000. Dashed lines 2001 illustrate discharge current paths through the stacked semiconductor device 2000 during the plasma etch process. By coupling the capacitors 427 to the substrate 401 through the metallization layers M1 to Mt of the interconnect structure 409, the conductive vias 415A, and the respective diode structures 405, the discharge current is diverted from the capacitors 427 to the substrate 401. Accordingly, damage and shorting of the capacitors 427 is reduced or avoided.

Figure 38:
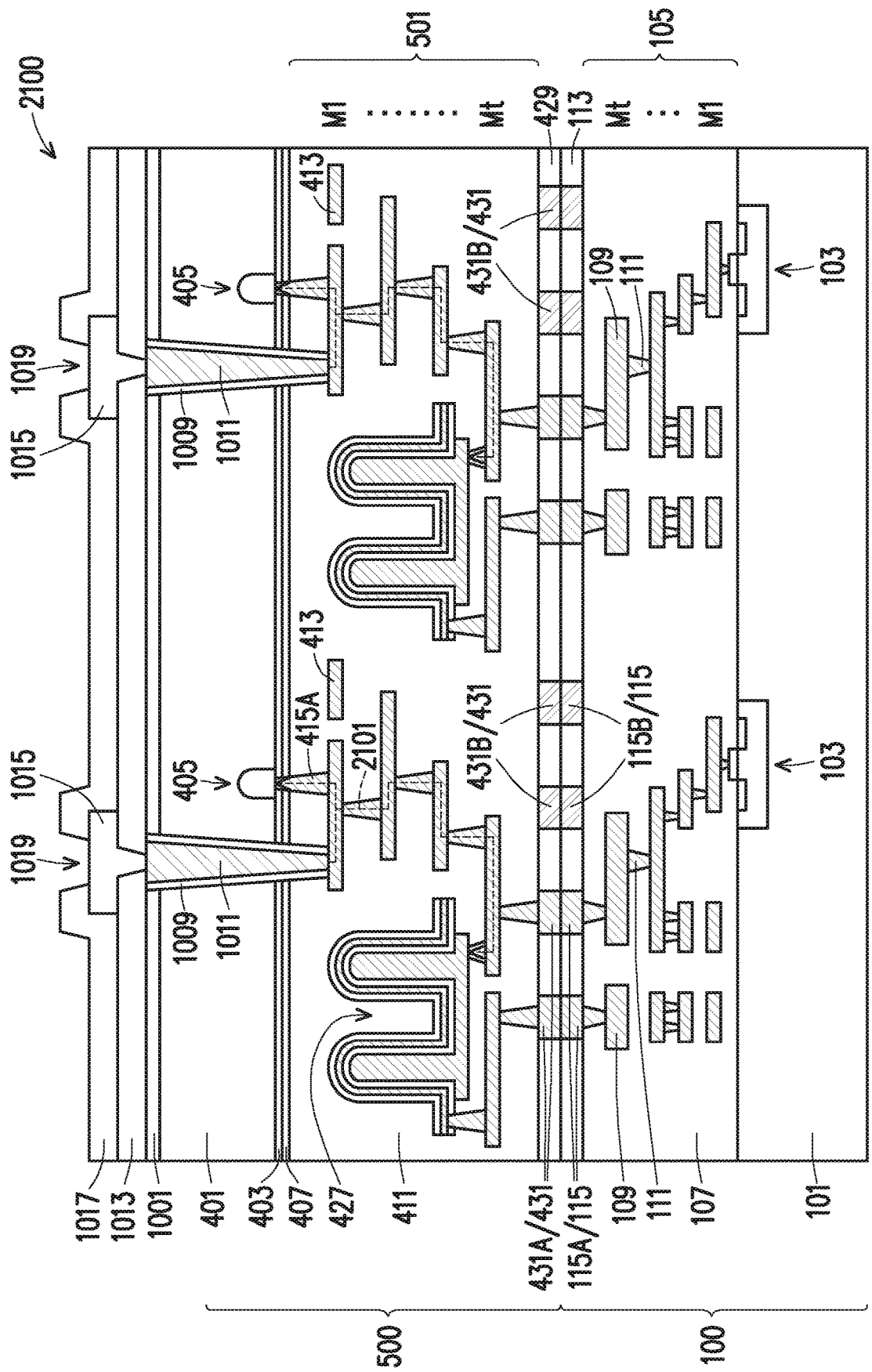
FIG. 38 illustrates a cross-sectional view of a stacked semiconductor device in accordance with some embodiments.

FIG. 38 illustrates a cross-sectional view a stacked semiconductor device 2100 in accordance with some embodiments. In some embodiments, the stacked semiconductor device 2100 is similar to the stacked semiconductor device 1300 (see FIG. 30), with similar features being labeled by similar numerical references, and descriptions of the similar features are not repeated herein. In some embodiments, the semiconductor device 2100 may be formed using process steps similar to the process steps described above with reference to FIG. 30, and the description is not repeated herein. The stacked semiconductor device 2100 differs from the stacked semiconductor device 1300 by relative locations of the conductive vias 1011 with respect to the conductive vias 415A and the capacitors 427. In the stacked semiconductor device 2100, each of the conductive vias 1011 is laterally interposed between a respective conductive via 415A and a respective capacitor 427.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 2100. Due to the charge accumulation, high voltages greater than the normal-operation voltages are applied across the stacked semiconductor device 2100, which may cause an electrical discharge through the stacked semiconductor device 2100 and may damage devices (such as, for example, capacitors 427 or devices 103) of the stacked semiconductor device 2100. Dashed lines 2101 illustrate discharge current paths through the stacked semiconductor device 2100 during the plasma etch process. By coupling the capacitors 427 to the substrate 401 through the metallization layers M1 to Mt of the interconnect structure 501, the conductive vias 415A, and the respective diode structures 405, the discharge current is diverted from the capacitors 427 to the substrate 401. Accordingly, damage and shorting of the capacitors 427 is reduced or avoided.

Figure 39:
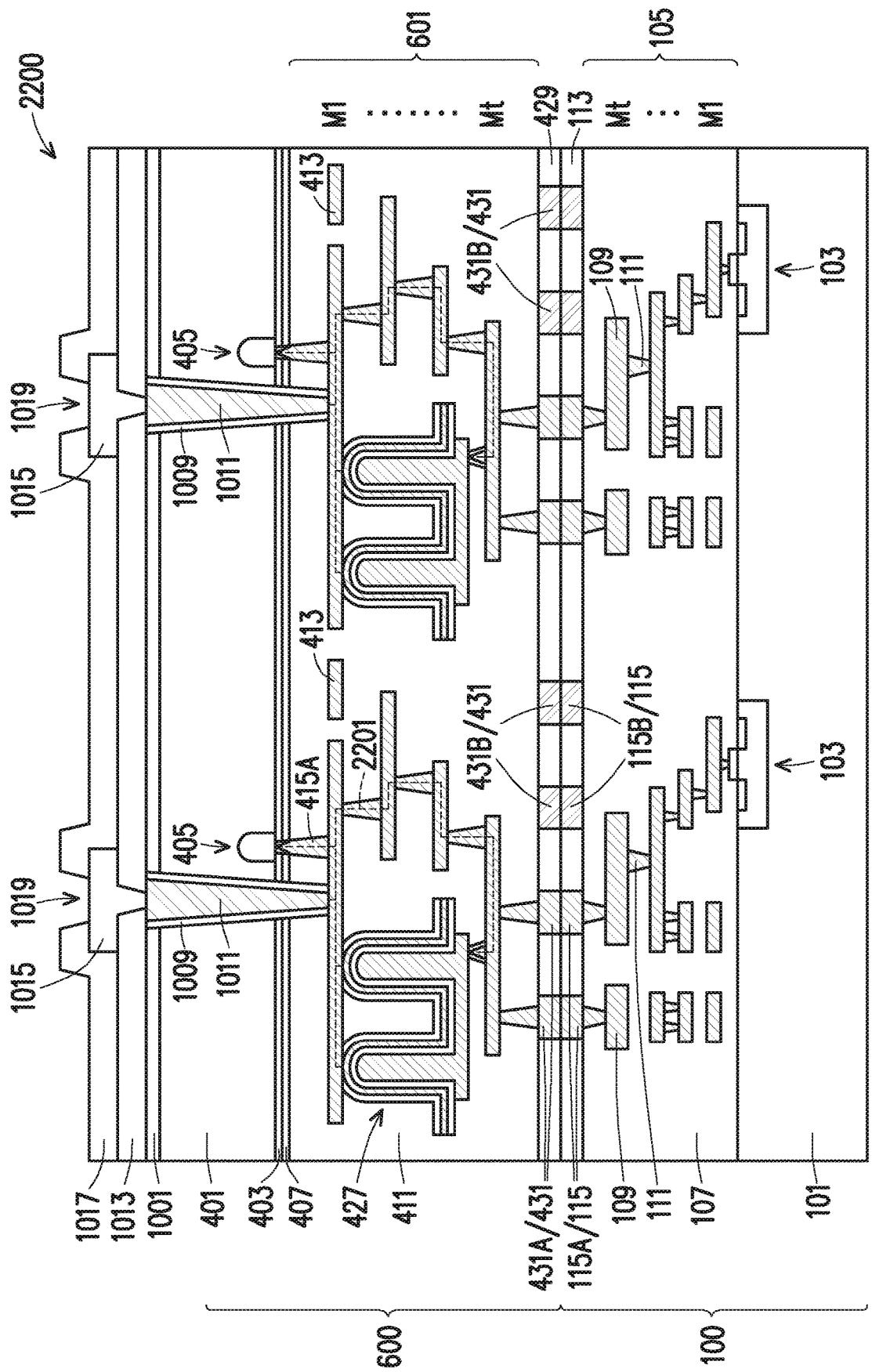
FIG. 39 illustrates a cross-sectional view of a stacked semiconductor device in accordance with some embodiments.

FIG. 39 illustrates a cross-sectional view a stacked semiconductor device 2200 in accordance with some embodiments. In some embodiments, the stacked semiconductor device 2200 is similar to the stacked semiconductor device 1400 (see FIG. 31), with similar features being labeled by similar numerical references, and descriptions of the similar features are not repeated herein. In some embodiments, the semiconductor device 2200 may be formed using process steps similar to the process steps described above with reference to FIG. 31, and the description is not repeated herein. The stacked semiconductor device 2200 differs from the stacked semiconductor device 1400 by relative locations of the conductive vias 1011 with respect to the conductive vias 415A and the capacitors 427. In the stacked semiconductor device 2200, each of the conductive vias 1011 is laterally interposed between a respective conductive via 415A and a respective capacitor 427.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 2200. Due to the charge accumulation, high voltages greater than the normal-operation voltages are applied across the stacked semiconductor device 2200, which may cause an electrical discharge through the stacked semiconductor device 2200 and may damage devices (such as, for example, capacitors 427 or devices 103) of the stacked semiconductor device 2200. Dashed lines 2201 illustrate discharge current paths through the stacked semiconductor device 2200 during the plasma etch process. By coupling the capacitors 427 to the substrate 401 through the metallization layers M1 to Mt of the interconnect structure 601, the conductive vias 415A, and the respective diode structures 405, the discharge current is diverted from the capacitors 427 to the substrate 401. Accordingly, damage and shorting of the capacitors 427 is reduced or avoided.

Figure 40:
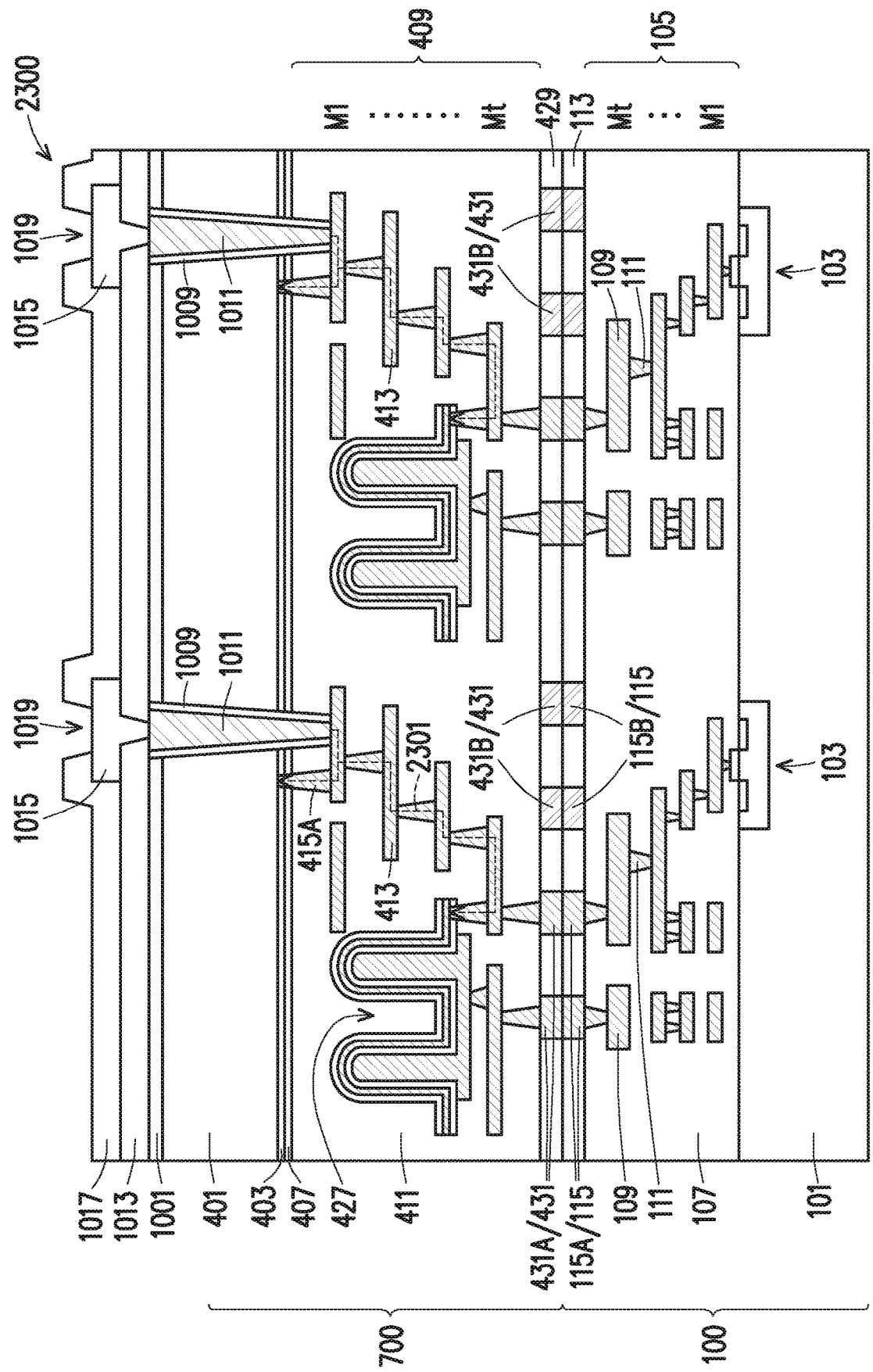
FIG. 40 illustrates a cross-sectional view of a stacked semiconductor device in accordance with some embodiments.

FIG. 40 illustrates a cross-sectional view a stacked semiconductor device 2300 in accordance with some embodiments. In some embodiments, the stacked semiconductor device 2300 is similar to the stacked semiconductor device 1500 (see FIG. 32), with similar features being labeled by similar numerical references, and descriptions of the similar features are not repeated herein. In some embodiments, the semiconductor device 2300 may be formed using process steps similar to the process steps described above with reference to FIG. 32, and the description is not repeated herein. The stacked semiconductor device 2300 differs from the stacked semiconductor device 1500 by relative locations of the conductive vias 1011 with respect to the conductive vias 415A and the capacitors 427. In the stacked semiconductor device 2300, each of the conductive vias 415A is laterally interposed between a respective conductive via 1011 and a respective capacitor 427.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 2300. Due to the charge accumulation, high voltages greater than the normal-operation voltages are applied across the stacked semiconductor device 2300, which may cause an electrical discharge through the stacked semiconductor device 2300 and may damage devices (such as, for example, capacitors 427 or devices 103) of the stacked semiconductor device 2300. Dashed lines 2301 illustrate discharge current paths through the stacked semiconductor device 2300 during the plasma etch process. By coupling the capacitors 427 to the substrate 401 through the metallization layers M1 to Mt of the interconnect structure 409 and the conductive vias 415A, the discharge current is diverted from the capacitors 427 to the substrate 401. Accordingly, damage and shorting of the capacitors 427 is reduced or avoided.

Figure 41:
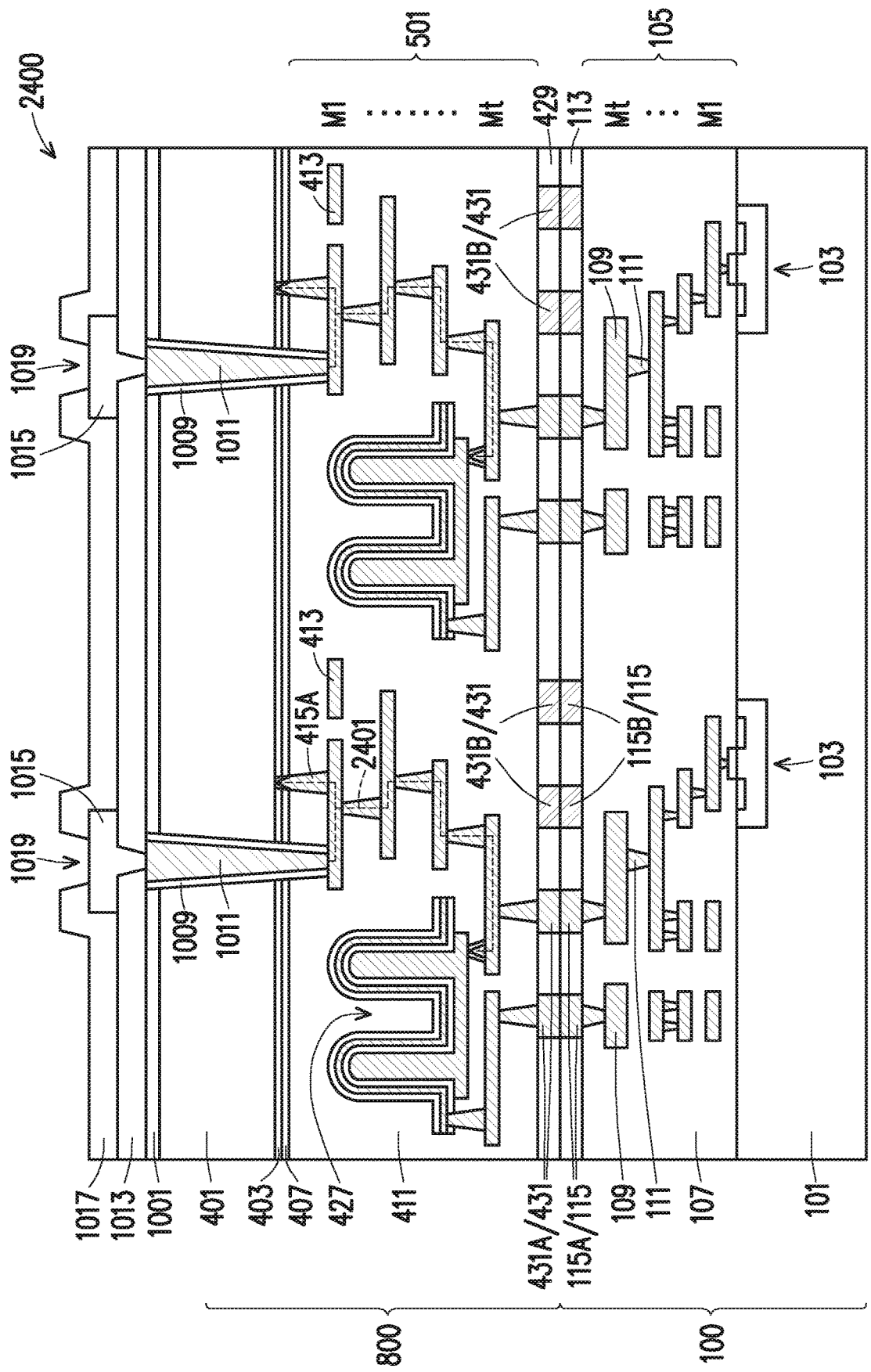
FIG. 41 illustrates a cross-sectional view of a stacked semiconductor device in accordance with some embodiments.

FIG. 41 illustrates a cross-sectional view a stacked semiconductor device 2400 in accordance with some embodiments. In some embodiments, the stacked semiconductor device 2400 is similar to the stacked semiconductor device 1600 (see FIG. 33), with similar features being labeled by similar numerical references, and descriptions of the similar features are not repeated herein. In some embodiments, the semiconductor device 2400 may be formed using process steps similar to the process steps described above with reference to FIG. 33, and the description is not repeated herein. The stacked semiconductor device 2400 differs from the stacked semiconductor device 1600 by relative locations of the conductive vias 1011 with respect to the conductive vias 415A and the capacitors 427. In the stacked semiconductor device 2400, each of the conductive vias 1011 is laterally interposed between a respective conductive via 415A and a respective capacitor 427.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 2400. Due to the charge accumulation, high voltages greater than the normal-operation voltages are applied across the stacked semiconductor device 2400, which may cause an electrical discharge through the stacked semiconductor device 2400 and may damage devices (such as, for example, capacitors 427 or devices 103) of the stacked semiconductor device 2400. Dashed lines 2401 illustrate discharge current paths through the stacked semiconductor device 2400 during the plasma etch process. By coupling the capacitors 427 to the substrate 401 through the metallization layers M1 to Mt of the interconnect structure 501 and the conductive vias 415A, the discharge current is diverted from the capacitors 427 to the substrate 401. Accordingly, damage and shorting of the capacitors 427 is reduced or avoided.

Figure 42:
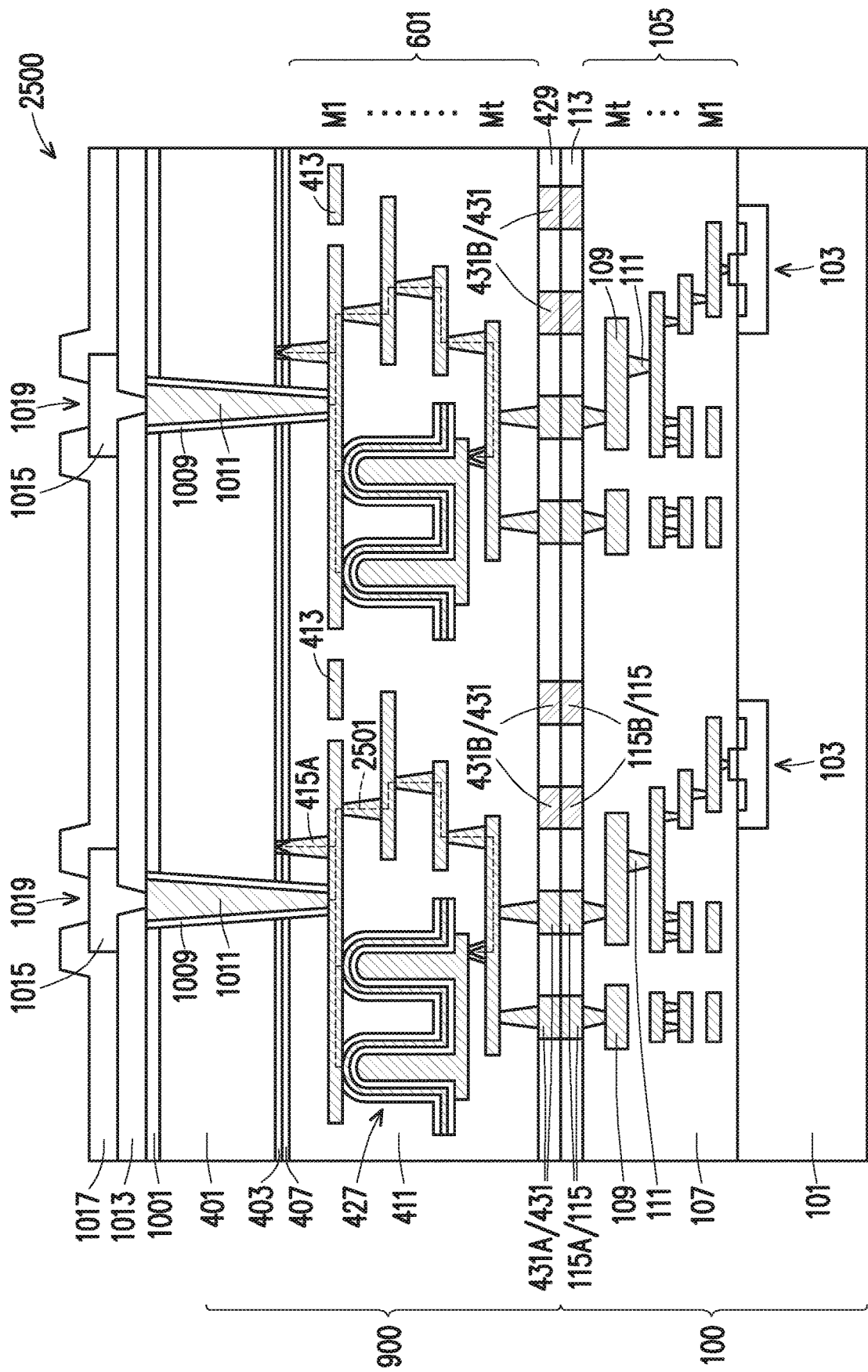
FIG. 42 illustrates a cross-sectional view of a stacked semiconductor device in accordance with some embodiments.

FIG. 42 illustrates a cross-sectional view a stacked semiconductor device 2500 in accordance with some embodiments. In some embodiments, the stacked semiconductor device 2500 is similar to the stacked semiconductor device 1700 (see FIG. 34), with similar features being labeled by similar numerical references, and descriptions of the similar features are not repeated herein. In some embodiments, the semiconductor device 2500 may be formed using process steps similar to the process steps described above with reference to FIG. 34, and the description is not repeated herein. The stacked semiconductor device 2500 differs from the stacked semiconductor device 1700 by relative locations of the conductive vias 1011 with respect to the conductive vias 415A and the capacitors 427. In the stacked semiconductor device 2500, each of the conductive vias 1011 is laterally interposed between a respective conductive via 415A and a respective capacitor 427.

In some embodiments, a plasma etch process (such as the plasma etch process 1005 described above with reference to FIG. 25) is performed to form openings for the conductive vias 1011. In some embodiments, the plasma etch process causes charge accumulation on an upper side of the stacked semiconductor device 2500. Due to the charge accumulation, high voltages greater than the normal-operation voltages are applied across the stacked semiconductor device 2500, which may cause an electrical discharge through the stacked semiconductor device 2500 and may damage devices (such as, for example, capacitors 427 or devices 103) of the stacked semiconductor device 2500. Dashed lines 2501 illustrate discharge current paths through the stacked semiconductor device 2500 during the plasma etch process. By coupling the capacitors 427 to the substrate 401 through the metallization layers M1 to Mt of the interconnect structure 601 and the conductive vias 415A, the discharge current is diverted from the capacitors 427 to the substrate 401. Accordingly, damage and shorting of the capacitors 427 is reduced or avoided.

Embodiments may achieve advantages. Various embodiments allow for forming additional discharge paths in a stacked semiconductor device to reduce or avoid burn-out and circuit short of various components (such as, for example, passive and active devices) of the stacked semiconductor device due to electrostatic discharge during plasma processes performed while forming the stacked semiconductor device. The plasma processes may include a plasma etch process performed during forming through substrate vias, a plasma process performed during a bonding process for forming the stacked semiconductor device, or the like. Additional discharge paths may comprise conductive vias, diode structures, or combinations thereof. Advantages achieved by various embodiments include preventing damage to various components of a stacked semiconductor device, improving performance of components of the stacked semiconductor device, improving performance of the stacked semiconductor device, improving yield rate of the stacked semiconductor device, and allowing easy extension to next generation stacked semiconductor devices.

In accordance with an embodiment, a semiconductor device includes a first substrate, a capacitor within the first substrate, a diode structure within the first substrate adjacent the capacitor, and a first interconnect structure over the capacitor and the diode structure. A first conductive via of the first interconnect structure electrically couples the capacitor to the diode structure.

Embodiments may include one or more of the following features. The semiconductor device where the first substrate is a p-type substrate, and where the diode structure includes a first n-type well within the first substrate. The semiconductor device wherein the diode structure further includes a p-type well within the first n-type well. The semiconductor device wherein the diode structure further includes a second n-type well within the p-type well. The semiconductor device further including a second conductive via extending through the first substrate and into the first interconnect structure. The semiconductor device further including first pads over the first interconnect structure. The semiconductor device further including a second pads over and in physical contact with the first pads, a second interconnect structure over the second pads, and a second substrate over the second interconnect structure.

In accordance with another embodiment, a semiconductor device includes a first substrate, a diode structure within the first substrate, a first interconnect structure over the diode structure and the first substrate, and a capacitor within the first interconnect structure. A first conductive via of the first interconnect structure electrically couples the capacitor to the diode structure.

Embodiments may include one or more of the following features. The semiconductor device where the first substrate is an n-type substrate, and where the diode structure includes a first p-type well within the first substrate. The semiconductor device where the diode structure further includes an n-type well within the first p-type well. The semiconductor device where the diode structure further includes a second p-type well within the n-type well. The semiconductor device where a lower electrode and an upper electrode of the capacitor are electrically coupled to a same metallization layer of the first interconnect structure. The semiconductor device where a lower electrode of the capacitor is electrically coupled to a first metallization layer of the first interconnect structure and an upper electrode of the capacitor is electrically coupled to a second metallization layer of the first interconnect structure, the second metallization layer being different from the first metallization layer. The semiconductor device where the first conductive via is in physical contact with an upper surface of the diode structure.

In accordance with yet another embodiment, a method includes forming a capacitor in a first substrate, forming a diode structure in the first substrate adjacent the capacitor, and forming a first interconnect structure over the capacitor and the diode structure. A first conductive via of the first interconnect structure electrically couples the capacitor to the diode structure.

Embodiments may include one or more of the following features. The method where the first substrate is a p-type substrate, and where forming the diode structure includes implanting n-type impurities into the first substrate to form a first n-type well in the first substrate. The method where forming the diode structure further includes implanting p-type impurities into the first n-type well to form a p-type well in the first n-type well. The method where forming the diode structure further includes implanting n-type impurities into the p-type well to form a second n-type well in the p-type well. The method further including forming a second interconnect structure over a second substrate. The method further including bonding the first interconnect structure to the second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first substrate;
a capacitor within the first substrate;
a diode structure within the first substrate adjacent the capacitor; and
a first interconnect structure over the capacitor and the diode structure, wherein a first conductive via of the first interconnect structure electrically couples the capacitor to the diode structure.

2. The semiconductor device of claim 1, wherein the first substrate is a p-type substrate, and wherein the diode structure comprises a first n-type well within the first substrate.

3. The semiconductor device of claim 2, wherein the diode structure further comprises a p-type well within the first n-type well.

4. The semiconductor device of claim 3, wherein the diode structure further comprises a second n-type well within the p-type well.

5. The semiconductor device of claim 1, further comprising a second conductive via extending through the first substrate and into the first interconnect structure.

6. The semiconductor device of claim 1, further comprising first pads over the first interconnect structure.

7. The semiconductor device of claim 6, further comprising:
a second pads over and in physical contact with the first pads;
a second interconnect structure over the second pads; and
a second substrate over the second interconnect structure.

8. A semiconductor device comprising:
a first substrate;
a diode structure within the first substrate;
a first interconnect structure over the diode structure and the first substrate; and
a capacitor within the first interconnect structure, wherein a first conductive via of the first interconnect structure electrically couples the capacitor to the diode structure.

9. The semiconductor device of claim 8, wherein the first substrate is an n-type substrate, and wherein the diode structure comprises a first p-type well within the first substrate.

10. The semiconductor device of claim 9, wherein the diode structure further comprises an n-type well within the first p-type well.

11. The semiconductor device of claim 10, wherein the diode structure further comprises a second p-type well within the n-type well.

12. The semiconductor device of claim 8, wherein a lower electrode and an upper electrode of the capacitor are electrically coupled to a same metallization layer of the first interconnect structure.

13. The semiconductor device of claim 8, wherein a lower electrode of the capacitor is electrically coupled to a first metallization layer of the first interconnect structure and an upper electrode of the capacitor is electrically coupled to a second metallization layer of the first interconnect structure, the second metallization layer being different from the first metallization layer.

14. The semiconductor device of claim 8, wherein the first conductive via is in physical contact with an upper surface of the diode structure.

15. A semiconductor device comprising:
   a trench capacitor in a first substrate, the trench capacitor comprising a lower electrode and an upper electrode;
   a diode structure in the first substrate; and
   a first interconnect structure over the diode structure and the trench capacitor, wherein the first interconnect structure comprises:
      a first dielectric layer over the diode structure and the trench capacitor; and
      a first interconnect line over the first dielectric layer, wherein the first interconnect line is coupled to the diode structure and a first one of the lower electrode and the upper electrode.

16. The semiconductor device of claim 15, wherein the first substrate is an n-type substrate, and wherein the diode structure comprises a first p-type well within the first substrate and an n-type well within the first p-type well.

17. The semiconductor device of claim 16, wherein the diode structure further comprises a second p-type well within the n-type well.

18. The semiconductor device of claim 15, wherein the first interconnect structure further comprises:
   a second interconnect line over the first dielectric layer, wherein the second interconnect line is coupled to a second one of the lower electrode and the upper electrode.

19. The semiconductor device of claim 15, wherein the first interconnect structure further comprises:
   a second interconnect line, wherein the second interconnect line is coupled to a second one of the lower electrode and the upper electrode, wherein the second interconnect line is in a different metallization layer than the first interconnect line.

20. The semiconductor device of claim 15, wherein the first interconnect line is coupled to the diode structure by a first conductive via, wherein the first conductive via is in physical contact with an upper surface of the diode structure.

\* \* \* \* \*